(12) United States Patent
Yamazaki et al.

(10) Patent No.: US 11,024,725 B2
(45) Date of Patent: Jun. 1, 2021

(54) SEMICONDUCTOR DEVICE INCLUDING METAL OXIDE FILM

(71) Applicant: Semiconductor Energy Laboratory Co., Ltd., Kanagawa-ken (JP)

(72) Inventors: Shunpei Yamazaki, Tokyo (JP); Kenichi Okazaki, Tochigi (JP); Junichi Koezuka, Tochigi (JP); Tomonori Nakayama, Kanagawa (JP); Motoki Nakashima, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 49 days.

(21) Appl. No.: 15/215,801

(22) Filed: Jul. 21, 2016

(65) Prior Publication Data

US 2017/0025544 A1 Jan. 26, 2017

(30) Foreign Application Priority Data

Jul. 24, 2015 (JP) .............................. JP2015-146351

(51) Int. Cl.
*H01L 29/786* (2006.01)
*H01L 29/66* (2006.01)
(Continued)

(52) U.S. Cl.
CPC .... *H01L 29/66969* (2013.01); *H01L 27/1225* (2013.01); *H01L 29/045* (2013.01);
(Continued)

(58) Field of Classification Search
CPC ............. H01L 29/7869; H01L 29/4908; H01L 21/02565; H01L 29/78606;
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1 737 044 A1 12/2006
EP 2 226 847 A2 9/2010
(Continued)

OTHER PUBLICATIONS

Asakuma, N. et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.
(Continued)

*Primary Examiner* — Mohsen Ahmadi
(74) *Attorney, Agent, or Firm* — Husch Blackwell LLP

(57) ABSTRACT

In a transistor including an oxide semiconductor, a change in electrical characteristics is suppressed and reliability is improved. The transistor includes an oxide semiconductor film over a first insulating film; a second insulating film over the oxide semiconductor film; a metal oxide film over the second insulating film; a gate electrode over the metal oxide film; and a third insulating film over the oxide semiconductor film and the gate electrode. The oxide semiconductor film includes a channel region overlapping with the gate electrode, a source region in contact with the third insulating film, and a drain region in contact with the third insulating film. The source region and the drain region contain one or more of hydrogen, boron, carbon, nitrogen, fluorine, phosphorus, sulfur, chlorine, titanium, and a rare gas.

14 Claims, 60 Drawing Sheets

(51) Int. Cl.
  *H01L 29/04*   (2006.01)
  *H01L 29/24*   (2006.01)
  *H01L 29/78*   (2006.01)
  *H01L 27/12*   (2006.01)
  *H01L 29/49*   (2006.01)
  *H01L 29/417*  (2006.01)

(52) U.S. Cl.
  CPC ........ *H01L 29/24* (2013.01); *H01L 29/41733* (2013.01); *H01L 29/4908* (2013.01); *H01L 29/7869* (2013.01); *H01L 29/78618* (2013.01); *H01L 29/78648* (2013.01); *H01L 29/78696* (2013.01); *H01L 29/786* (2013.01); *H01L 29/7849* (2013.01)

(58) Field of Classification Search
  CPC ......... H01L 29/78618; H01L 29/78696; H01L 29/786; H01L 29/7849; H01L 29/66969
  See application file for complete search history.

(56) References Cited

U.S. PATENT DOCUMENTS

| | | | |
|---|---|---|---|
| 6,294,274 B1 | 9/2001 | Kawazoe et al. | |
| 6,461,899 B1* | 10/2002 | Kitakado | H01L 27/12 257/347 |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 8,384,076 B2 | 2/2013 | Park et al. | |
| 8,748,882 B2 | 6/2014 | Terai et al. | |
| 8,883,556 B2 | 11/2014 | Yamazaki | |
| 8,901,557 B2* | 12/2014 | Yamazaki | H01L 29/78693 257/43 |
| 9,006,734 B2 | 4/2015 | Terai et al. | |
| 9,130,049 B2 | 9/2015 | Sano et al. | |
| 9,263,589 B2 | 2/2016 | Endo et al. | |
| 9,276,121 B2 | 3/2016 | Yamazaki | |
| 9,281,409 B2* | 3/2016 | Yamazaki | H01L 29/0684 |
| 9,287,407 B2 | 3/2016 | Koezuka et al. | |
| 9,349,751 B2 | 5/2016 | Yamazaki et al. | |
| 9,443,984 B2 | 9/2016 | Yamazaki | |
| 9,461,126 B2 | 10/2016 | Yamazaki et al. | |
| 9,640,639 B2 | 5/2017 | Yamazaki | |
| 9,673,234 B2 | 6/2017 | Yamazaki et al. | |
| 9,748,403 B2 | 8/2017 | Koezuka et al. | |
| 9,780,225 B2 | 10/2017 | Yamazaki | |
| 9,837,545 B2 | 12/2017 | Koezuka et al. | |
| 9,837,547 B2 | 12/2017 | Koezuka et al. | |
| 9,847,429 B2 | 12/2017 | Yamazaki et al. | |
| 9,887,299 B2 | 2/2018 | Yamazaki et al. | |
| 10,032,929 B2 | 7/2018 | Koezuka et al. | |
| 10,115,631 B2 | 10/2018 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0117692 A1* | 5/2009 | Koyama | H01L 21/2007 438/164 |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0179199 A1 | 7/2009 | Sano et al. | |
| 2009/0278120 A1 | 11/2009 | Lee et al. | |
| 2009/0278122 A1 | 11/2009 | Hosono et al. | |
| 2009/0280600 A1 | 11/2009 | Hosono et al. | |
| 2010/0025675 A1* | 2/2010 | Yamazaki | H01L 29/66742 257/43 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0127523 A1 | 6/2011 | Yamazaki | |
| 2011/0240990 A1* | 10/2011 | Yamazaki | H01L 29/7869 257/43 |
| 2012/0032173 A1 | 2/2012 | Sato et al. | |

(56) References Cited

U.S. PATENT DOCUMENTS

| | | | |
|---|---|---|---|
| 2012/0132902 A1 | 5/2012 | Imoto et al. | |
| 2012/0161126 A1* | 6/2012 | Yamazaki | H01L 27/10873 257/43 |
| 2012/0315730 A1 | 12/2012 | Koezuka et al. | |
| 2012/0315735 A1 | 12/2012 | Koezuka et al. | |
| 2013/0153889 A1 | 6/2013 | Yamazaki et al. | |
| 2013/0187152 A1* | 7/2013 | Yamazaki | H01L 29/78693 257/43 |
| 2013/0203214 A1* | 8/2013 | Isobe | H01L 21/0237 438/104 |
| 2013/0256652 A1* | 10/2013 | Lee | H01L 29/786 257/43 |
| 2014/0339539 A1 | 11/2014 | Yamazaki et al. | |
| 2014/0339545 A1* | 11/2014 | Yamazaki | H01L 29/24 257/43 |
| 2014/0361289 A1 | 12/2014 | Suzawa | |
| 2015/0021596 A1 | 1/2015 | Yamazaki et al. | |
| 2015/0053971 A1* | 2/2015 | Miyanaga | H01L 29/78606 257/43 |
| 2015/0102341 A1* | 4/2015 | Yamazaki | H01L 21/02403 257/43 |
| 2015/0107988 A1* | 4/2015 | Yamazaki | C30B 29/22 204/192.25 |
| 2015/0123120 A1* | 5/2015 | Yamazaki | H01L 29/4908 257/43 |
| 2015/0155363 A1 | 6/2015 | Nakazawa et al. | |
| 2015/0187953 A1* | 7/2015 | Koezuka | H01L 29/78627 257/43 |
| 2015/0221678 A1* | 8/2015 | Yamazaki | H01L 29/78645 257/43 |
| 2015/0228799 A1* | 8/2015 | Koezuka | H01L 27/124 257/43 |
| 2015/0228803 A1* | 8/2015 | Koezuka | H01L 29/78693 257/43 |
| 2015/0263053 A1* | 9/2015 | Yamazaki | H01L 27/14616 257/43 |
| 2015/0263174 A1 | 9/2015 | Yamazaki et al. | |
| 2015/0270407 A1 | 9/2015 | Suzuki et al. | |
| 2016/0005873 A1 | 1/2016 | Jintyou et al. | |
| 2016/0155823 A1* | 6/2016 | Yamazaki | H01L 29/7869 438/104 |
| 2016/0283028 A1* | 9/2016 | Yamazaki | G02F 1/133345 |
| 2016/0343866 A1 | 11/2016 | Koezuka et al. | |
| 2016/0380107 A1 | 12/2016 | Yamazaki | |
| 2017/0018577 A1* | 1/2017 | Matsuda | H01L 29/7869 |
| 2017/0033109 A1 | 2/2017 | Yamazaki | |
| 2017/0033233 A1 | 2/2017 | Yamazaki et al. | |
| 2018/0076333 A1 | 3/2018 | Koezuka et al. | |
| 2018/0095336 A1* | 4/2018 | Fukutome | H01L 29/786 |
| 2018/0122839 A1* | 5/2018 | Nodera | H01L 29/786 |
| 2018/0145180 A1 | 5/2018 | Koezuka et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2009-278115 A | 11/2009 |
| JP | 2011-159908 A | 8/2011 |
| JP | 2012-009836 A | 1/2012 |
| JP | 2012-151461 A | 8/2012 |
| JP | 2013-016782 A | 1/2013 |
| JP | 2013-236068 A | 11/2013 |
| JP | 2015-038974 A | 2/2015 |
| JP | 2015-046642 A | 3/2015 |
| JP | 2015-079949 A | 4/2015 |
| JP | 2015-109427 A | 6/2015 |
| JP | 2015-111662 A | 6/2015 |
| JP | 2015-128152 A | 7/2015 |
| JP | 2015-133482 A | 7/2015 |
| WO | WO 2004/114391 A1 | 12/2004 |
| WO | WO 2012/090973 A1 | 7/2012 |
| WO | WO 2015/079360 A1 | 6/2015 |

OTHER PUBLICATIONS

Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.

Chern, H.N. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D-H.. et al., "21.2: Al and Sn-Doped Zinc Indium Oxide Thin Film Transistors for AMOLED Back-Plane," SID Digest '09: SID International Symposium Digest for Technical Papers, May 31, 2009, pp. 280-283.

Clark, S.J. et al., "First Principles Methods Using CASTEP," Zeitschrift fur Kristallographie, 2005, vol. 220, pp. 567-570.

Coates, D. et al., "Optical Studies of the Amorphous Liquid-Cholesteric Liquid Crystal Transition:The "Blue Phase"," Physics Letters, Sep. 10, 1973, vol. 45A, No. 2, pp. 115-116.

Costello, M.J. et al., "Electron Microscopy of a Cholesteric Liquid Crystal and Its Blue Phase," Physical Review A, May 1, 1984, vol. 29, No. 5, pp. 2957-2959.

Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E.M.C. et al., "Wide-Bandgap High-Mobility ZnO Thin-Film Transistors Produced at Room Temperature," Applied Physics Letters, Sep. 27, 2004, vol. 85, No. 13, pp. 2541-2543.

Fung, T.C. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H. et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.

Godo, H. et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R. et al., "42.1: Invited Paper: Improved Amorphous In—Ga—Zn—O TFTs," SID Digest '08: SID International Symposium Digest of Technical Papers, May 20, 2008, vol. 39, pp. 621-624.

Hirao, T. et al., "Novel Top-Gate Zinc Oxide Thin-Film Transistors (ZnO TFTs) for AMLCDs," Journal of the Society for Information Display, 2007, vol. 15, No. 1, pp. 17-22.

Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.

Hosono, H., "68.3: Invited Paper:Transparent Amorphous Oxide Semiconductors for High Performance TFT," SID Digest '07: SID International Symposium Digest of Technical Papers, 2007, vol. 38, pp. 1830-1833.

(56) References Cited

OTHER PUBLICATIONS

Hsieh, H-H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.
Ikeda, T. et al., "Full-Functional System Liquid Crystal Display Using CG-Silicon Technology," SID Digest '04: SID International Symposium Digest of Technical Papers, 2004, vol. 35, pp. 860-863.
Janotti, A. et al., "Native Point Defects in ZnO," Physical Review B, Oct. 4, 2007, vol. 76, No. 16, pp. 165202-1-165202-22.
Janotti, A. et al., "Oxygen Vacancies in ZnO," Applied Physics Letters, 2005, vol. 87, pp. 122102-1-122102-3.
Jeong, J.K. et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.
Jin, D-U. et al., "65.2: Distinguished Paper:World-Largest (6.5") Flexible Full Color Top Emission AMOLED Display on Plastic Film and Its Bending Properties," SID Digest '09: SID International Symposium Digest of Technical Papers, May 31, 2009, pp. 983-985.
Kanno, H. et al., "White Stacked Electrophosphorecent Organic Light-Emitting Devices Employing MOO3 as a Charge-Generation Layer," Advanced Materials, 2006, vol. 18, No. 3, pp. 339-342.
Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.
Kikuchi, H. et al., "62.2: Invited Paper:Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.
Kikuchi, H. et al., "Polymer-Stabilized Liquid Crystal Blue Phases," Nature Materials, Sep. 2, 2002, vol. 1, pp. 64-68.
Kim, S. et al., "High-Performance Oxide Thin Film Transistors Passivated by Various Gas Plasmas," 214th ECS Meeting, 2008, No. 2317, ECS.
Kimizuka, N. et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C.," Journal of Solid State Chemistry, 1985, vol. 60, pp. 382-384.
Kimizuka, N. et al., Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System, Journal of Solid State Chemistry, Apr. 1, 1995, vol. 116, No. 1, pp. 170-178.
Kitzerow, H-S. et al., "Observation of Blue Phases in Chiral Networks," Liquid Crystals, 1993, vol. 14, No. 3, pp. 911-916.
Kurokawa, Y. et al., "UHF RFCPUs on Flexible and Glass Substrates for Secure RFID Systems," Journal of Solid-State Circuits, 2008, vol. 43, No. 1, pp. 292-299.
Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.
Lee, H-N. et al., "Current Status of, Challenges to, and Perspective View of AM-OLED," IDW '06: Proceedings of the 13th International Display Workshops, Dec. 7, 2006, pp. 663-666.
Lee, J-H. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.
Lee, M-H. et al., "15.4: Excellent Performance of Indium-Oxide-Based Thin-Film Transistors by DC Sputtering," SID Digest '09: SID International Symposium Digest of Technical Papers, May 31, 2009, pp. 191-193.
Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.
Meiboom, S. et al., "Theory of the Blue Phase of Cholesteric Liquid Crystals," Physical Review Letters, May 4, 1981, vol. 46, No. 18, pp. 1216-1219.
Miyasaka, M., "SUFTLA Flexible Microelectronics on Their Way to Business," SID Digest '07: SID International Symposium Digest of Technical Papers, 2007, vol. 38, pp. 1673-1676.
Mo, Y-G. et al., "Amorphous Oxide TFT Backplanes for Large Size AMOLED Displays,"IDW '08: Proceedings of the 6th International Display Workshops, Dec. 3, 2008, pp. 581-584.
Nakamura, M. et al., "The Phase Relations in the In2O3—Ga2ZnO4—ZnO System at 1350° C.," Journal of Solid State Chemistry, Aug. 1, 1991, vol. 93, No. 2, pp. 298-315.
Nakamura, M., "Synthesis of Homologous Compound with New Long-Period Structure," NIRIM Newsletter, Mar. 1, 1995, vol. 150, pp. 1-4.
Nomura, K. et al., "Amorphous Oxide Semiconductors for High-Performance Flexible Thin-Film Transistors," Japanese Journal of Applied Physics, 2006, vol. 45, No. 5B, pp. 4303-4308.
Nomura, K. et al., "Carrier Transport in Transparent Oxide Semiconductor with Intrinsic Structural Randomness Probed Using Single-Crystalline InGaO3(ZnO)5 Films," Applied Physics Letters, Sep. 13, 2004, vol. 85, No. 11, pp. 1993-1995.
Nomura, K. et al., "Room-Temperature Fabrication of Transparent Flexible Thin-Film Transistors Using Amorphous Oxide Semiconductors," Nature, Nov. 25, 2004, vol. 432, pp. 488-492.
Nomura, K. et al., "Thin-Film Transistor Fabricated in Single-Crystalline Transparent Oxide Semiconductor," Science, May 23, 2003, vol. 300, No. 5623, pp. 1269-1272.
Nowatari, H. et al., "60.2: Intermediate Connector With Suppressed Voltage Loss for White Tandem OLEDs," SID Digest '09: SID International Symposium Digest for Technical Papers, May 31, 2009, vol. 40, pp. 899-902.
Oba, F, et al., "Defect Energetics in ZnO: A Hybrid Hartree-Fock Density Functional Study," Physical Review B, 2008, vol. 77, pp. 245202-1-245202-6.
Oh, M.S. et al., "Improving the Gate Stability of ZnO Thin-Film Transistors With Aluminum Oxide Dielectric Layers," Journal of the Electrochemical Society, 2008, vol. 155, No. 12, pp. H1009-H1014.
Ohara, H. et al., "21.3: 4.0 in. QVGA AMOLED Display Using In—Ga—Zn-Oxide TFTs With a Novel Passivation Layer," SID Digest '09: SID International Symposium Digest of Technical Papers, May 31, 2009, pp. 284-287.
Ohara, H. et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Orita, M. et al., "Amorphous Transparent Conductive Oxide InGaO3(ZnO)m (m<4):a Zn4s Conductor," Philosophical Magazine, 2001, vol. 81, No. 5, pp. 501-515.
Orita, M. et al., "Mechanism of Electrical Conductivity of Transparent InGaZnO4," Physical Review B, Jan. 15, 2000, vol. 61, No. 3, pp. 1811-1816.
Osada, T. et al., "15.2: Development of Driver-Integrated Panel using Amorphous In—Ga—Zn-Oxide TFT," SID Digest '09: SID International Symposium Digest of Technical Papers, May 31, 2009, vol. 40, pp. 184-187.
Osada, T. et al., "Development of Driver-Integrated Panel Using Amorphous In—Ga—Zn-Oxide TFT," AM-FPD '09 Digest of Technical Papers, Jul. 1, 2009, pp. 33-36.
Park, J-S. et al., "Amorphous Indium-Gallium-Zinc Oxide TFTs and Their Application for Large Size AMOLED," AM-FPD '08 Digest of Technical Papers, Jul. 2, 2008, pp. 275-278.
Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.
Park, J-S. et al., "Electronic Transport Properties of Amorphous Indium-Gallium-Zinc Oxide Semiconductor Upon Exposure to Water," Applied Physics Letters, 2008, vol. 92, pp. 072104-1-072104-3.

(56) References Cited

OTHER PUBLICATIONS

Park, J.C. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Park, J-S. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.

Park, S. et al., "Challenge to Future Displays: Transparent AM-OLED Driven by Peald Grown ZnO TFT," IMID '07 Digest, 2007, pp. 1249-1252.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Prins, M.W.J. et al., "A Ferroelectric Transparent Thin-Film Transistor," Applied Physics Letters, Jun. 17, 1996, vol. 68, No. 25, pp. 3650-3652.

Sakata, J. et al., "Development of 4.0-in. AMOLED Display With Driver Circuit Using Amorphous In—Ga—Zn-Oxide TFTs," IDW '09: Proceedings of the 16th International Display Workshops, 2009, pp. 689-692.

Son, K-S. et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K. et al., "Ultra Low Power Consumption Technologies for Mobile TFT-LCDs," IDW '02: Proceedings of the 9th International Display Workshops, Dec. 4, 2002, pp. 295-298.

Ueno, K. et al., "Field-Effect Transistor on $SrTiO_3$ With Sputtered $Al_2O_3$ Gate Insulator," Applied Physics Letters, Sep. 1, 2003, vol. 83, No. 9, pp. 1755-1757.

Van de Walle, C.G. "Hydrogen as a Cause of Doping in Zinc Oxide," Physical Review Letters, Jul. 31, 2000, vol. 85, No. 5, pp. 1012-1015.

\* cited by examiner

○ : In
● : Ga
○ : Zn
● : O

F

○ : In
● : Ga
○ : Zn
● : O

H out-of-plane method
CAAC-OS in-plane method φ scan
CAAC-OS in-plane method φ scan
Single crystal OS FIG. 40A
FIG. 40B
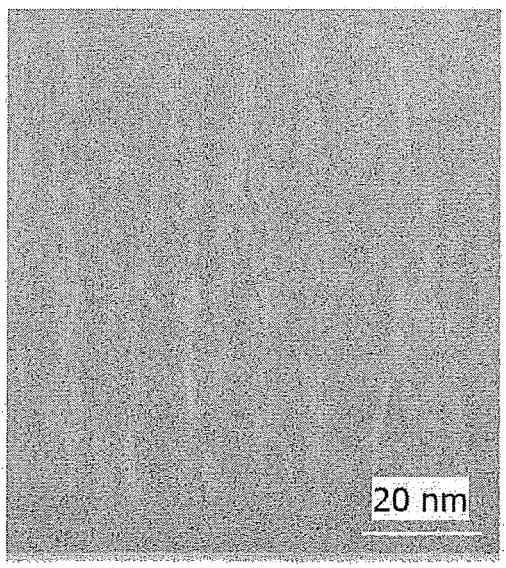
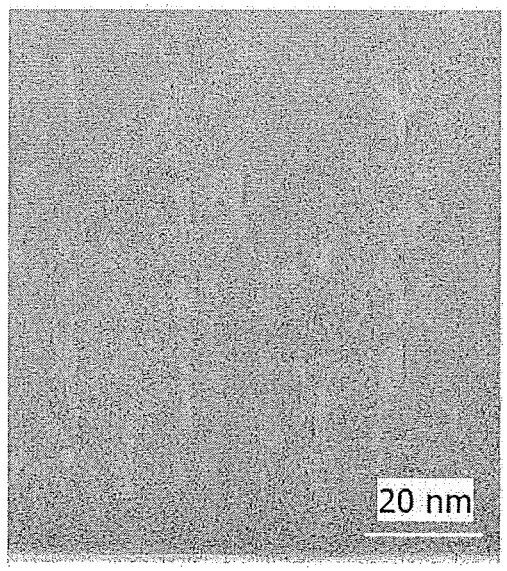

300A

300A

300A

300B

300B

300B

300C

300C

300C

300E

X1  307  308_1 308_2 308_3  X2
           _____308_____/

300E

Y1  107  308_1 308_2 308_3  Y2
           _____308_____/

300F

X1  307  308_2 308_3  X2
         \____308____/

300F

Y1  307  308_2 308_3  Y2
         \____308____/

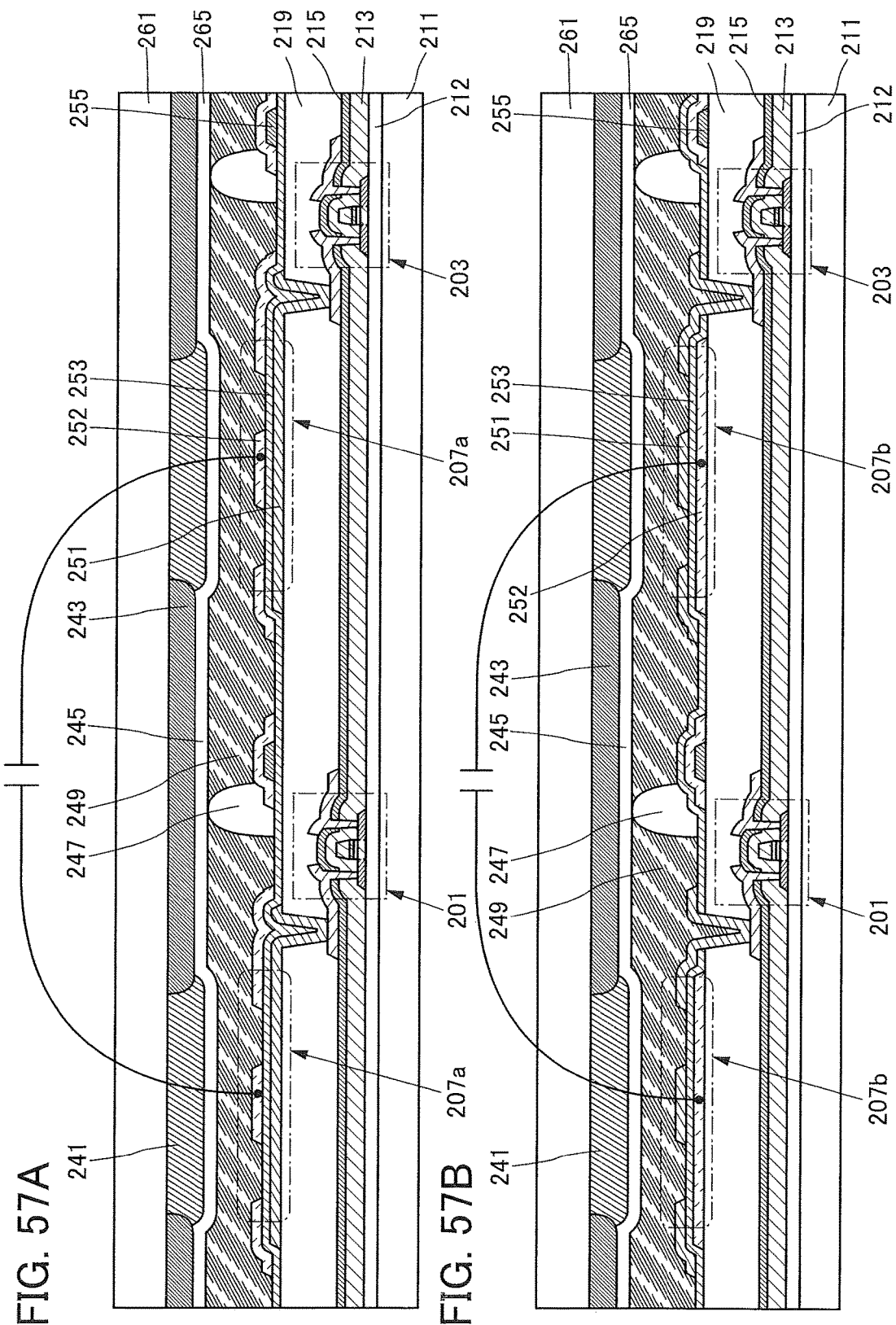

SEMICONDUCTOR DEVICE INCLUDING METAL OXIDE FILM

BACKGROUND OF THE INVENTION

1. Field of the Invention

One embodiment of the present invention relates to a semiconductor device including an oxide semiconductor film and a display device including the semiconductor device.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

Attention has been focused on a technique for forming a transistor using a semiconductor thin film formed over a substrate having an insulating surface (also referred to as a field-effect transistor (FET) or a thin film transistor (TFT)). Such transistors are used for a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention.

For example, a technique for forming a transistor using an amorphous oxide containing In, Zn, Ga, Sn, and the like as an oxide semiconductor is disclosed (see Patent Document 1). In addition, a technique for forming a self-aligned top-gate transistor using an oxide thin film is disclosed (see Patent Document 2).

Furthermore, a semiconductor device including, as a base insulating layer of an oxide semiconductor layer in which a channel is formed, an insulating layer that releases oxygen by heating to reduce oxygen vacancies in the oxide semiconductor layer is disclosed (see Patent Document 3).

REFERENCE

Patent Documents

[Patent Document 1] Japanese Published Patent Application No. 2006-165529
[Patent Document 2] Japanese Published Patent Application No. 2009-278115
[Patent Document 3] Japanese Published Patent Application No. 2012-009836

SUMMARY OF THE INVENTION

As examples of a transistor including an oxide semiconductor film, an inverted staggered transistor (also referred to as a bottom-gate transistor) and a staggered transistor (also referred to as a top-gate transistor) can be given. In the case where a transistor including an oxide semiconductor film is used for a display device, an inverted staggered transistor is used more often than a staggered transistor because its manufacturing process is relatively simple and its manufacturing cost is low. However, an increase in the screen size of a display device or an increase in the resolution of an image on a display device (e.g., a high-resolution display device typified by a 4 K×2 K display device (3840 pixels in the horizontal direction and 2160 pixels in the vertical direction) or an 8 K×4 K display device (7680 pixels in the horizontal direction and 4320 pixels in the vertical direction)) might cause parasitic capacitance between a gate electrode and source and drain electrodes in an inverted staggered transistor. Depending on the value of the parasitic capacitance, a signal delay or the like becomes more severe, leading to degradation of the display quality of the display device. Thus, regarding a staggered transistor including an oxide semiconductor film, a structure with stable semiconductor characteristics and high reliability is desired to be developed.

Furthermore, in the case where a transistor is formed using an oxide semiconductor film for a channel region, an oxygen vacancy which is formed in the channel region of the oxide semiconductor film adversely affects the transistor characteristics. For example, the oxygen vacancy in the channel region of the oxide semiconductor film causes carrier generation. The carrier generation in the channel region of the oxide semiconductor film causes a change in the electrical characteristics, typically, a shift of the threshold voltage, of the transistor including the channel region in the oxide semiconductor film. Furthermore, there is a problem in that electrical characteristics vary among transistors. Therefore, it is preferable that the number of oxygen vacancies in the channel region of the oxide semiconductor film be as small as possible. Meanwhile, in the transistor formed using the oxide semiconductor film for the channel region, the oxide semiconductor film in regions in contact with a source electrode and a drain electrode preferably includes a large number of oxygen vacancies and has low resistance to reduce the contact resistance of the oxide semiconductor film with the source electrode and the drain electrode.

In view of the foregoing problems, an object of one embodiment of the present invention is to suppress a change in electrical characteristics and to improve the reliability of a transistor including an oxide semiconductor. Another object of one embodiment of the present invention is to provide a staggered transistor including an oxide semiconductor. Another object of one embodiment of the present invention is to provide a transistor including an oxide semiconductor and having high on-state current. Another object of one embodiment of the present invention is to provide a transistor including an oxide semiconductor and having low off-state current. Another object of one embodiment of the present invention is to provide a semiconductor device with low power consumption. Another object of one embodiment of the present invention is to provide a novel semiconductor device.

Note that the description of the above objects does not disturb the existence of other objects. One embodiment of the present invention does not necessarily achieve all the objects. Other objects are apparent from and can be derived from the description of the specification and the like.

One embodiment of the present invention is a semiconductor device including a transistor, which comprises an oxide semiconductor film over a first insulating film; a second insulating film over the oxide semiconductor film; a metal oxide film over the second insulating film; a gate electrode over the metal oxide film; and a third insulating film over the oxide semiconductor film and the gate electrode. The oxide semiconductor film includes a channel region overlapping with the gate electrode, a source region in contact with the third insulating film, and a drain region in contact with the third insulating film. The source region and the drain region contain one or more of hydrogen, boron, carbon, nitrogen, fluorine, phosphorus, sulfur, chlorine, titanium, and a rare gas.

Another embodiment of the present invention is a semiconductor device including a transistor, which comprises a conductive film; a first insulating film over the conductive film; an oxide semiconductor film over the first insulating film; a second insulating film over the oxide semiconductor film; a metal oxide film over the second insulating film; a gate electrode over the metal oxide film; and a third insulating film over the oxide semiconductor film and the gate electrode. The oxide semiconductor film includes a channel region overlapping with the gate electrode, a source region in contact with the third insulating film, and a drain region in contact with the third insulating film. The source region and the drain region contain one or more of hydrogen, boron, carbon, nitrogen, fluorine, phosphorus, sulfur, chlorine, titanium, and a rare gas.

Another embodiment of the present invention is a semiconductor device including a transistor, which comprises a conductive film; a first insulating film over the conductive film; an oxide semiconductor film over the first insulating film; a second insulating film over the oxide semiconductor film; a metal oxide film over the second insulating film; a gate electrode over the metal oxide film; and a third insulating film over the oxide semiconductor film and the gate electrode. The conductive film is electrically connected to the gate electrode. The oxide semiconductor film includes a channel region overlapping with the gate electrode, a source region in contact with the third insulating film, and a drain region in contact with the third insulating film. The source region and the drain region contain one or more of hydrogen, boron, carbon, nitrogen, fluorine, phosphorus, sulfur, chlorine, titanium, and a rare gas.

In any of the above embodiments, the transistor preferably further includes a fourth insulating film over the third insulating film, a source electrode connected to the source region through an opening in the third insulating film and the fourth insulating film, and a drain electrode connected to the drain region through an opening in the third insulating film and the fourth insulating film.

In any of the above embodiments, the metal oxide film preferably contains one or more of In, Zn, Al, Ga, Y, and Sn.

In any of the above embodiments, the rare gas preferably includes one or more of helium, neon, argon, krypton, and xenon.

In any of the above embodiments, the third insulating film preferably contains one or more of nitrogen, hydrogen, and fluorine.

In any of the above embodiments, the oxide semiconductor film preferably contains In, Zn, and M (M is Al, Ga, Y, or Sn). In any of the above embodiments, the oxide semiconductor film preferably includes a crystal part and the crystal part preferably has c-axis alignment.

Another embodiment of the present invention is a display device including the semiconductor device of any one of the above embodiments and a display element. Another embodiment of the present invention is a display module including the display device and a touch sensor. Another embodiment of the present invention is an electronic device including the semiconductor device of any one of the above embodiments, the display device, or the display module; and an operation key or a battery.

According to one embodiment of the present invention, a change in electrical characteristics of a transistor including an oxide semiconductor can be suppressed and the reliability of the transistor can be improved. According to another embodiment of the present invention, a staggered transistor including an oxide semiconductor can be provided. According to another embodiment of the present invention, a transistor including an oxide semiconductor and having high on-state current can be provided. According to another embodiment of the present invention, a transistor including an oxide semiconductor and having low off-state current can be provided. According to another embodiment of the present invention, a semiconductor device with low power consumption can be provided. According to another embodiment of the present invention, a novel semiconductor device can be provided.

Note that the description of these effects does not disturb the existence of other effects. One embodiment of the present invention does not necessarily have all the effects. Other effects are apparent from and can be derived from the description of the specification, the drawings, the claims, and the like.

BRIEF DESCRIPTION OF THE DRAWINGS

FIGS. 40A and 40B show cross-sectional TEM images of an a-like OS.

FIGS. 57A and 57B are cross-sectional views each illustrating an example of an input/output device.

DETAILED DESCRIPTION OF THE INVENTION

Figure 1A:
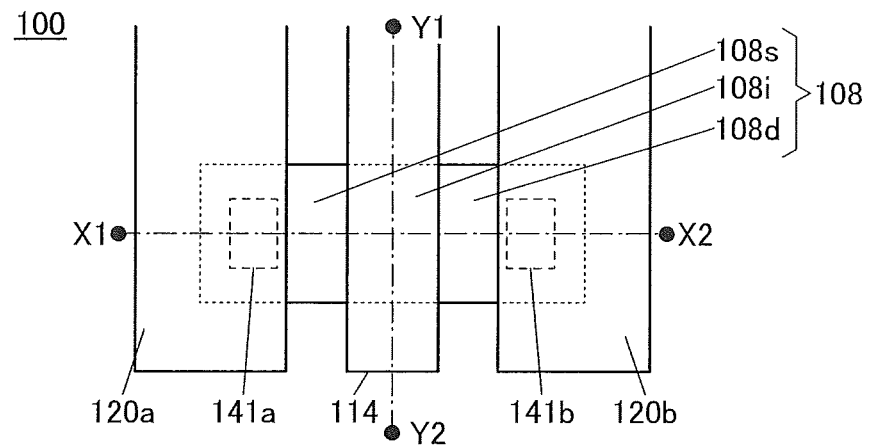
FIGS. 1A to 1C are a top view and cross-sectional views illustrating a semiconductor device.

Hereinafter, embodiments will be described with reference to the drawings. Note that embodiments can be carried out in many different modes, and it is easily understood by those skilled in the art that modes and details can be modified in various ways without departing from the spirit and the scope of the present invention. Therefore, the present invention should not be interpreted as being limited to the following description of the embodiments.

In the drawings, the size, the layer thickness, or the region is exaggerated for clarity in some cases. Therefore, one embodiment of the present invention is not limited to such a scale. Note that the drawings schematically show ideal examples, and embodiments of the present invention are not limited to shapes or values shown in the drawings.

In this specification, ordinal numbers such as "first", "second", and "third" are used in order to avoid confusion among components, and the terms do not limit the components numerically.

In this specification, terms for explaining arrangement, such as "over" and "under," are used for convenience to describe the positional relation between components with reference to drawings. The positional relation between components is changed as appropriate in accordance with the direction in which the components are described. Thus, the positional relation is not limited by a term used in the specification and can be described with another term as appropriate depending on the situation.

In this specification and the like, a transistor is an element having at least three terminals: a gate, a drain, and a source. A channel region is formed between the drain (a drain terminal, a drain region, or a drain electrode) and the source (a source terminal, a source region, or a source electrode), and current can flow through the drain, the channel region, and the source. In this specification and the like, a channel region refers to a region through which current mainly flows.

Furthermore, functions of a source and a drain are sometimes replaced by each other when a transistor of opposite polarity is used or when the direction of current flow is changed in circuit operation, for example. Therefore, the terms "source" and "drain" can be used to denote the drain and the source, respectively, in this specification and the like.

In this specification and the like, the expression "electrically connected" includes the case where components are connected through an "object having any electric function". There is no particular limitation on an object having any electric function as long as electric signals can be transmitted and received between components that are connected through the object. Examples of an "object having any electric function" are, in addition to an electrode and a wiring, a switching element such as a transistor, a resistor, an inductor, a capacitor, and elements with a variety of functions.

In this specification and the like, the term "parallel" indicates that the angle formed between two straight lines is greater than or equal to −10° and less than or equal to 10°, and accordingly also includes the case where the angle is greater than or equal to −5° and less than or equal to 50. The term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, the terms "film" and "layer" can be interchanged with each other. For example, in some cases, the term "conductive film" can be used instead of the term "conductive layer", and the term "insulating layer" can be used instead of the term "insulating film".

Unless otherwise specified, off-state current in this specification and the like refers to drain current of a transistor in an off state (also referred to as a non-conducting state and a cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to drain current that flows when the gate-source voltage Vgs is lower than the threshold voltage Vth.

The off-state current of a transistor depends on Vgs in some cases. Therefore, "the off-state current of a transistor is I or lower" may mean that the off-state current of the transistor is I or lower at a certain Vgs. The off-state current of a transistor may refer to off-state current at a given Vgs, at Vgs in a given range, or at Vgs at which sufficiently low off-state current is obtained, for example.

As an example, an assumption is made that an n-channel transistor has a threshold voltage Vth of 0.5 V and a drain current of $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The drain current of the transistor is $1\times10^{-19}$ A or lower at Vgs of −0.5 V or at Vgs in the range from −0.8 V to −0.5 V; therefore, it may be said that the off-state current of the transistor is $1\times10^{-19}$ A or lower. Since the drain current of the transistor is $1\times10^{-22}$ A or lower at a certain Vgs, it may be said that the off-state current of the transistor is $1\times10^{-22}$ A or lower.

In this specification and the like, the off-state current of a transistor with a channel width W is sometimes represented by a current value per channel width W or by a current value per given channel width (e.g., 1 μm). In the latter case, the off-state current may be represented by current per length (e.g., A/μm).

The off-state current of a transistor depends on temperature in some cases. Unless otherwise specified, the off-state current in this specification may be off-state current at room temperature, 60° C., 85° C., 95° C., or 125° C. Alternatively, the off-state current may be off-state current at a temperature at which the reliability of a semiconductor device or the like including the transistor is ensured or a temperature at which the semiconductor device or the like including the transistor is used (e.g., a temperature in the range of 5° C. to 35° C.). The state in which the off-state current of a transistor is I or lower may indicate that the off-state current of the transistor at room temperature, 60° C., 85° C., 95° C., 125° C., a temperature at which the reliability of a semiconductor device or the like including the transistor is ensured, or a temperature at which the semiconductor device or the like including the transistor is used (e.g., a temperature in the range of 5° C. to 35° C.) is I or lower at a certain Vgs.

The off-state current of a transistor depends on the voltage Vds between its drain and source in some cases. Unless otherwise specified, the off-state current in this specification may be off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current may be off-state current at Vds at which the reliability of a semiconductor device or the like including the transistor is ensured or at Vds used in the semiconductor device or the like including the transistor. The state in which the off-state current of a transistor is I or lower may indicate that the off-state current of the transistor at Vds of 0.1 V, 0.8 V, 1 V, 1.2 V, 1.8 V, 2.5 V, 3 V, 3.3 V, 10 V, 12 V, 16 V, or 20 V, at Vds at which the reliability of a semiconductor device or the like including the transistor is ensured, or at Vds used in the semiconductor device or the like including the transistor is I or lower at a certain Vgs.

In the above description of the off-state current, a drain may be replaced by a source. That is, the off-state current sometimes refers to current that flows through a source of a transistor in the off state.

In this specification and the like, the term "leakage current" sometimes expresses the same meaning as "off-state current". In this specification and the like, the off-state current sometimes refers to current that flows between a source and a drain of a transistor in the off state, for example.

In this specification and the like, an impurity in a semiconductor refers to an element that is not a main component of the semiconductor. For example, an element with a concentration lower than 0.1 atomic % is an impurity. If a semiconductor contains an impurity, the density of states (DOS) may be formed therein, the carrier mobility may be decreased, or the crystallinity may be decreased, for example. In the case where the semiconductor includes an oxide semiconductor, examples of an impurity which changes the characteristics of the semiconductor include Group 1 elements, Group 2 elements, Group 14 elements, Group 15 elements, and transition metals other than the main components; specific examples are hydrogen (included in water), lithium, sodium, silicon, boron, phosphorus, carbon, and nitrogen. In an oxide semiconductor, an oxygen vacancy may be formed by entry of an impurity such as hydrogen. Furthermore, in the case where the semiconductor includes silicon, examples of an impurity which changes the characteristics of the semiconductor include oxygen, Group 1 elements except hydrogen, Group 2 elements, Group 13 elements, and Group 15 elements.

(Embodiment 1)

In this embodiment, examples of a semiconductor device including a transistor and a method for manufacturing the semiconductor device will be described with reference to FIGS. 1A to 1C through FIGS. 20A to 20D.

<1-1. Structure Example 1 of Semiconductor Device>

Figure 1B:
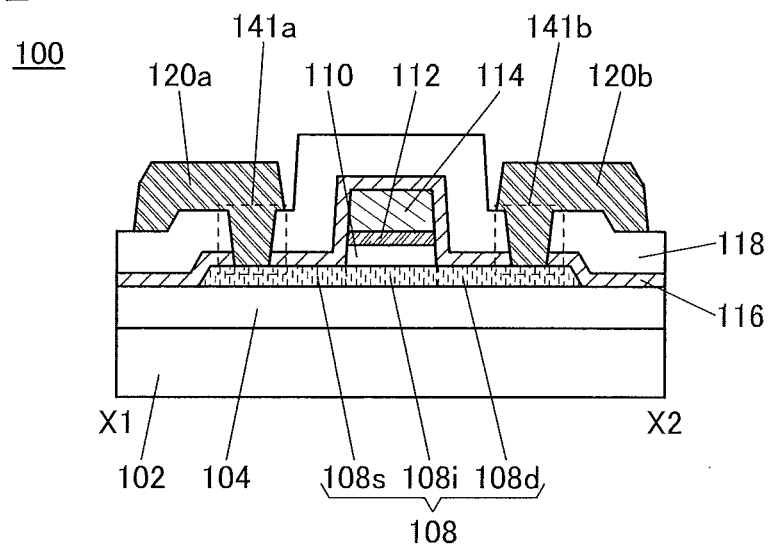
Figure 1C:
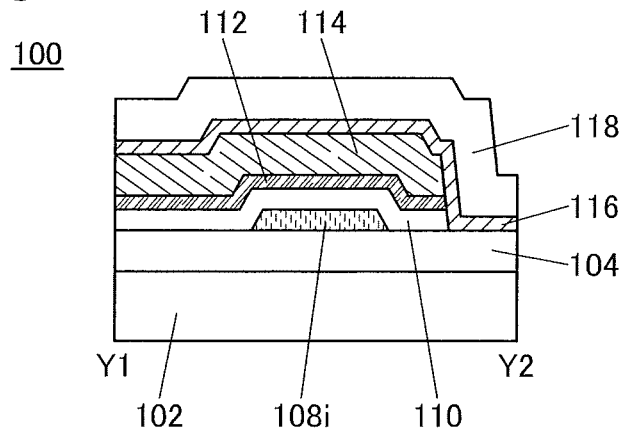

FIGS. 1A to 1C illustrate an example of a semiconductor device including a transistor. Note that the transistor in FIGS. 1A to 1C has a staggered (top-gate) structure.

FIG. 1A is a top view of a transistor 100. FIG. 1B is a cross-sectional view taken along dashed-dotted line X1-X2 in FIG. 1A. FIG. 1C is a cross-sectional view taken along dashed-dotted line Y1-Y2 in FIG. 1A. For clarity, FIG. 1A does not illustrate some components such as an insulating film 110. As in FIG. 1A, some components are not illustrated in some cases in top views of transistors described below. Furthermore, the direction of dashed-dotted line X1-X2 may be referred to as a channel length (L) direction, and the direction of dashed-dotted line Y1-Y2 may be referred to as a channel width (W) direction.

The transistor 100 illustrated in FIGS. 1A to 1C includes an insulating film 104 over a substrate 102, an oxide semiconductor film 108 over the insulating film 104, the insulating film 110 over the oxide semiconductor film 108, a metal oxide film 112 over the insulating film 110, a conductive film 114 over the metal oxide film 112, and an insulating film 116 over the insulating film 104, the oxide semiconductor film 108, and the conductive film 114. The oxide semiconductor film 108 has a channel region 108$i$ overlapping with the conductive film 114, a source region 108$s$ in contact with the insulating film 116, and a drain region 108$d$ in contact with the insulating film 116.

Note that the insulating film 116 contains one or more of nitrogen, hydrogen, and fluorine. The insulating film 116 is in contact with the source region 108$s$ and the drain region 108$d$, so that one or more of nitrogen, hydrogen, and fluorine that are contained in the insulating film 116 are added to the source region 108$s$ and the drain region 108$d$. The source region 108$s$ and the drain region 108$d$ each have a high carrier density when one or more of the above elements are added thereto. In particular, the source region 108$s$ and the drain region 108$d$ preferably each contain fluorine. When the source region 108$s$ and the drain region 108$d$ each contain fluorine, the carrier density can be stably increased. A structure in which an oxide semiconductor contains fluorine is described in detail in Embodiment 2.

The transistor 100 may further include an insulating film 118 over the insulating film 116, a conductive film 120$a$ electrically connected to the source region 108$s$ through an opening 141$a$ provided in the insulating films 116 and 118, and a conductive film 120$b$ electrically connected to the drain region 108$d$ through an opening 141$b$ provided in the insulating films 116 and 118.

In this specification and the like, the insulating film 104 may be referred to as a first insulating film, the insulating film 110 may be referred to as a second insulating film, the insulating film 116 may be referred to as a third insulating film, and the insulating film 118 may be referred to as a fourth insulating film. The conductive film 114 functions as a gate electrode, the conductive film 120$a$ functions as a source electrode, and the conductive film 120$b$ functions as a drain electrode.

The metal oxide film 112 has a function of supplying oxygen to the insulating film 110. The metal oxide film 112 having a function of supplying oxygen to the insulating film 110 enables the insulating film 110 to have an excess oxygen region. Since the insulating film 110 includes the excess oxygen region, excess oxygen can be supplied to the channel region 108$i$ included in the oxide semiconductor film 108. As a result, oxygen vacancies that might be formed in the channel region 108$i$ can be filled with excess oxygen, which can provide a highly reliable semiconductor device.

To supply excess oxygen to the oxide semiconductor film 108, excess oxygen may be supplied to the insulating film 104 that is formed under the oxide semiconductor film 108. However, in that case, excess oxygen contained in the insulating film 104 might also be supplied to the source region 108$s$ and the drain region 108$d$ included in the oxide semiconductor film 108. When excess oxygen is supplied to the source region 108$s$ and the drain region 108$d$, the resistance of the source region 108$s$ and the drain region 108$d$ might be increased.

In contrast, in the structure in which the insulating film 110 formed over the oxide semiconductor film 108 contains excess oxygen, excess oxygen can be selectively supplied only to the channel region 108$i$. Alternatively, the carrier density of the source and drain regions 108$s$ and 108$d$ may be selectively increased after excess oxygen is supplied to the channel region 108$i$ and the source and drain regions 108$s$ and 108$d$.

Note that the metal oxide film 112 may be any one of an insulator, a semiconductor, and a conductor as long as the metal oxide film 112 has a function of supplying oxygen to the insulating film 110. For example, in the case where the metal oxide film 112 is an insulator or a semiconductor, the metal oxide film 112 functions as a gate insulating film and the insulating film 110 and the metal oxide film 112 can form a gate insulating film of the transistor 100. In the case where the metal oxide film 112 is a semiconductor or a conductor, the metal oxide film 112 functions as a gate electrode and the conductive film 114 and the metal oxide film 112 can form a gate electrode of the transistor 100.

Note that the metal oxide film 112 contains one or more of In, Zn, Al, Ga, Y, and Sn. For example, in the case where the metal oxide film 112 is an insulator or a semiconductor, aluminum oxide, gallium oxide, or yttrium oxide may be used for the metal oxide film 112. Alternatively, in the case where the metal oxide film 112 is a semiconductor or a conductor, indium oxide, tin oxide, zinc oxide, or an In—Ga—Zn oxide may be used for the metal oxide film 112.

In the case where an oxide semiconductor typified by an In—Ga—Zn oxide is used for the metal oxide film 112, the metal oxide film 112 has high carrier density by supplying oxygen to the insulating film 110 and then being in contact with the conductive film 114, or by being supplied with nitrogen, hydrogen, or fluorine from the insulating film 116. In other words, the oxide semiconductor functions as an oxide conductor (OC). Therefore, the metal oxide film 112 can be used as part of the gate electrode.

Furthermore, each of the source region 108$s$ and the drain region 108$d$ included in the oxide semiconductor film 108 preferably contains an element that forms an oxygen vacancy or an element that is bonded to an oxygen vacancy. Typical examples of the element that forms an oxygen vacancy or the element that is bonded to an oxygen vacancy include hydrogen, boron, carbon, nitrogen, fluorine, phosphorus, sulfur, chlorine, titanium, and a rare gas. Typical examples of the rare gas include helium, neon, argon, krypton, and xenon. In the case where the element that forms an oxygen vacancy is contained in the insulating film 116, the constituent element of the insulating film 116 is diffused to the source region 108$s$ and the drain region 108$d$, or the element that forms the oxygen vacancy is added to the source region 108s and the drain region 108d by impurity addition treatment.

An impurity element added to the oxide semiconductor film cuts a bond between a metal element and oxygen in the oxide semiconductor film, so that an oxygen vacancy is formed. Alternatively, when an impurity element is added to the oxide semiconductor film, oxygen bonded to a metal element in the oxide semiconductor film is bonded to the impurity element and detached from the metal element, so that an oxygen vacancy is formed. As a result, the oxide semiconductor film has a higher carrier density, and thus, the conductivity thereof becomes higher.

As described above, in the semiconductor device of one embodiment of the present invention, by supplying excess oxygen to the insulating film 110 in contact with the oxide semiconductor film 108, the excess oxygen can be selectively supplied to the channel region 108i in the oxide semiconductor film 108. When the insulating film 116 contains one or more of hydrogen, nitrogen, and fluorine, the carrier density of the source region 108s and the drain region 108d which are in contact with the insulating film 116 can be selectively increased. Thus, a semiconductor device with excellent electrical characteristics can be provided.

Next, details of the components of the semiconductor device in FIGS. 1A to 1C will be described.

[Substrate]

As the substrate 102, a variety of substrates can be used without particular limitation. Examples of the substrate include a semiconductor substrate (e.g., a single-crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper containing a fibrous material, and a base material film. As examples of the glass substrate, a barium borosilicate glass substrate, an aluminoborosilicate glass substrate, and a soda lime glass substrate can be given. Examples of materials of the flexible substrate, the attachment film, the base film, and the like are plastics typified by polyethylene terephthalate (PET), polyethylene naphthalate (PEN), and polyether sulfone (PES). Another example is a synthetic resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, and paper. In particular, a transistor formed using a semiconductor substrate, a single-crystal substrate, an SOI substrate, or the like can have little variation in characteristics, size, shape, or the like, high current capability, and a small size. Such a transistor can achieve lower power consumption or higher integration of a circuit.

Alternatively, a flexible substrate may be used as the substrate 102, and the transistor may be formed directly on the flexible substrate. Alternatively, a separation layer may be provided between the substrate 102 and the transistor. The separation layer can be used when part or the whole of a semiconductor device formed over the separation layer is separated from the substrate 102 and transferred to another substrate. In such a case, the transistor can be transferred to even a substrate having low heat resistance or a flexible substrate. For example, the above separation layer can be an organic resin film of polyimide or the like formed over the substrate or a stack including inorganic films (e.g., a tungsten film and a silicon oxide film).

Examples of a substrate to which a transistor is transferred include, in addition to the above substrates over which the transistor can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupra, rayon, or regenerated polyester), and the like), a leather substrate, and a rubber substrate. When such a substrate is used, a transistor with excellent characteristics or a transistor with low power consumption can be formed, a device with high durability can be manufactured, high heat resistance can be provided, or a reduction in weight or thickness can be achieved.

[First Insulating Film]

The insulating film 104 can be formed by a sputtering method, a CVD method, an evaporation method, a pulsed laser deposition (PLD) method, a printing method, a coating method, or the like as appropriate. For example, the insulating film 104 can be formed to have a single-layer structure or stacked-layer structure of an oxide insulating film and/or a nitride insulating film. To improve the properties of the interface with the oxide semiconductor film 108, at least a region of the insulating film 104 which is in contact with the oxide semiconductor film 108 is preferably formed using an oxide insulating film. When the insulating film 104 is formed using an oxide insulating film from which oxygen is released by heating, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased, and interface states at the interface between the insulating film 104 and the oxide semiconductor film 108 and oxygen vacancies included in the channel region 108i of the oxide semiconductor film 108 can be reduced.

For example, the insulating film 104 can be formed to have a single-layer structure or stacked-layer structure of silicon oxide, silicon oxynitride, silicon nitride oxide, silicon nitride, aluminum oxide, hafnium oxide, gallium oxide, a Ga—Zn oxide, or the like. In this embodiment, the insulating film 104 has a stacked-layer structure of a silicon nitride film and a silicon oxynitride film. With the insulating film 104 having such a stack-layer structure including a silicon nitride film as a lower layer and a silicon oxynitride film as an upper layer, oxygen can be efficiently introduced into the oxide semiconductor film 108.

[Oxide Semiconductor Film]

The oxide semiconductor film 108 is formed using a metal oxide such as an In-M-Zn oxide (M is Al, Ga, Y, or Sn). Alternatively, an In—Ga oxide or an In—Zn oxide may be used for the oxide semiconductor film 108.

In the case where the oxide semiconductor film 108 includes an In-M-Zn oxide, the proportions of In and M, the summation of which is assumed to be 100 atomic %, are as follows: the proportion of In is higher than 25 atomic % and the proportion of M is lower than 75 atomic %, or the proportion of In is higher than 34 atomic % and the proportion of M is lower than 66 atomic %.

The energy gap of the oxide semiconductor film 108 is preferably 2 eV or more, 2.5 eV or more, or 3 eV or more.

The thickness of the oxide semiconductor film 108 is greater than or equal to 3 nm and less than or equal to 200 nm, preferably greater than or equal to 3 nm and less than or equal to 100 nm, further preferably greater than or equal to 3 nm and less than or equal to 60 nm.

In the case where the oxide semiconductor film 108 includes an In-M-Zn oxide, the atomic ratio of metal elements in a sputtering target used for depositing the In-M-Zn oxide preferably satisfies In≥M and Zn≥M. The atomic ratio of In to M and Zn in such a sputtering target is preferably 1:1:1, 1:1:1.2, 2:1:1.5, 2:1:2.3, 2:1:3, 3:1:2, 4:2:4.1, 5:1:7, or the like. Note that the atomic ratios of metal elements in the deposited oxide semiconductor film 108 may vary from the above atomic ratio of metal elements in the sputtering target within a range of approximately ±40%. For example, when a sputtering target whose atomic ratio of In to Ga and Zn is 4:2:4.1 is used, the atomic ratio of In to Ga and Zn in the deposited oxide semiconductor film may be approximately 4:2:3. In the case where a sputtering target whose atomic ratio of In to Ga and Zn is 5:1:7 is used, the atomic ratio of In to Ga and Zn in the deposited oxide semiconductor film may be approximately 5:1:6.

When contained in the oxide semiconductor film 108, silicon or carbon, which are elements belonging to Group 14, may cause oxygen vacancies to be increased and the oxide semiconductor film to have n-type conductivity. Thus, the concentration of silicon or carbon in the oxide semiconductor film 108, particularly in the channel region 108$i$, is set to be lower than or equal to $2 \times 10^{18}$ atoms/cm$^3$ or lower than or equal to $2 \times 10^{17}$ atoms/cm$^3$. As a result, the transistor has a positive threshold voltage (normally-off characteristics). Note that the concentration of silicon or carbon can be measured by secondary ion mass spectrometry (SIMS), for example.

Furthermore, the concentration of alkali metal or alkaline earth metal in the channel region 108$i$, which is measured by SIMS, can be lower than or equal to $1 \times 10^{18}$ atoms/cm$^3$ or lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the channel region 108$i$. As a result, the transistor has a positive threshold voltage (normally-off characteristics).

If nitrogen is contained in the channel region 108$i$, electrons serving as carriers are generated and the carrier density is increased, so that the channel region 108$i$ may have n-type conductivity. A transistor including an oxide semiconductor film containing nitrogen is likely to have normally-on characteristics. For this reason, nitrogen in the channel region 108$i$ is preferably reduced as much as possible. For example, the nitrogen concentration measured by SIMS may be $5 \times 10^{18}$ atoms/cm$^3$ or lower.

By reducing impurity elements in the channel region 108$i$, the carrier density in the oxide semiconductor film can be reduced. Therefore, the channel region 108$i$ can have a carrier density lower than or equal to $1 \times 10^{17}$/cm$^3$, lower than or equal to $1 \times 10^{15}$/cm$^3$, lower than or equal to $1 \times 10^{13}$/cm$^3$, or lower than or equal to $1 \times 10^{11}$/cm$^3$.

When an oxide semiconductor film with a low impurity concentration and a low density of defect states is used as the channel region 108$i$, the transistor can have more excellent electrical characteristics. Here, the state in which the impurity concentration is low and the density of defect states is low (the number of oxygen vacancies is small) is referred to as "highly purified intrinsic", "substantially highly purified intrinsic", "intrinsic", or "substantially intrinsic". A highly purified intrinsic or substantially highly purified intrinsic oxide semiconductor has few carrier generation sources and thus can have a low carrier density in some cases. Thus, a transistor whose channel region is formed in the oxide semiconductor film is likely to have a positive threshold voltage (normally-off characteristics). The highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film enables extremely low off-state current. Thus, the transistor whose channel region is formed in the oxide semiconductor film has little variation in electrical characteristics and high reliability in some cases.

Meanwhile, since the source region 108$s$ and the drain region 108$d$ are in contact with the insulating film 116, one or more of hydrogen, nitrogen, and fluorine are added from the insulating film 116 to the source region 108$s$ and the drain region 108$d$; thus, the carrier density of the source region 108$s$ and the drain region 108$d$ is increased.

Furthermore, the oxide semiconductor film 108 may have a non-single-crystal structure. The non-single-crystal structure includes a c-axis aligned crystalline oxide semiconductor (CAAC-OS) described later, a polycrystalline structure, a microcrystalline structure described later, or an amorphous structure, for example. Among the non-single-crystal structures, the amorphous structure has the highest density of defect states, whereas the CAAC-OS has the lowest density of defect states.

Note that the oxide semiconductor film 108 may be a single film or stacked films including two or more of the following regions: a region having an amorphous structure, a region having a microcrystalline structure, a region having a polycrystalline structure, a CAAC-OS region, and a region having a single-crystal structure.

In the oxide semiconductor film 108, the crystallinity of the channel region 108$i$ may be different from that of the source region 108$s$ and the drain region 108$d$. Specifically, in the oxide semiconductor film 108, the source region 108$s$ and the drain region 108$d$ may have lower crystallinity than the channel region 108$i$. This is because the source region 108$s$ and the drain region 108$d$ are damaged by the impurity addition, which results in a decrease in the crystallinity of the source region 108$s$ and the drain region 108$d$.

[Second Insulating Film]

The insulating film 110 functions as a gate insulating film of the transistor 100. In addition, the insulating film 110 has a function of supplying oxygen to the oxide semiconductor film 108, particularly to the channel region 108$i$. The insulating film 110 can be formed to have a single-layer structure or a stacked-layer structure of an oxide insulating film or a nitride insulating film, for example. To improve the interface properties with the oxide semiconductor film 108, a region which is in the insulating film 110 and in contact with the oxide semiconductor film 108 is preferably formed using at least an oxide insulating film. For example, silicon oxide, silicon oxynitride, silicon nitride oxide, or silicon nitride may be used for the insulating film 110.

The thickness of the insulating film 110 can be greater than or equal to 5 nm and less than or equal to 400 nm, greater than or equal to 5 nm and less than or equal to 300 nm, or greater than or equal to 10 nm and less than or equal to 250 nm.

It is preferable that the insulating film 110 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating film 110, a silicon oxide film or a silicon oxynitride film whose spin density of a signal due to the E' center is lower than or equal to $3\times10^{17}$ spins/cm$^3$ and preferably lower than or equal to $5\times10^{16}$ spins/cm$^3$ may be used.

In addition to the above-described signal, a signal due to nitrogen dioxide (NO$_2$) might be observed in the insulating film 110. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating film whose spin density of a signal due to nitrogen dioxide (NO$_2$) is higher than or equal to $1\times10^{17}$ spins/cm$^3$ and lower than $1\times10^{18}$ spins/cm$^3$ as the insulating film 110, for example.

Nitrogen oxide (NO$_x$; x is greater than 0 and less than or equal to 2, preferably greater than or equal to 1 and less than or equal to 2), typically NO or NO$_2$, forms levels in the insulating film 110, for example. The level is positioned in the energy gap of the oxide semiconductor film 108. Therefore, when nitrogen oxide is diffused to the interface between the insulating film 110 and the oxide semiconductor film 108, an electron is in some cases trapped by the level on the insulating film 110 side. As a result, the trapped electron remains in the vicinity of the interface between the insulating film 110 and the oxide semiconductor film 108; thus, the threshold voltage of the transistor is shifted in the positive direction.

For that reason, when a film with a low nitrogen oxide content or a film that releases a small amount of nitrogen oxide is used as the insulating film 110, a shift of the threshold voltage of the transistor can be reduced.

As an insulating film that releases a small amount of nitrogen oxide, for example, a silicon oxynitride film can be used. The silicon oxynitride film releases more ammonia than nitrogen oxide in thermal desorption spectroscopy (TDS); the typical released amount of ammonia is greater than or equal to $1\times10^{18}$ molecules/cm$^3$ and less than or equal to $5\times10^{19}$ molecules/cm$^3$. Note that the released amount of ammonia is the total amount of ammonia released by heat treatment in a range from 50° C. to 650° C. or a range from 50° C. to 550° C. in TDS.

Since nitrogen oxide reacts with ammonia and oxygen in heat treatment, the use of an insulating film that releases a large amount of ammonia reduces nitrogen oxide.

Note that in the case where the insulating film 110 is analyzed by SIMS, nitrogen concentration in the film is preferably lower than or equal to $6\times10^{20}$ atoms/cm$^3$.

The insulating film 110 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), or hafnium oxide, so that gate leakage current of the transistor can be reduced.

[Metal Oxide Film]

The metal oxide film 112 contains one or more of In, Zn, Al, Ga, Y, and Sn. Specific examples of a material which can be used for the metal oxide film 112 include indium oxide, zinc oxide, aluminum oxide, gallium oxide, yttrium oxide, tin oxide, an In—Zn oxide, an In—Ga oxide, an In—Sn oxide, and an In—Ga—Zn oxide. In the case where an insulator or a semiconductor is used for the metal oxide film 112, aluminum oxide is preferably used. In the case where a semiconductor or a conductor is used for the metal oxide film 112, an In—Ga—Zn oxide is preferably used.

A sputtering method or an atomic layer deposition (ALD) method is preferably used to form the metal oxide film 112. Oxygen addition treatment may be performed after the metal oxide film 112 is formed. Through the oxygen addition treatment, an excess oxygen region can be provided in the metal oxide film 112 and the insulating film 110. An ion implantation method, an ion doping method, a plasma immersion ion implantation method, plasma treatment, or the like can be used in the oxygen addition treatment.

[Third Insulating Film]

The insulating film 116 contains one or more of nitrogen, hydrogen, and fluorine. As the insulating film 116, for example, a nitride insulating film can be used. The nitride insulating film can be formed using silicon nitride, silicon nitride oxide, silicon nitride fluoride, silicon fluoronitride, or the like. The hydrogen concentration in the insulating film 116 is preferably higher than or equal to $1\times10^{22}$ atoms/cm$^3$. Furthermore, the insulating film 116 is in contact with the source region 108s and the drain region 108d of the oxide semiconductor film 108. Thus, the concentration of an impurity (nitrogen, hydrogen, or fluorine) in the source region 108s and the drain region 108d in contact with the insulating film 116 is increased, leading to an increase in the carrier density of the source region 108s and the drain region 108d.

In this embodiment, a silicon oxyfluoride film is formed as the insulating film 116 using silicon tetrafluoride (SiF$_4$) and nitrogen (N$_2$) as a source gas. Note that a silicon oxyfluoride film may be formed as the insulating film 116 using silicon tetrafluoride (SiF$_4$) and dinitrogen monoxide (N$_2$O) as a source gas.

[Fourth Insulating Film]

The insulating film 118 can be formed to have a single-layer structure or stacked-layer structure of an oxide insulating film and/or a nitride insulating film. For example, the insulating film 118 can be formed to have a single-layer structure or stacked-layer structure of silicon oxide, silicon oxynitride, silicon nitride oxide, silicon nitride, aluminum oxide, hafnium oxide, gallium oxide, a Ga—Zn oxide, or the like.

Furthermore, the insulating film 118 preferably functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

[Conductive Film]

The conductive films 114, 120a, and 120b can be formed by a sputtering method, a vacuum evaporation method, a pulsed laser deposition (PLD) method, a thermal CVD method, or the like. The conductive films 114, 120a, and 120b can be formed using, for example, a metal element selected from aluminum, chromium, copper, tantalum, titanium, molybdenum, nickel, iron, cobalt, and tungsten, an alloy containing the metal element as a component, or an alloy containing any of the metal elements in combination. Furthermore, one or more metal elements selected from manganese and zirconium may be used. In addition, the conductive films 114, 120a, and 120b may have a single-layer structure or a stacked-layer structure of two or more layers. For example, the following structure may be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a two-layer structure in which a copper film is stacked over a titanium film; a three-layer structure in which a titanium film, an aluminum film, and a titanium film are stacked in this order, or a three-layer structure in which a copper film containing manganese, a copper film, and a copper film containing manganese are stacked in this order. Alternatively, an alloy film or a nitride film in which aluminum and one or more elements selected from titanium, tantalum, tungsten, molybdenum, chromium, neodymium, and scandium are combined may be used.

The conductive films 114, 120a, and 120b can also be formed using a light-transmitting conductive material such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide containing silicon (also referred to as an In—Sn—Si oxide or ITSO). It is also possible to employ a stacked-layer structure of the above light-transmitting conductive material and the above metal element.

Furthermore, the conductive film 114 may be formed using the above-described oxide conductor (OC). The conductive film 114 can have, for example, a single-layer structure of an oxide conductor (OC), a single-layer structure of a metal film, or a stacked-layer structure of an oxide conductor (OC) and a metal film.

Note that it is suitable that the conductive film 114 has a single-layer structure of a light-shielding metal film or a stacked-layer structure of an oxide conductor (OC) and a light-shielding metal film because the channel region 108i formed under the conductive film 114 can be shielded from light.

The thickness of the conductive films 114, 120a, and 120b can be greater than or equal to 30 nm and less than or equal to 500 nm, or greater than or equal to 100 nm and less than or equal to 400 nm.

<1-2. Structure Example 2 of Semiconductor Device>

Next, a structure of a semiconductor device different from that in FIGS. 1A to 1C will be described with reference to FIGS. 2A to 2C.

Figure 2A:
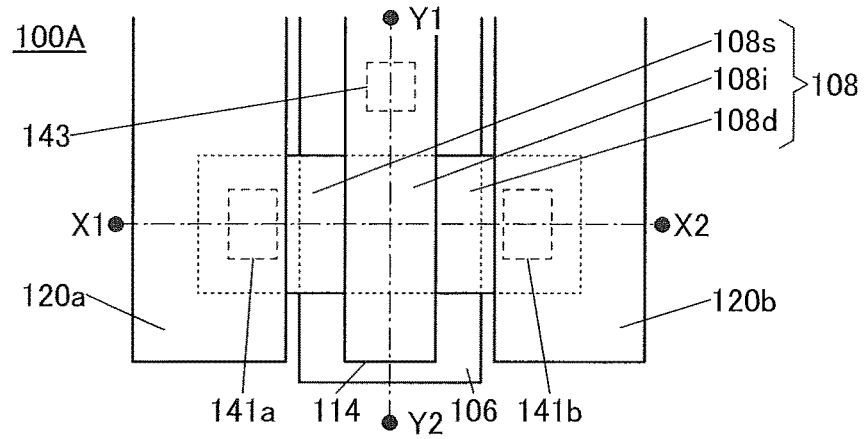
FIGS. 2A to 2C are a top view and cross-sectional views illustrating a semiconductor device.

FIG. 2A is a top view of a transistor 100A. FIG. 2B is a cross-sectional view taken along dashed-dotted line X1-X2 in FIG. 2A. FIG. 2C is a cross-sectional view taken along dashed-dotted line Y1-Y2 in FIG. 2A.

Figure 2B:
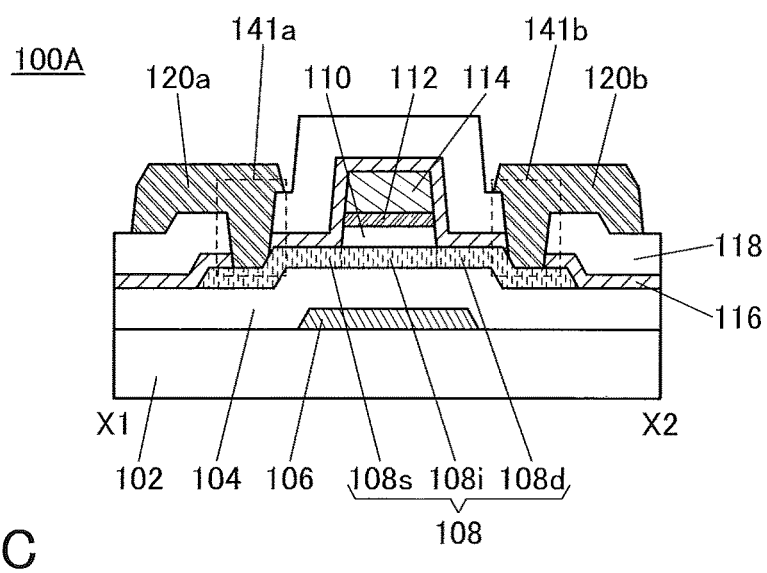
Figure 2C:
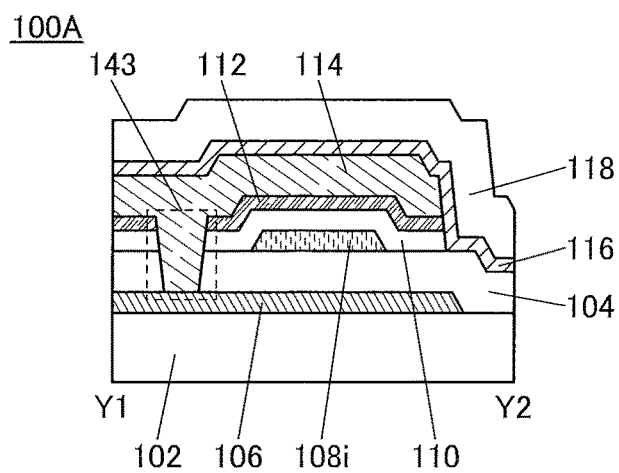

The transistor 100A illustrated in FIGS. 2A to 2C includes a conductive film 106 over the substrate 102; the insulating film 104 over the conductive film 106; the oxide semiconductor film 108 over the insulating film 104; the insulating film 110 over the oxide semiconductor film 108; the metal oxide film 112 over the insulating film 110; the conductive film 114 over the metal oxide film 112; and the insulating film 116 over the insulating film 104, the oxide semiconductor film 108, and the conductive film 114. Furthermore, the oxide semiconductor film 108 includes the channel region 108i overlapping with the conductive film 114, the source region 108s in contact with the insulating film 116, and the drain region 108d in contact with the insulating film 116.

The transistor 100A includes the conductive film 106 and an opening 143 in addition to the components of the transistor 100 described above.

Note that the opening 143 is provided in the insulating films 104 and 110 and the metal oxide film 112. The conductive film 106 is electrically connected to the conductive film 114 through the opening 143. Thus, the same potential is applied to the conductive film 106 and the conductive film 114. Note that different potentials may be applied to the conductive film 106 and the conductive film 114 without providing the opening 143. Alternatively, the conductive film 106 may be used as a light-shielding film without providing the opening 143. When the conductive film 106 is formed using a light-shielding material, for example, light irradiating the channel region 108i from the bottom can be reduced. Note that the conductive film 106 can be formed using a material similar to a material that can be used for the conductive film 114.

In the case of the structure of the transistor 100A, the conductive film 106 functions as a first gate electrode (also referred to as a bottom-gate electrode), the conductive film 114 functions as a second gate electrode (also referred to as a top-gate electrode), the insulating film 104 functions as a first gate insulating film, and the insulating film 110 functions as a second gate insulating film.

In this manner, unlike the transistor 100 described above, the transistor 100A in FIGS. 2A to 2C has a structure in which a conductive film functioning as a gate electrode is provided over and under the oxide semiconductor film 108. As in the transistor 100A, the semiconductor device of one embodiment of the present invention may have a plurality of gate electrodes.

As illustrated in FIG. 2C, the oxide semiconductor film 108 faces the conductive film 106 functioning as a first gate electrode and the conductive film 114 functioning as a second gate electrode and is positioned between the two conductive films functioning as the gate electrodes.

Furthermore, the length of the conductive film 114 in the channel width direction is larger than the length of the oxide semiconductor film 108 in the channel width direction. In the channel width direction, the whole oxide semiconductor film 108 is covered with the conductive film 114 with the insulating film 110 and the metal oxide film 112 provided therebetween. Since the conductive film 114 is connected to the conductive film 106 through the opening 143 provided in the insulating films 104 and 110 and the metal oxide film 112, a side surface of the oxide semiconductor film 108 in the channel width direction faces the conductive film 114 with the insulating film 110 provided therebetween.

In other words, in the channel width direction of the transistor 100A, the conductive films 106 and 114 are connected to each other through the opening 143 provided in the insulating films 104 and 110 and the metal oxide film 112, and the conductive films 106 and 114 surround the oxide semiconductor film 108 with the insulating films 104 and 110 and the metal oxide film 112 positioned therebetween.

Such a structure enables the oxide semiconductor film 108 included in the transistor 100A to be electrically surrounded by electric fields of the conductive film 106 functioning as a first gate electrode and the conductive film 114 functioning as a second gate electrode. A device structure of a transistor, like that of the transistor 100A, in which electric fields of a first gate electrode and a second gate electrode electrically surround an oxide semiconductor film in which a channel region is formed can be referred to as a surrounded channel (S-channel) structure.

Since the transistor 100A has the S-channel structure, an electric field for inducing a channel can be effectively applied to the oxide semiconductor film 108 by the conductive film 106 or the conductive film 114; thus, the current drive capability of the transistor 100A can be improved and high on-state current characteristics can be obtained. As a result of the high on-state current, it is possible to reduce the size of the transistor 100A. Furthermore, since the transistor 100A has a structure in which the oxide semiconductor film 108 is surrounded by the conductive film 106 and the conductive film 114, the mechanical strength of the transistor 100A can be increased.

When seen in the channel width direction of the transistor 100A, an opening different from the opening 143 may be formed on the side of the oxide semiconductor film 108 on which the opening 143 is not formed.

When a transistor has a pair of gate electrodes between which a semiconductor film is positioned as in the transistor 100A, one of the gate electrodes may be supplied with a signal A, and the other gate electrode may be supplied with a fixed potential Vb. Alternatively, one of the gate electrodes may be supplied with the signal A, and the other gate electrode may be supplied with a signal B. Alternatively, one of the gate electrodes may be supplied with a fixed potential Va, and the other gate electrode may be supplied with the fixed potential Vb.

The signal A is, for example, a signal for controlling the on/off state. The signal A may be a digital signal with two kinds of potentials, a potential V1 and a potential V2 (V1>V2). For example, the potential V1 can be a high power supply potential, and the potential V2 can be a low power supply potential. The signal A may be an analog signal.

The fixed potential Vb is, for example, a potential for controlling a threshold voltage VthA of the transistor. The fixed potential Vb may be the potential V1 or the potential V2. In that case, a potential generator circuit for generating the fixed potential Vb is not necessary, which is preferable. The fixed potential Vb may be different from the potential V1 or the potential V2. When the fixed potential Vb is low, the threshold voltage VthA can be high in some cases. As a result, the drain current flowing when the gate-source voltage Vgs is 0 V can be reduced, and leakage current in a circuit including the transistor can be reduced in some cases. The fixed potential Vb may be, for example, lower than the low power supply potential. Meanwhile, a high fixed potential Vb can lower the threshold voltage VthA in some cases. As a result, the drain current flowing when the gate-source voltage Vgs is a high power supply potential and the operating speed of the circuit including the transistor can be increased in some cases. The fixed potential Vb may be, for example, higher than the low power supply potential.

The signal B is, for example, a signal for controlling the on/off state. The signal B may be a digital signal with two kinds of potentials, a potential V3 and a potential V4 (V3>V4). For example, the potential V3 can be a high power supply potential, and the potential V4 can be a low power supply potential. The signal B may be an analog signal.

When both the signal A and the signal B are digital signals, the signal B may have the same digital value as the signal A. In this case, it may be possible to increase the on-state current of the transistor and the operating speed of the circuit including the transistor. Here, the potential V1 and the potential V2 of the signal A may be different from the potential V3 and the potential V4 of the signal B. For example, if a gate insulating film for the gate to which the signal B is input is thicker than a gate insulating film for the gate to which the signal A is input, the potential amplitude of the signal B (V3–V4) may be larger than the potential amplitude of the signal A (V1–V2). In this manner, the influence of the signal A and that of the signal B on the on/off state of the transistor can be substantially the same in some cases.

When both the signal A and the signal B are digital signals, the signal B may have a digital value different from that of the signal A. In this case, the signal A and the signal B can separately control the transistor, and thus, higher performance can be achieved. The transistor which is, for example, an n-channel transistor can function by itself as a NAND circuit, a NOR circuit, or the like in the following case: the transistor is turned on only when the signal A has the potential V1 and the signal B has the potential V3, or the transistor is turned off only when the signal A has the potential V2 and the signal B has the potential V4. The signal B may be a signal for controlling the threshold voltage VthA. For example, the potential of the signal B in a period in which the circuit including the transistor operates may be different from the potential of the signal B in a period in which the circuit does not operate. The potential of the signal B may vary depending on the operation mode of the circuit. In this case, the potential of the signal B is not changed as frequently as the potential of the signal A in some cases.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor and the operating speed of the circuit including the transistor. The signal B may be an analog signal different from the signal A. In this case, the signal A and the signal B can separately control the transistor, and thus, higher performance can be achieved.

The signal A may be a digital signal, and the signal B may be an analog signal. Alternatively, the signal A may be an analog signal, and the signal B may be a digital signal.

When both of the gate electrodes of the transistor are supplied with the fixed potentials, the transistor can function as an element equivalent to a resistor in some cases. For example, in the case where the transistor is an n-channel transistor, the effective resistance of the transistor can be sometimes low (high) when the fixed potential Va or the fixed potential Vb is high (low). When both the fixed potential Va and the fixed potential Vb are high (low), the effective resistance can be lower (higher) than that of a transistor with only one gate in some cases.

Except for the above-mentioned points, the transistor 100A has a structure and an effect similar to those of the transistor 100 described above.

<1-3. Structure Example 3 of Semiconductor Device>

Next, structures of a semiconductor device different from that in FIGS. 2A to 2C will be described with reference to FIGS. 3A and 3B, FIGS. 4A and 4B, FIGS. 5A and 5B, FIGS. 6A and 6B, FIGS. 7A and 7B, FIGS. 8A and 8B, and FIGS. 9A and 9B.

Figure 3A:
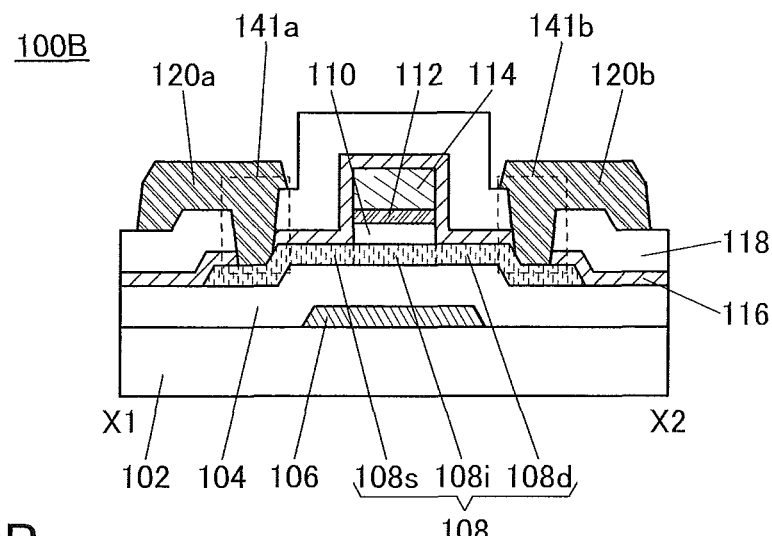
FIGS. 3A and 3B are cross-sectional views illustrating a semiconductor device.
Figure 3B:
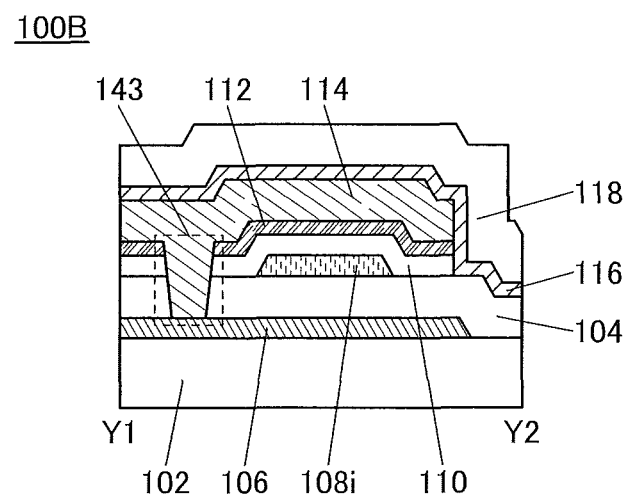
Figure 4A:
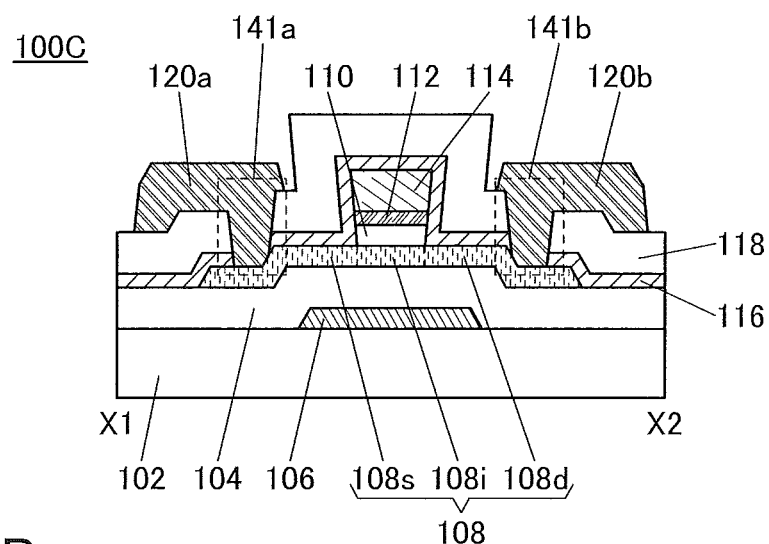
FIGS. 4A and 4B are cross-sectional views illustrating a semiconductor device.
Figure 4B:
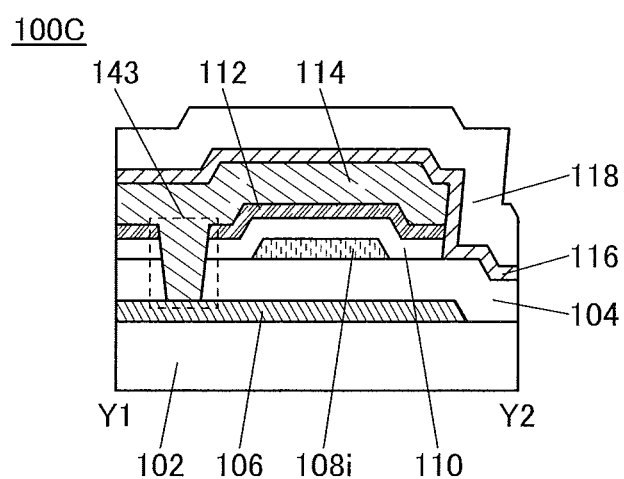
Figure 8A:
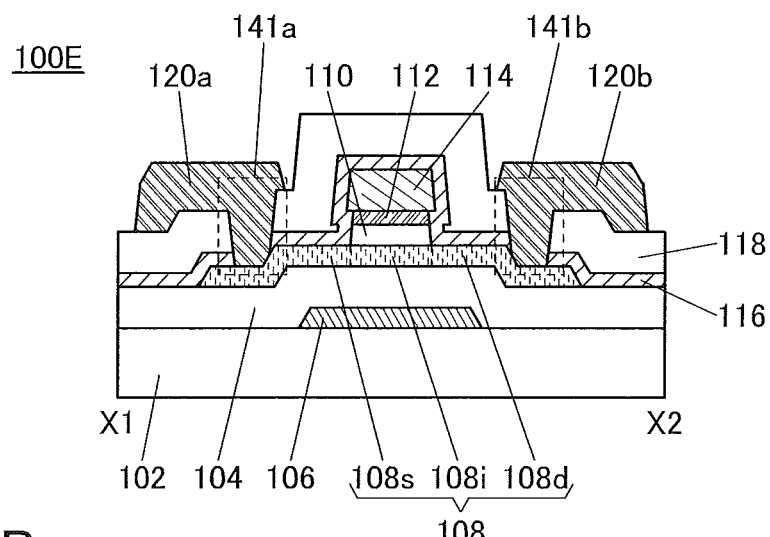
FIGS. 8A and 8B are cross-sectional views illustrating a semiconductor device.
Figure 8B:
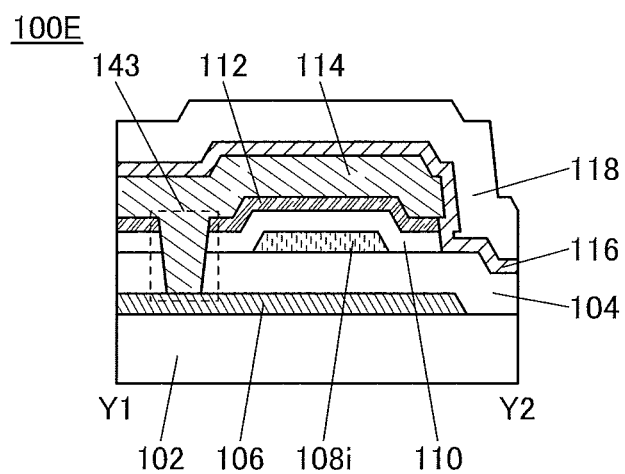
Figure 9A:
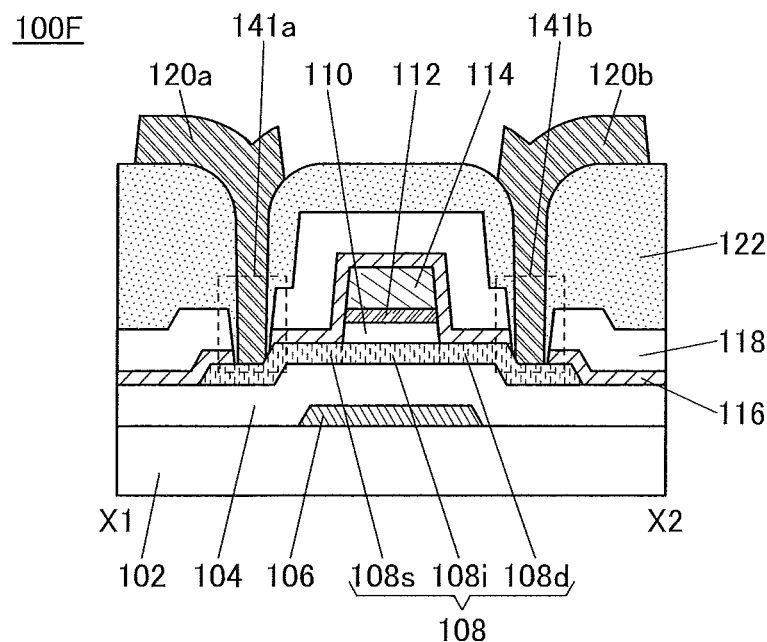
FIGS. 9A and 9B are cross-sectional views illustrating a semiconductor device.
Figure 9B:
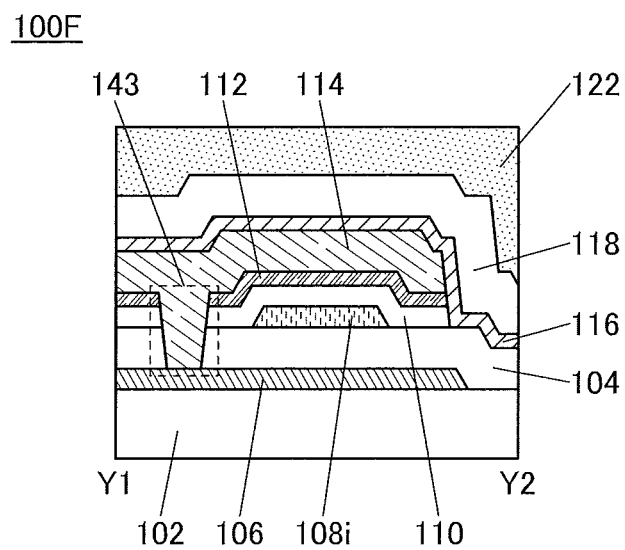

FIGS. 3A and 3B are cross-sectional views of a transistor 100B. FIGS. 4A and 4B are cross-sectional views of a transistor 100C. FIGS. 5A and 5B, FIGS. 6A and 6B, and FIGS. 7A and 7B are cross-sectional views of transistors 100D. FIGS. 8A and 8B are cross-sectional views of a transistor 100E. FIGS. 9A and 9B are cross-sectional views of a transistor 100F. Note that top views of the transistor 100B, the transistor 100C, the transistor 100D, the transistor 100E, and the transistor 100F are omitted because they are similar to the top view of the transistor 100A in FIG. 2A.

The transistor 100B illustrated in FIGS. 3A and 3B is different from the transistor 100A described above in the shape of the conductive film 114, the metal oxide film 112, and the insulating film 110. Specifically, the shape of the conductive film 114, the metal oxide film 112, and the insulating film 110 is a tapered shape in the transistor 100A but is a rectangle in the transistor 100B. Specifically, in the cross section of the transistor 100A in the channel length (L) direction, an upper end portion of the conductive film 114 is located inward from a lower end portion of the insulating film 110. In other words, a side end portion of the insulating film 110 is located beyond a side end portion of the conductive film 114. In contrast, in the cross section of the transistor 100B in the channel length (L) direction, an upper end portion of the conductive film 114 is substantially aligned with a lower end portion of the insulating film 110.

For example, the structure of the transistor 100B can be obtained in the following manner: the conductive film 114, the metal oxide film 112, and the insulating film 110 are formed by processing at a time by a dry etching method using the same mask.

A structure like that of the transistor 100A is preferable because the coverage with the insulating film 116 can be improved. Meanwhile, a structure like that of the transistor 100B is preferable because end portions of the source region 108s and the drain region 108d can be substantially aligned with end portions of the conductive film 114.

The transistor 100C illustrated in FIGS. 4A and 4B is different from the transistor 100A described above in the shape of the conductive film 114, the metal oxide film 112, and the insulating film 110. Specifically, the shape of the conductive film 114, the metal oxide film 112, and the insulating film 110 in the transistor 100C is an inversely tapered shape. In other words, in the cross section of the transistor 100C in the channel length (L) direction, an upper end portion of the conductive film 114 is further beyond the lower end portion of the insulating film 110.

For example, the structure of the transistor 100C can be obtained in the following manner: the conductive film 114, the metal oxide film 112, and the insulating film 110 are formed by processing at a time by a wet etching method using the same mask.

With a structure like that of the transistor 100C, part of the source region 108s and part of the drain region 108d are located inward from the conductive film 114 functioning as a gate electrode. Note that a region where the conductive film 114 and the source region 108s overlap with each other and a region where the conductive film 114 and the drain region 108d overlap with each other function as what are called overlap regions (also referred to as Lov regions). Note that the Lov regions overlap with the conductive film 114 functioning as the gate electrode and have lower resistance than the channel region 108i. With the Lov regions, no high-resistance region is formed between the channel region 108i and the source region 108s or the drain region 108d; accordingly, the on-state current of the transistor can be increased.

Figure 5A:
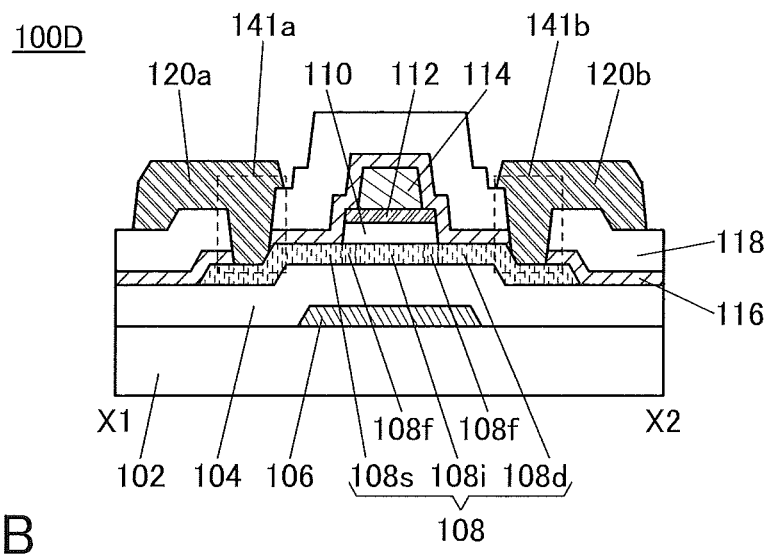
FIGS. 5A and 5B are cross-sectional views illustrating a semiconductor device.
Figure 5B:
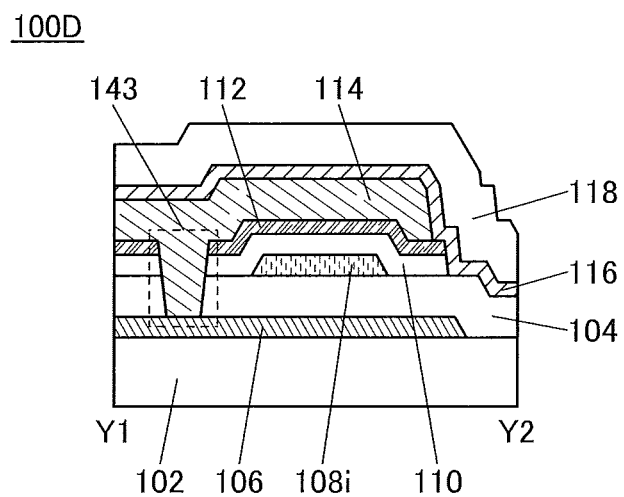

The transistor 100D illustrated in FIGS. 5A and 5B is different from the above-described transistor 100A in the shape of the conductive film 114, the metal oxide film 112, and the insulating film 110. Specifically, in the cross section of the transistor 100D in the channel length (L) direction, a lower end portion of the conductive film 114 is not aligned with an upper end portion of the metal oxide film 112. The lower end portion of the conductive film 114 is located inward from the upper end portion of the metal oxide film 112.

For example, the structure of the transistor 100D can be formed by processing the conductive film 114, the metal oxide film 112, and the insulating film 110. Specifically, the structure of the transistor 100D can be obtained in the following manner: a mask is formed over the conductive film 114, the conductive film 114 is formed by processing by a wet etching method using the mask, and then, the metal oxide film 112 and the insulating film 110 are formed by processing by a dry etching method.

With the structure of the transistor 100D, regions 108f are formed in the oxide semiconductor film 108 in some cases. The regions 108f are formed between the channel region 108i and the source region 108s and between the channel region 108i and the drain region 108d.

The regions 108f function as high-resistance regions or low-resistance regions. The high-resistance regions have the same level of resistance as the channel region 108i and do not overlap with the conductive film 114 functioning as a gate electrode. In the case where the regions 108f are high-resistance regions, the regions 108f function as offset regions. To suppress a decrease in the on-state current of the transistor 100D, the regions 108f functioning as offset regions may each have a length of 1 pin or less in the channel length (L) direction.

The low-resistance regions have a resistance that is lower than that of the channel region 108i and higher than that of the source region 108s and the drain region 108d. In the case where the regions 108f are low-resistance regions, the regions 108f function as lightly doped drain (LDD) regions. The regions 108f functioning as LDD regions can relieve an electric field in the drain region, thereby reducing a change in the threshold voltage of the transistor due to the electric field in the drain region.

Note that in the case where the region 108f serves as an LDD region, for example, the region 108f is formed by supplying one or more of nitrogen, hydrogen, and fluorine from the insulating film 116 to the region 108f or by adding an impurity element from above the metal oxide film 112 using the insulating film 110 and the metal oxide film 112 as a mask so that the impurity element is added to the oxide semiconductor film 108 through the metal oxide film 112 and the insulating film 110.

Figure 6A:
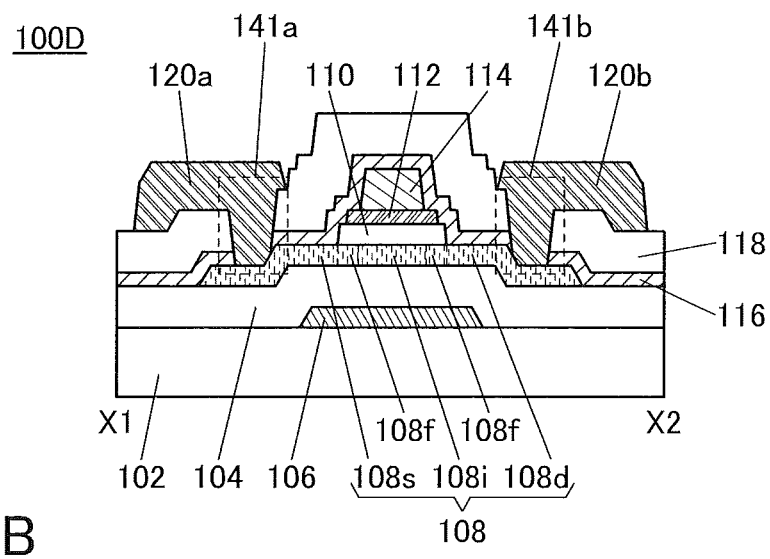
FIGS. 6A and 6B are cross-sectional views illustrating a semiconductor device.
Figure 6B:
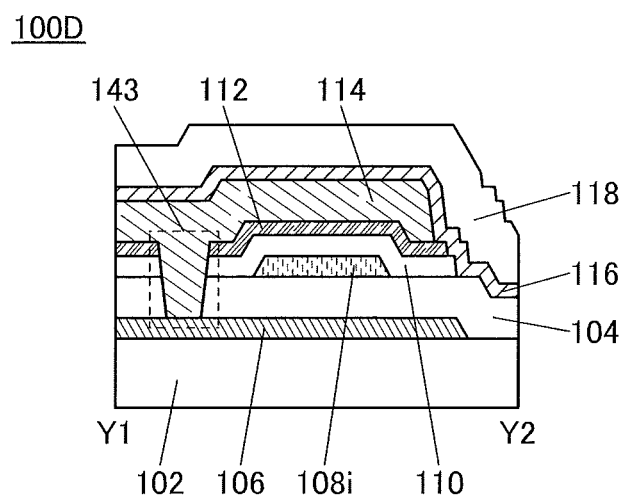

The transistor 100D illustrated in FIGS. 6A and 6B is a modification example of the transistor 100D illustrated in FIGS. 5A and 5B. The transistor 100D illustrated in FIGS. 6A and 6B is different from that illustrated in FIGS. 5A and 5B in the positions of the lower end portions of the conductive film 114, the lower end portions of the metal oxide film 112, and the lower end portions of the insulating film 110 in the cross section of the transistor in the channel length (L) direction. The lower end portion of the conductive film 114 is located inward from the upper end portion of the metal oxide film 112 and the lower end portion of the metal oxide film 112 is located inward from the upper end portion of the insulating film 110.

Figure 7A:
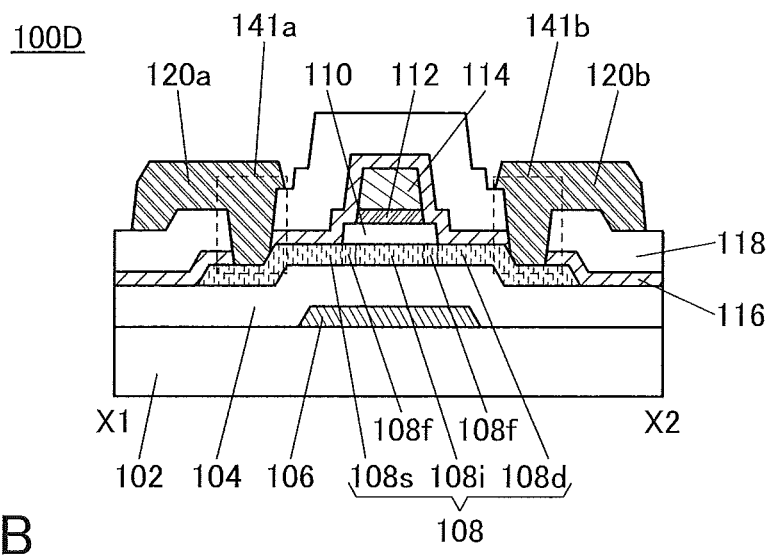
FIGS. 7A and 7B are cross-sectional views illustrating a semiconductor device.
Figure 7B:
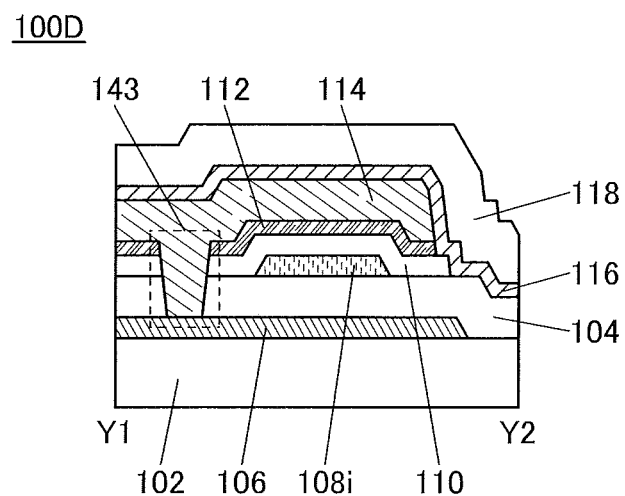

The transistor 100D illustrated in FIGS. 7A and 7B is a modification example of the transistor 100D illustrated in FIGS. 5A and 5B. In the transistor 100D illustrated in FIGS. 7A and 7B, the lower end portion of the conductive film 114 is substantially aligned with the upper end portion of the metal oxide film 112 and the lower end portion of the metal oxide film 112 is located inward from the upper end portion of the insulating film 110 in the cross section of the transistor in the channel length (L) direction.

The transistor 100E illustrated in FIGS. 8A and 8B is different from the transistor 100A in the shape of the metal oxide film 112 and the insulating film 110. Specifically, in the cross section of the transistor 100E in the channel length (L) direction, the lower end portion of the conductive film 114 is located beyond the upper end portion of the metal oxide film 112.

For example, the structure of the transistor 100E can be formed by processing the conductive film 114, the metal oxide film 112, and the insulating film 110 using the same mask. Specifically, the structure of the transistor 100E can be obtained in the following manner: a mask is formed over the conductive film 114, the conductive film 114 is formed by processing by a dry etching method using the mask, and then etching of upper surfaces of the metal oxide film 112 and the insulating film 110 and etching of side surfaces thereof (side-etching) are performed using an etchant or the like over the mask.

With a structure like that of the transistor 100E, Lov regions can be provided as in the transistor 100C.

The transistor 100F illustrated in FIGS. 9A and 9B is different from the above-described transistor 100A in that an insulating film 122 functioning as a planarization insulating film is provided over the insulating film 118. The other components of the transistor 100F are similar to those of the transistor 100A described above and have similar effects.

The insulating film 122 has a function of covering unevenness and the like caused by the transistor or the like. The insulating film 122 has an insulating property and is formed using an inorganic material or an organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

Note that the size (shape) of each opening in the insulating film 122 is not limited to that in FIGS. 9A and 9B, in which the openings are larger than the openings 141a and 141b, and may be smaller than or equal to the size (shape) of each of the openings 141a and 141b, for example.

In addition, the structure is not limited to the example in FIGS. 9A and 9B, in which the conductive films 120a and 120b are provided over the insulating film 122; for example, the insulating film 122 may be provided over the conductive films 120a and 120b formed over the insulating film 118.

<1-4. Structure Example 4 of Semiconductor Device>

Next, structures of a semiconductor device different from that in FIGS. 2A to 2C will be described with reference to FIGS. 10A and 10B, FIGS. 11A and 11B, FIGS. 12A and 12B, and FIGS. 13A and 13B.

Figure 10A:
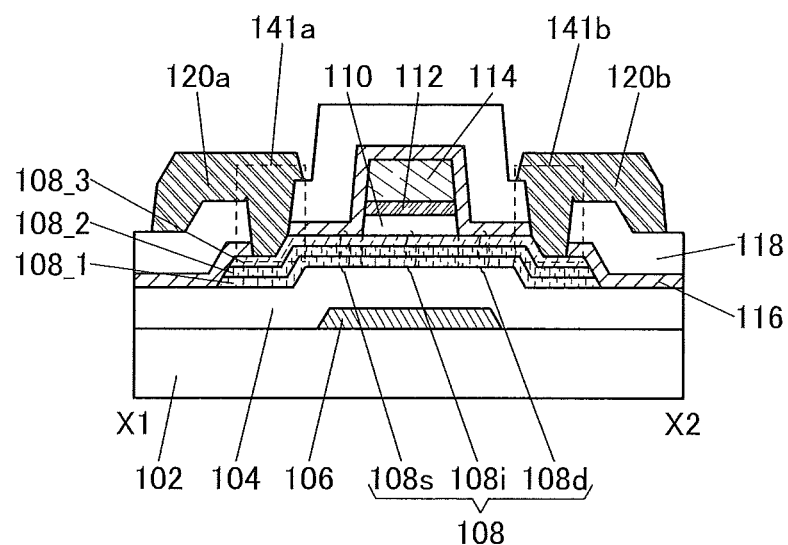
FIGS. 10A and 10B are cross-sectional views illustrating a semiconductor device.
Figure 10B:
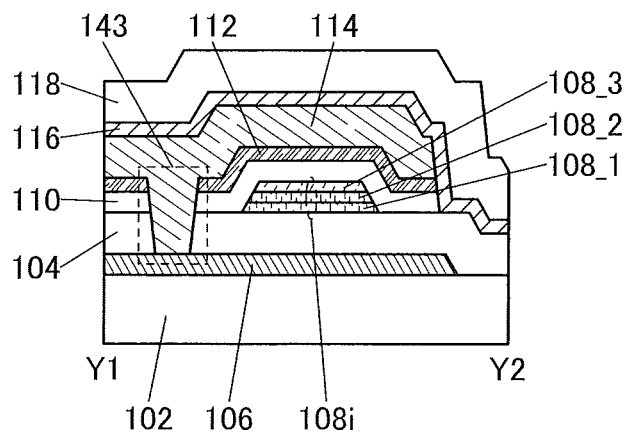
Figure 11A:
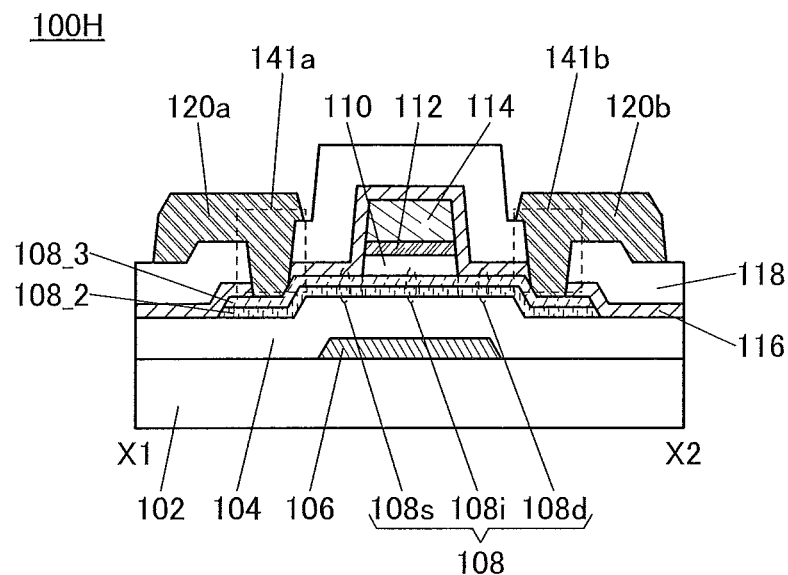
FIGS. 11A and 11B are cross-sectional views illustrating a semiconductor device.
Figure 11B:
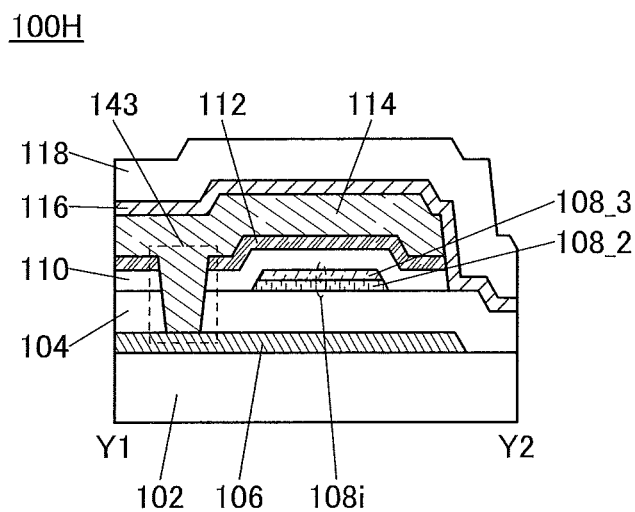
Figure 12A:
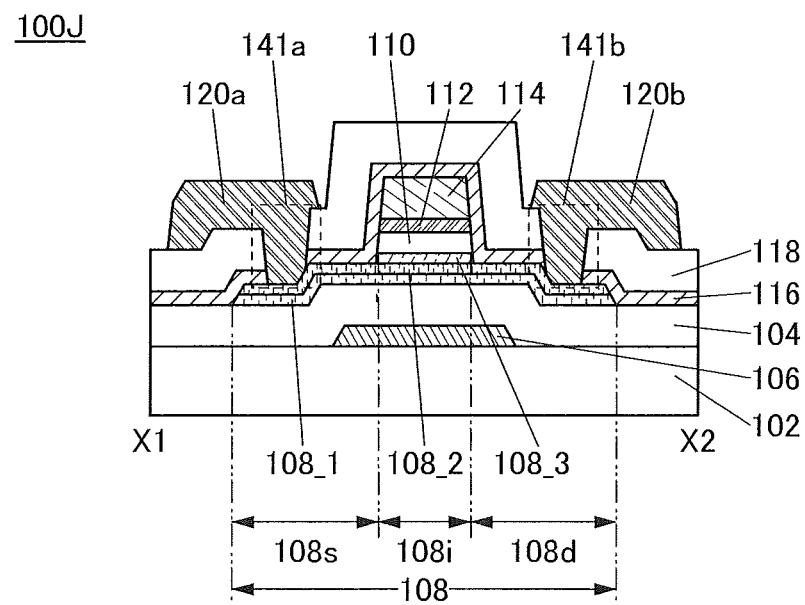
FIGS. 12A and 12B are cross-sectional views illustrating a semiconductor device.
Figure 12B:
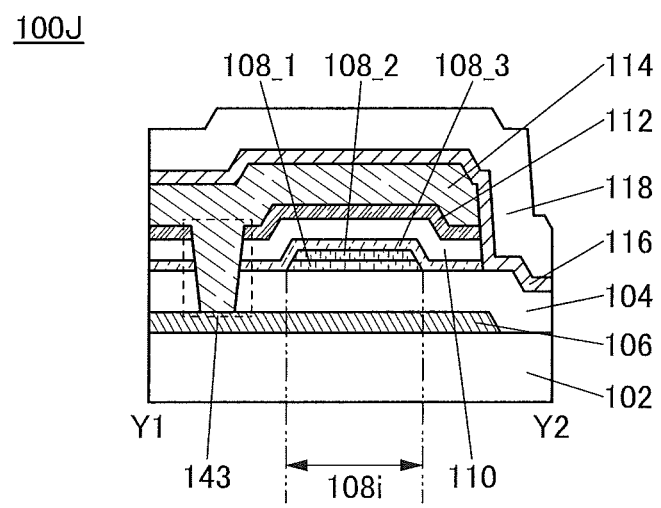
Figure 13A:
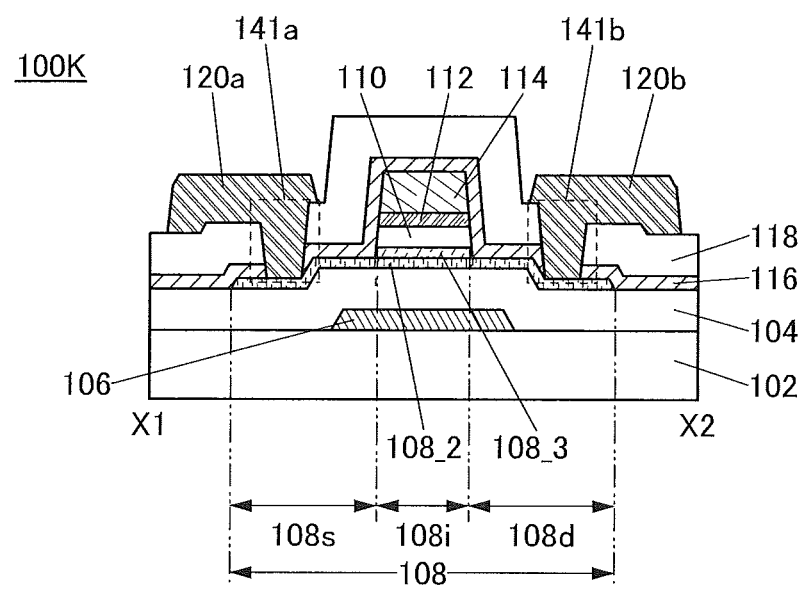
FIGS. 13A and 13B are cross-sectional views illustrating a semiconductor device.
Figure 13B:
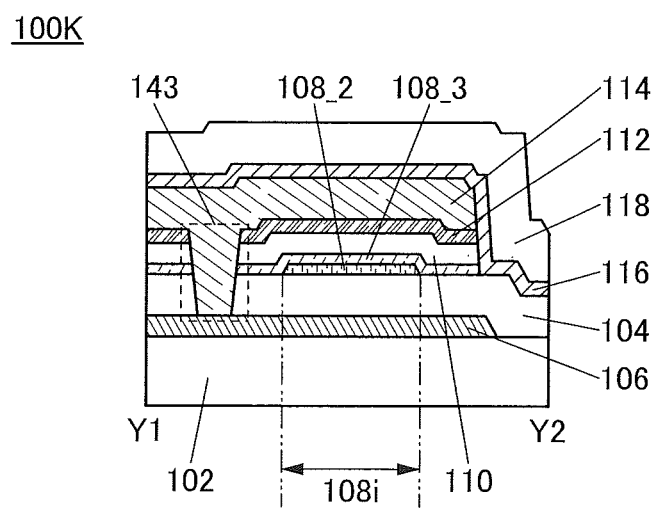

FIGS. 10A and 10B are cross-sectional views of a transistor 100G, FIGS. 11A and 11B are cross-sectional views of a transistor 100H, FIGS. 12A and 12B are cross-sectional views of a transistor 100J, and FIGS. 13A and 13B are cross-sectional views of a transistor 100K. Note that top views of the transistor 100G, the transistor 100H, the transistor 100J, and the transistor 100K are similar to that of the transistor 100A illustrated in FIG. 2A and thus are not described here.

The transistors 100G, 100H, 100J, and 100K are different from the above-described transistor 100A in the structure of the oxide semiconductor film 108. The other components of the transistors 100G, 100H, 100J, and 100K are similar to those of the transistor 100A described above and have similar effects.

The oxide semiconductor film 108 of the transistor 100G illustrated in FIGS. 10A and 10B includes an oxide semiconductor film 108_1 over the insulating film 104, an oxide semiconductor film 108_2 over the oxide semiconductor film 108_1, and an oxide semiconductor film 108_3 over the oxide semiconductor film 108_2. The channel region 108i, the source region 108s, and the drain region 108d each have a three-layer structure of the oxide semiconductor film 108_1, the oxide semiconductor film 108_2, and the oxide semiconductor film 108_3.

The oxide semiconductor film 108 of the transistor 100H illustrated in FIGS. 11A and 11B includes the oxide semiconductor film 108_2 over the insulating film 104, and the oxide semiconductor film 108_3 over the oxide semiconductor film 108_2. The channel region 108i, the source region 108s, and the drain region 108d each have a two-layer structure of the oxide semiconductor film 108_2 and the oxide semiconductor film 108_3.

The oxide semiconductor film 108 of the transistor 100J illustrated in FIGS. 12A and 12B includes the oxide semiconductor film 108_1 over the insulating film 104, the oxide semiconductor film 108_2 over the oxide semiconductor film 108_1, and the oxide semiconductor film 108_3 over the oxide semiconductor film 108_2. The channel region 108i has a three-layer structure of the oxide semiconductor film 108_1, the oxide semiconductor film 108_2, and the oxide semiconductor film 108_3. The source region 108s and the drain region 108d each have a two-layer structure of the oxide semiconductor film 108_1 and the oxide semiconductor film 108_2. Note that in the cross section of the transistor 100J in the channel width (W) direction, the oxide semiconductor film 108_3 covers side surfaces of the oxide semiconductor film 108_1 and the oxide semiconductor film 108_2.

The oxide semiconductor film 108 of the transistor 100K illustrated in FIGS. 13A and 13B includes the oxide semiconductor film 108_2 over the insulating film 104, and the oxide semiconductor film 108_3 over the oxide semiconductor film 108_2. The channel region 108i has a two-layer structure of the oxide semiconductor film 108_2 and the oxide semiconductor film 108_3. The source region 108s and the drain region 108d each have a single-layer structure of the oxide semiconductor film 108_2. Note that in the cross section of the transistor 100K in the channel width (W) direction, the oxide semiconductor film 108_3 covers side surfaces of the oxide semiconductor film 108_2.

A side surface of the channel region 108i in the channel width (W) direction or a region in the vicinity of the side surface is easily damaged by processing, resulting in a defect (e.g., oxygen vacancy), or easily contaminated by an impurity attached thereto. Therefore, even when the channel region 108i is substantially intrinsic, stress such as an electric field applied thereto activates the side surface of the channel region 108i in the channel width (W) direction or the region in the vicinity of the side surface and turns it into a low-resistance (n-type) region easily. Moreover, if the side surface of the channel region 108i in the channel width (W) direction or the region in the vicinity of the side surface is an n-type region, a parasitic channel may be formed because the n-type region serves as a carrier path.

Thus, in the transistor 100J and the transistor 100K, the channel region 108i has a stacked-layer structure and side surfaces of the channel region 108i in the channel width (W) direction are covered with one layer of the stacked layers. With such a structure, defects on or in the vicinity of the side surfaces of the channel region 108i can be suppressed or adhesion of an impurity to the side surfaces of the channel region 108i or to regions in the vicinity of the side surfaces can be reduced.

<1-5. Band Structure>

Here, a band structure of the insulating film 104, the oxide semiconductor films 108_1, 108_2, and 108_3, and the insulating film 110 and a band structure of the insulating film 104, the oxide semiconductor films 108_2 and 108_3, and the insulating film 110 will be described with reference to FIGS. 14A and 14B. Note that FIGS. 14A and 14B are each a band structure of the channel region 108i.

Figure 14A:
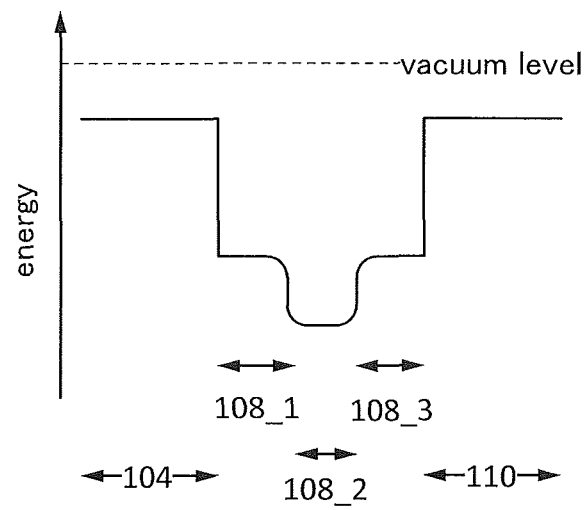
FIGS. 14A and 14B illustrate band structures.

FIG. 14A shows an example of a band structure in the thickness direction of a stack including the insulating film 104, the oxide semiconductor films 108_1, 108_2, and 108_3, and the insulating film 110. FIG. 14B shows an example of a band structure in the thickness direction of a stack including the insulating film 104, the oxide semiconductor films 108_2 and 108_3, and the insulating film 110. For easy understanding, the band structures show the conduction band minimum ($E_c$) of the insulating film 104, the oxide semiconductor films 108_1, 108_2, and 108_3, and the insulating film 110.

In the band structure of FIG. 14A, a silicon oxide film is used as each of the insulating films 104 and 110, an oxide semiconductor film formed using a metal oxide target whose atomic ratio of In to Ga and Zn is 1:3:2 is used as the oxide semiconductor film 108_1, an oxide semiconductor film formed using a metal oxide target whose atomic ratio of In to Ga and Zn is 4:2:4.1 is used as the oxide semiconductor film 108_2, and an oxide semiconductor film formed using a metal oxide target whose atomic ratio of In to Ga and Zn is 1:3:2 is used as the oxide semiconductor film 108_3.

Figure 14B:
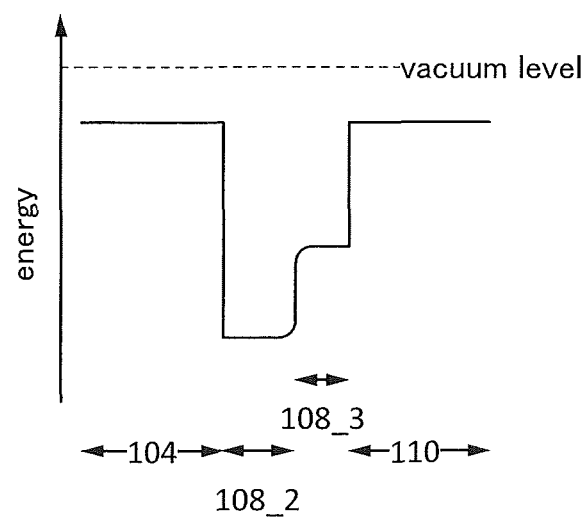

In the band structure of FIG. 14B, a silicon oxide film is used as each of the insulating films 104 and 110, an oxide semiconductor film formed using a metal oxide target whose atomic ratio of In to Ga and Zn is 4:2:4.1 is used as the oxide semiconductor film 108_2, and an oxide semiconductor film formed using a metal oxide target whose atomic ratio of In to Ga and Zn is 1:3:2 is used as the oxide semiconductor film 108_3.

As illustrated in FIG. 14A, the conduction band minimum gradually varies between the oxide semiconductor films 108_1, 108_2, and 108_3. As illustrated in FIG. 14B, the conduction band minimum gradually varies between the oxide semiconductor films 108_2 and 108_3. In other words, the conduction band minimum is continuously changed or continuously connected. To obtain such a band structure, there exists no impurity, which forms a defect state such as a trap center or a recombination center, at the interface between the oxide semiconductor films 108_1 and 108_2 or the interface between the oxide semiconductor films 108_2 and 108_3.

To form a continuous junction between the oxide semiconductor films 108_1, 108_2, and 108_3, it is necessary to form the films successively without exposure to the air by using a multi-chamber deposition apparatus (sputtering apparatus) provided with a load lock chamber.

With the band structure of FIG. 14A or FIG. 14B, the oxide semiconductor film 108_2 serves as a well, and a channel region is formed in the oxide semiconductor film 108_2 in the transistor with the stacked-layer structure.

By providing the oxide semiconductor films 108_1 and 108_3, the oxide semiconductor film 108_2 can be distanced away from trap states.

In addition, the trap states might be more distant from the vacuum level than the conduction band minimum ($E_c$) of the oxide semiconductor film 108_2 functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the conduction band minimum ($E_c$) of the oxide semiconductor film 108_2. Such a structure inhibits accumulation of electrons in the trap states. As a result, the on-state current and the field-effect mobility of the transistor can be increased.

The conduction band minimum of each of the oxide semiconductor films 108_1 and 108_3 is closer to the vacuum level than that of the oxide semiconductor film 108_2. A typical difference between the conduction band minimum of the oxide semiconductor film 108_2 and the conduction band minimum of each of the oxide semiconductor films 108_1 and 108_3 is 0.15 eV or more or 0.5 eV or more and 2 eV or less or 1 eV or less. That is, the difference between the electron affinity of each of the oxide semiconductor films 108_1 and 108_3 and the electron affinity of the oxide semiconductor film 108_2 is 0.15 eV or more or 0.5 eV or more and 2 eV or less or 1 eV or less.

In such a structure, the oxide semiconductor film 108_2 serves as a main path of a current. In other words, the oxide semiconductor film 108_2 serves as a channel region, and the oxide semiconductor films 108_1 and 108_3 serve as oxide insulating films. It is preferable that the oxide semiconductor films 108_1 and 108_3 each include one or more metal elements constituting a part of the oxide semiconductor film 108_2 in which a channel region is formed. With such a structure, interface scattering hardly occurs at the interface between the oxide semiconductor film 108_1 and the oxide semiconductor film 108_2 or at the interface between the oxide semiconductor film 108_2 and the oxide semiconductor film 108_3. Thus, the transistor can have high field-effect mobility because the movement of carriers is not hindered at the interface.

To prevent each of the oxide semiconductor films 108_1 and 108_3 from functioning as part of a channel region, a material having sufficiently low conductivity is used for the oxide semiconductor films 108_1 and 108_3. Thus, the oxide semiconductor films 108_1 and 108_3 can be referred to as oxide insulating films for such properties and/or functions. Alternatively, a material that has a smaller electron affinity (a difference between the vacuum level and the conduction band minimum) than the oxide semiconductor film 108_2 and has a difference in the conduction band minimum from the oxide semiconductor film 108_2 (band offset) is used for the oxide semiconductor films 108_1 and 108_3. Furthermore, to inhibit generation of a difference in threshold voltage due to the value of the drain voltage, it is preferable to form the oxide semiconductor films 108_1 and 108_3 using a material whose conduction band minimum is closer to the vacuum level than that of the oxide semiconductor film 108_2. For example, a difference between the conduction band minimum of the oxide semiconductor film 108_2 and the conduction band minimum of each of the oxide semiconductor films 108_1 and 108_3 is preferably greater than or equal to 0.2 eV, more preferably greater than or equal to 0.5 eV.

It is preferable that the oxide semiconductor films 108_1 and 108_3 not have a spinel crystal structure. This is because if the oxide semiconductor films 108_1 and 108_3 have a spinel crystal structure, constituent elements of the conductive films 120a and 120b might be diffused into the oxide semiconductor film 108_2 at the interface between the spinel crystal structure and another region. Note that each of the oxide semiconductor films 108_1 and 108_3 is preferably a CAAC-OS film, in which case a higher blocking property against constituent elements of the conductive films 120a and 120b, for example, copper elements, can be obtained.

Although the example where an oxide semiconductor film formed using a metal oxide target whose atomic ratio of In to Ga and Zn is 1:3:2, is used as each of the oxide semiconductor films 108_1 and 108_3 is described in this embodiment, one embodiment of the present invention is not limited thereto. For example, an oxide semiconductor film formed using a metal oxide target whose atomic ratio of In to Ga and Zn is 1:1:1, 1:1:1.2, 1:3:4, 1:3:6, or 1:10:1 may be used as each of the oxide semiconductor films 108_1 and 108_3. Alternatively, oxide semiconductor films formed using a metal oxide target whose atomic ratio of Ga to Zn is 10:1 may be used as the oxide semiconductor films 108_1 and 108_3. In that case, it is suitable that an oxide semiconductor film formed using a metal oxide target whose atomic ratio of In to Ga and Zn is 1:1:1 is used as the oxide semiconductor film 108_2 because the difference between the conduction band minimum of the oxide semiconductor film 108_2 and the conduction band minimum of the oxide semiconductor film 108_1 or 108_3 can be 0.6 eV or more.

When the oxide semiconductor films 108_1 and 108_3 are formed using a metal oxide target whose atomic ratio of In to Ga and Zn is 1:1:1, the atomic ratio of In to Ga and Zn in the oxide semiconductor films 108_1 and 108_3 might be $1:\beta1:\beta2$ ($0<\beta1\leq2$, $0<\beta2\leq2$). When the oxide semiconductor films 108_1 and 108_3 are formed using a metal oxide target whose atomic ratio of In to Ga and Zn is 1:3:4, the atomic ratio of In to Ga and Zn in the oxide semiconductor films 108_1 and 108_3 might be $1:\beta3:\beta4$ ($1\leq\beta3<5$, $2\leq\beta4\leq6$). When the oxide semiconductor films 108_1 and 108_3 are formed using a metal oxide target whose atomic ratio of In to Ga and Zn is 1:3:6, the atomic ratio of In to Ga and Zn in the oxide semiconductor films 108_1 and 108_3 might be $1:\beta5:\beta6$ ($1\leq\beta5\leq5$, $4\leq\beta6\leq8$).

<1-6. Method 1 for Manufacturing Semiconductor Device>

Next, an example of a method for manufacturing the transistor 100 in FIGS. 1A to 1C will be described with reference to FIGS. 15A to 15D, FIGS. 16A to 16D, and FIGS. 17A to 17C. Note that FIGS. 15A to 15D, FIGS. 16A to 16D, and FIGS. 17A to 17C are cross-sectional views in the channel length (L) direction and the channel width (W) direction and illustrate a method for manufacturing the transistor 100.

First, the insulating film 104 is formed over the substrate 102. Subsequently, an oxide semiconductor film is formed over the insulating film 104. Then, the oxide semiconductor film is processed into an island shape, whereby an oxide semiconductor film 107 is formed (see FIG. 15A).

The insulating film 104 can be formed by a sputtering method, a CVD method, an evaporation method, a pulsed laser deposition (PLD) method, a printing method, a coating method, or the like as appropriate. In this embodiment, as the insulating film 104, a 400-nm-thick silicon nitride film and a 50-nm-thick silicon oxynitride film are formed with a PECVD apparatus.

After the insulating film 104 is formed, oxygen may be added to the insulating film 104. As oxygen added to the insulating film 104, an oxygen radical, an oxygen atom, an oxygen atomic ion, an oxygen molecular ion, or the like may be used. Oxygen can be added by an ion doping method, an ion implantation method, a plasma treatment method, or the like. Alternatively, a film that suppresses oxygen release may be formed over the insulating film 104, and then, oxygen may be added to the insulating film 104 through the film.

The film that suppresses oxygen release can be formed using a conductive film or a semiconductor film containing one or more of indium, zinc, gallium, tin, aluminum, chromium, tantalum, titanium, molybdenum, nickel, iron, cobalt, and tungsten.

In the case where oxygen is added by plasma treatment in which oxygen is excited by a microwave to generate high-density oxygen plasma, the amount of oxygen added to the insulating film 104 can be increased.

The oxide semiconductor film 107 can be formed by a sputtering method, a coating method, a pulsed laser deposition method, a laser ablation method, a thermal CVD method, or the like. Note that the oxide semiconductor film can be processed into the oxide semiconductor film 107 in the following manner: a mask is formed over the oxide semiconductor film by a lithography process, and then, the oxide semiconductor film is partly etched using the mask. Alternatively, the isolated oxide semiconductor film 107 may be directly formed by a printing method.

As a power supply device for generating plasma when the oxide semiconductor film is formed by a sputtering method, an RF power supply device, an AC power supply device, a DC power supply device, or the like can be used as appropriate. As a sputtering gas for forming the oxide semiconductor film, a rare gas (typically argon), oxygen, or a mixed gas of a rare gas and oxygen is used as appropriate. In the mixed gas of a rare gas and oxygen, the proportion of oxygen to the rare gas is preferably increased.

To increase the crystallinity of the oxide semiconductor film formed by a sputtering method, for example, the oxide semiconductor film is preferably deposited at a substrate temperature higher than or equal to 150° C. and lower than or equal to 750° C., higher than or equal to 150° C. and lower than or equal to 450° C., or higher than or equal to 200° C. and lower than or equal to 350° C.

In this embodiment, as the oxide semiconductor film 107, a 35-nm-thick oxide semiconductor film is deposited with a sputtering apparatus using an In—Ga—Zn metal oxide (In:Ga:Zn=4:2:4.1 [atomic ratio]) as a sputtering target.

After the oxide semiconductor film 107 is formed, the oxide semiconductor film 107 may be dehydrated or dehydrogenated by heat treatment. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert gas atmosphere containing nitrogen or a rare gas such as helium, neon, argon, xenon, or krypton. Alternatively, the heat treatment may be performed in an inert gas atmosphere first, and then, in an oxygen atmosphere. It is preferable that the above inert gas atmosphere and the above oxygen atmosphere do not contain hydrogen, water, and the like. The treatment time may be longer than or equal to 3 minutes and shorter than or equal to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By depositing the oxide semiconductor film while it is heated or by performing heat treatment after the formation of the oxide semiconductor film, the hydrogen concentration in the oxide semiconductor film, which is measured by SIMS, can be $5\times10^{19}$ atoms/cm$^3$ or lower, $1\times10^{19}$ atoms/cm$^3$ or lower, $5\times10^{18}$ atoms/cm$^3$ or lower, $1\times10^{18}$ atoms/cm$^3$ or lower, $5\times10^{17}$ atoms/cm$^3$ or lower, or $1\times10^{16}$ atoms/cm$^3$ or lower.

Figure 15A:
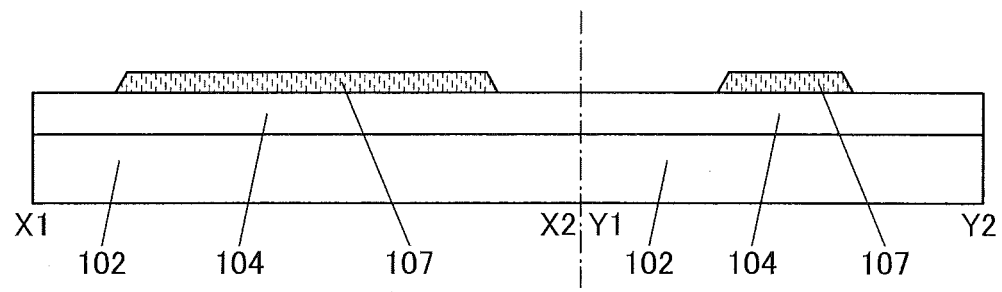
FIGS. 15A to 15D are cross-sectional views illustrating a method for manufacturing a semiconductor device.
Figure 15B:
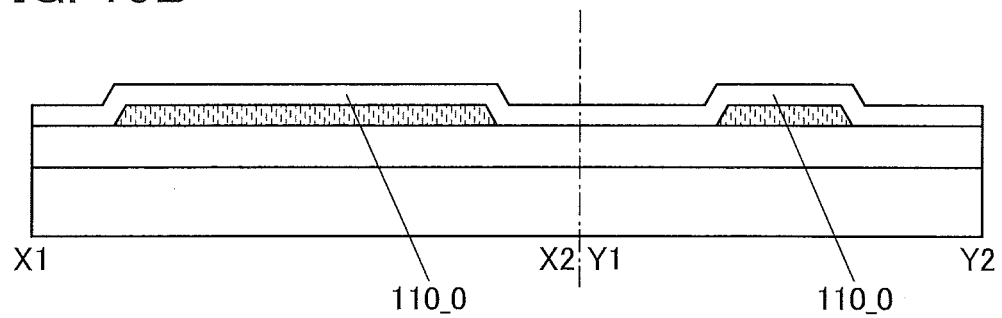

Next, an insulating film 110_0 is formed over the insulating film 104 and the oxide semiconductor film 107 (see FIG. 15B).

As the insulating film 110_0, a silicon oxide film or a silicon oxynitride film can be formed by a PECVD method. In this case, a deposition gas containing silicon and an oxidizing gas are preferably used as a source gas. Typical examples of the deposition gas containing silicon include silane, disilane, trisilane, and silane fluoride. As examples of the oxidizing gas, oxygen, ozone, dinitrogen monoxide, and nitrogen dioxide can be given.

A silicon oxynitride film having few defects can be formed as the insulating film 110_0 by a PECVD method under the conditions that the flow rate of the oxidizing gas is more than 20 times and less than 100 times, or more than or equal to 40 times and less than or equal to 80 times the flow rate of the deposition gas and that the pressure in a treatment chamber is lower than 100 Pa or lower than or equal to 50 Pa.

As the insulating film 110_0, a dense silicon oxide film or a dense silicon oxynitride film can be formed under the following conditions: the substrate placed in a vacuum-evacuated treatment chamber of a PECVD apparatus is held at a temperature higher than or equal to 280° C. and lower than or equal to 400° C., the pressure in the treatment chamber into which a source gas is introduced is set to be higher than or equal to 20 Pa and lower than or equal to 250 Pa, preferably higher than or equal to 100 Pa and lower than or equal to 250 Pa, and a high-frequency power is supplied to an electrode provided in the treatment chamber.

The insulating film 110_0 may be formed by a plasma CVD method using a microwave. A microwave refers to a wave in the frequency range of 300 MHz to 300 GHz. In a microwave, electron temperature and electron energy are low. Furthermore, in supplied power, the proportion of power used for acceleration of electrons is low, and therefore, much more power can be used for dissociation and ionization of molecules. Thus, plasma with a high density (high-density plasma) can be excited. This method causes little plasma damage to the deposition surface or a deposit, so that the insulating film 110_0 having few defects can be formed.

Alternatively, the insulating film 110_0 can also be formed by a CVD method using an organosilane gas. As the organosilane gas, the following silicon-containing compound can be used: tetraethyl orthosilicate (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), or the like. By a CVD method using an organosilane gas, the insulating film 110_0 having high coverage can be formed.

In this embodiment, as the insulating film 110_0, a 100-nm-thick silicon oxynitride film is formed with a PECVD apparatus.

Next, a metal oxide film 112_0 is formed over the insulating film 110_0. In the formation of the metal oxide film 112_0, oxygen is added from the metal oxide film 112_0 to the insulating film 110_0 (see FIG. 15C).

The metal oxide film 112_0 is preferably formed by a sputtering method in an atmosphere containing an oxygen gas. Formation of the metal oxide film 112_0 in an atmosphere containing an oxygen gas allows suitable addition of oxygen to the insulating film 110_0. Note that a method for forming the metal oxide film 112_0 is not limited to a sputtering method, and other methods such as an ALD method may be used.

Figure 15C:
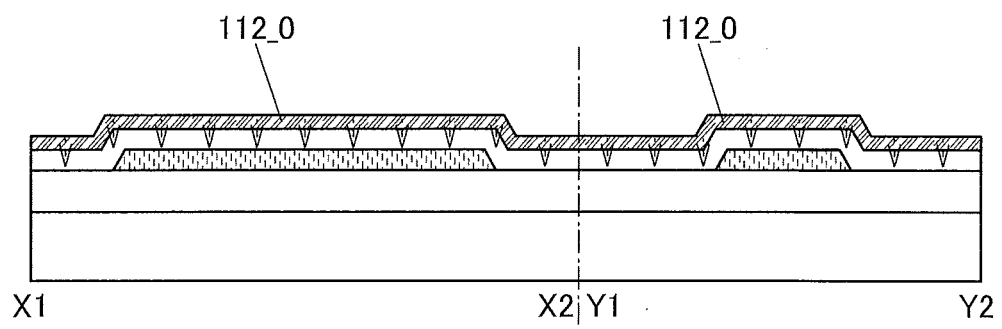
Figure 15D:
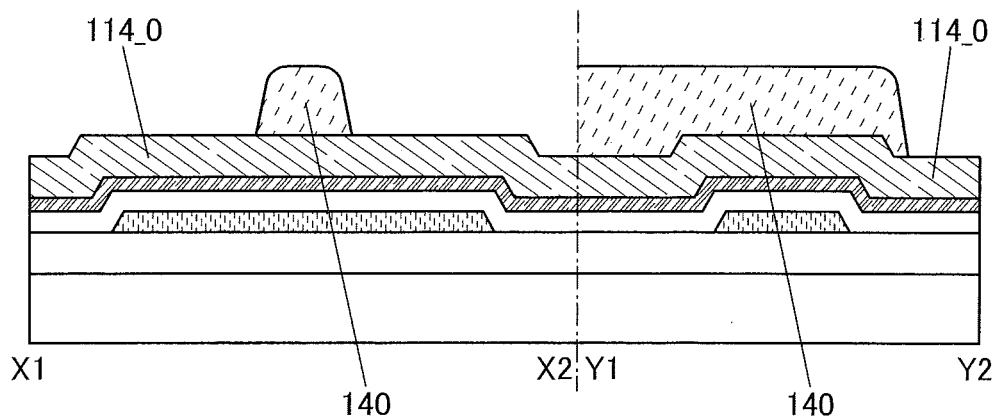

In FIG. 15C, oxygen added to the insulating film 110_0 is schematically shown by arrows.

In this embodiment, a 10-nm-thick aluminum oxide film is formed as the metal oxide film 112_0 by a sputtering method. Oxygen addition treatment may be performed after the metal oxide film 112_0 is formed. The oxygen addition treatment can be performed similarly to the oxygen addition that can be performed after the formation of the insulating film 104.

Next, a conductive film 114_0 is formed over the metal oxide film 112_0. Subsequently, a mask 140 is formed by a lithography process in a desired position over the conductive film 114_0 (see FIG. 15D).

In this embodiment, a 100-nm-thick tungsten film is formed as the conductive film 114_0 by a sputtering method.

Next, etching is performed from above the mask 140 to process the conductive film 114_0, the metal oxide film 112_0, and the insulating film 110_0. Then, the mask 140 is removed, so that the island-shaped conductive film 114, the island-shaped metal oxide film 112, and the island-shaped insulating film 110 are formed (see FIG. 16A).

In this embodiment, the conductive film 114_0, the metal oxide film 112_0, and the insulating film 110_0 are processed by a dry etching method.

In the processing of the conductive film 114_0, the metal oxide film 112_0 and the insulating film 110_0, the thickness of the oxide semiconductor film 107 in a region not overlapping with the conductive film 114 is decreased in some cases. In other cases, in the processing of the conductive film 114_0, the metal oxide film 112_0, and the insulating film 110_0, the thickness of the insulating film 104 in a region not overlapping with the oxide semiconductor film 107 is decreased. In the processing of the conductive film 114_0, the metal oxide film 112_0, and the insulating film 110_0, an etchant or an etching gas (e.g., chlorine) might be added to the oxide semiconductor film 107 or the constituent element of the conductive film 114_0, the metal oxide film 112_0, or the insulating film 110_0 might be added to the oxide semiconductor film 107.

Figure 16A:
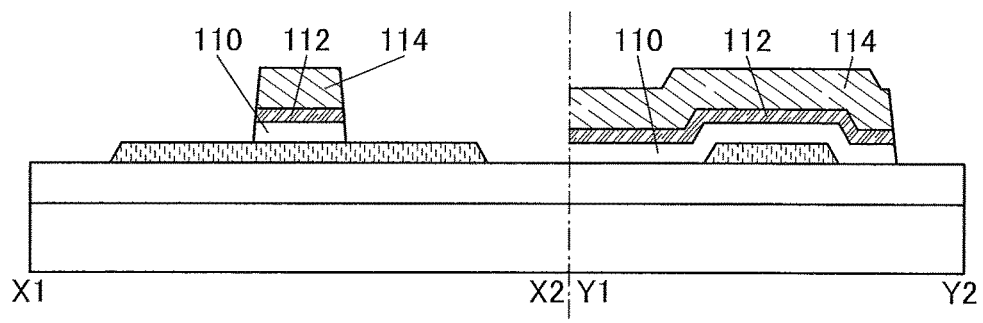
FIGS. 16A to 16D are cross-sectional views illustrating a method for manufacturing a semiconductor device.
Figure 16B:
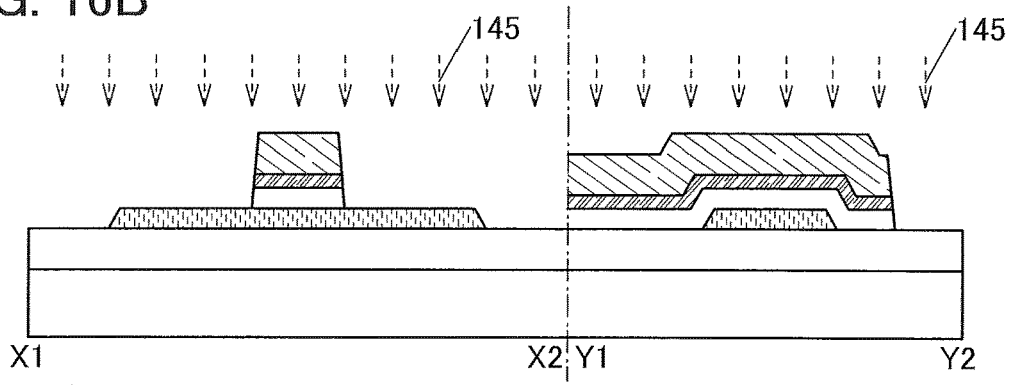
Figure 16C:
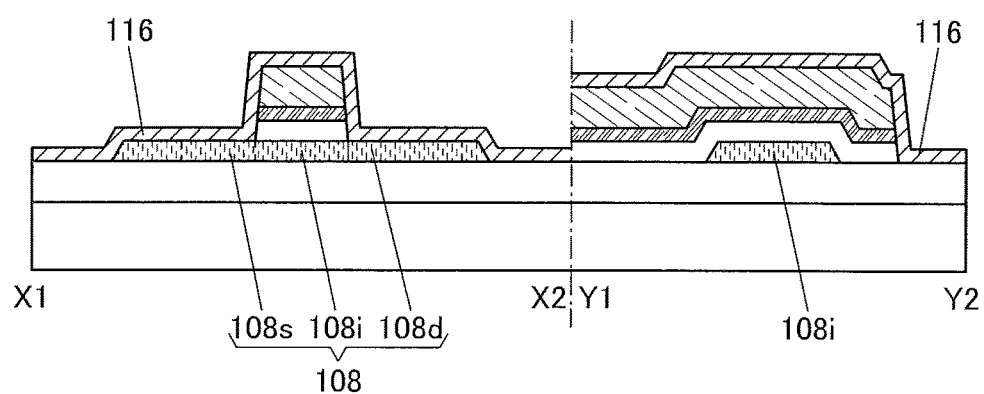

Next, an impurity element 145 is added from above the insulating film 104, the oxide semiconductor film 107, and the conductive film 114 (see FIG. 16B).

The impurity element 145 can be added by an ion doping method, an ion implantation method, a plasma treatment method, or the like. In a plasma treatment method, an impurity element can be added using plasma generated in a gas atmosphere containing the impurity element. A dry etching apparatus, an ashing apparatus, a plasma CVD apparatus, a high-density plasma CVD apparatus, or the like can be used to generate plasma.

As a source gas of the impurity element 145, at least one of $B_2H_6$, $PH_3$, $CH_4$, $N_2$, $NH_3$, $AlH_3$, $AlCl_3$, $SiH_4$, $Si_2H_6$, $F_2$, HF, $H_2$, and a rare gas can be used. Alternatively, at least one of $B_2H_6$, $PH_3$, $N_2$, $NH_3$, $AlH_3$, $AlCl_3$, $F_2$, HF, and $H_2$ which are diluted with a rare gas can be used. At least one of $B_2H_6$, $PH_3$, $N_2$, $NH_3$, $AlH_3$, $AlCl_3$, $F_2$, HF, and $H_2$ which are diluted with a rare gas is used to add the impurity element 145 to the oxide semiconductor film 107, whereby at least one of a rare gas, hydrogen, boron, carbon, nitrogen, fluorine, phosphorus, sulfur, and chlorine can be added to the oxide semiconductor film 107.

Alternatively, after a rare gas is added to the oxide semiconductor film 107, at least one of $B_2H_6$, $PH_3$, $CH_4$, $N_2$, $NH_3$, $AlH_3$, $AlCl_3$, $SiH_4$, $Si_2H_6$, $F_2$, HF, and $H_2$ may be added thereto. Further alternatively, after at least one of $B_2H_6$, $PH_3$, $CH_4$, $N_2$, $NH_3$, $AlH_3$, $AlCl_3$, $SiH_4$, $Si_2H_6$, $F_2$, HF, and $H_2$ is added to the oxide semiconductor film 107, a rare gas may be added thereto.

The addition of the impurity element 145 may be controlled by appropriately setting the implantation conditions such as the accelerating voltage and the dose. For example, in the case where argon is added by an ion implantation method, the accelerating voltage may be higher than or equal to 10 kV and lower than or equal to 100 kV and the dose may be greater than or equal to $1\times10^{13}$ ions/cm$^2$ and less than or equal to $1\times10^{16}$ ions/cm$^2$, for example, $1\times10^{14}$ ions/cm$^2$. In the case where phosphorus ions are added by an ion implantation method, the accelerating voltage may be 30 kV and the dose may be greater than or equal to $1\times10^{13}$ ions/cm$^2$ and less than or equal to $5\times10^{16}$ ions/cm$^2$, for example, $1\times10^{15}$ ions/cm$^2$.

One embodiment of the present invention is not limited to the example described in this embodiment, in which the impurity element 145 is added after the mask 140 is removed; for example, the impurity element 145 may be added with the mask 140 left.

In this embodiment, argon is added to the oxide semiconductor film 107 as the impurity element 145 with a doping apparatus. Note that one embodiment of the present invention is not limited thereto, and for example, the step of adding the impurity element 145 is not necessarily performed. In this case, the manufacturing process can be simplified because the step of adding the impurity element 145 is not performed.

Next, the insulating film 116 is formed over the insulating film 104, the oxide semiconductor film 107, and the conductive film 114. Note that the oxide semiconductor film 107 is in contact with the insulating film 116 by formation of the insulating film 116 and serves as the source region 108s and the drain region 108d. The oxide semiconductor film 107 which is not in contact with the insulating film 116, i.e., the oxide semiconductor film 107 in contact with the insulating film 110 serves as the channel region 108i. Accordingly, the oxide semiconductor film 108 including the channel region 108i, the source region 108s, and the drain region 108d is formed (see FIG. 16C).

The insulating film 116 in this embodiment can be formed using the material that can be used for the insulating film 116. In this embodiment, a 100-nm-thick silicon nitride fluoride film is formed with a PECVD apparatus as the insulating film 116. Note that the silicon nitride fluoride film can be formed using $SiF_4$ and $N_2$ or using $SiF_4$, $N_2$, and $SiH_4$ as a source gas.

With the use of a silicon nitride fluoride film as the insulating film 116, one or more of nitrogen, hydrogen, and fluorine that are contained in the silicon nitride fluoride film can be supplied to the source and drain regions 108s and 108d in contact with the insulating film 116. In particular, the source region 108s and the drain region 108d are each preferably supplied with fluorine. As a result, the carrier densities of the source region 108s and the drain region 108d can be stably increased.

Figure 16D:
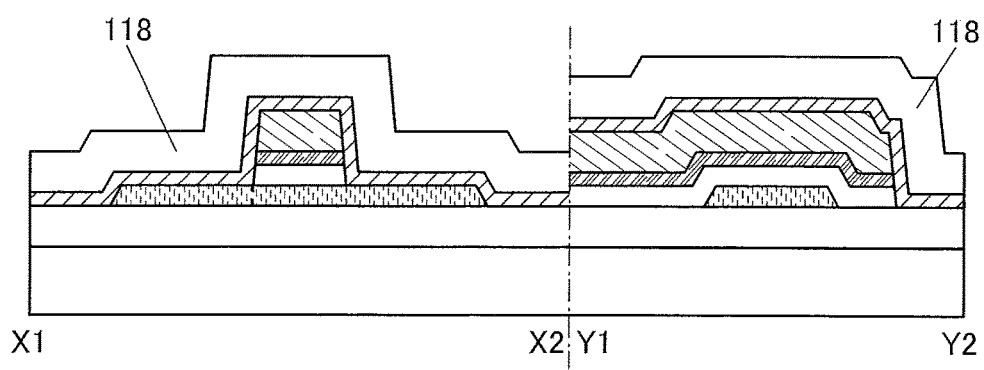

Next, the insulating film 118 is formed over the insulating film 116 (see FIG. 16D).

The insulating film 118 in this embodiment can be formed using the material that can be used for the insulating film 118. In this embodiment, as the insulating film 118, a 300-nm-thick silicon oxynitride film is formed with a PECVD apparatus.

Figure 17A:
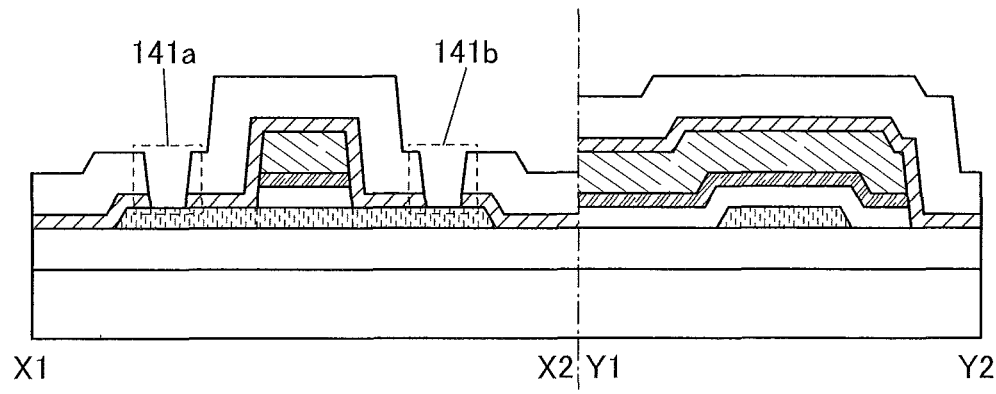
FIGS. 17A to 17C are cross-sectional views illustrating a method for manufacturing a semiconductor device.

Subsequently, a mask is formed by lithography in a desired position over the insulating film 118, and then, the insulating film 118 and the insulating film 116 are partly etched, so that the opening 141a reaching the source region 108s and the opening 141b reaching the drain region 108d are formed (see FIG. 17A).

To etch the insulating film 118 and the insulating film 116, a wet etching method and/or a dry etching method can be used. In this embodiment, the insulating film 118 and the insulating film 116 are processed by a dry etching method.

Figure 17B:
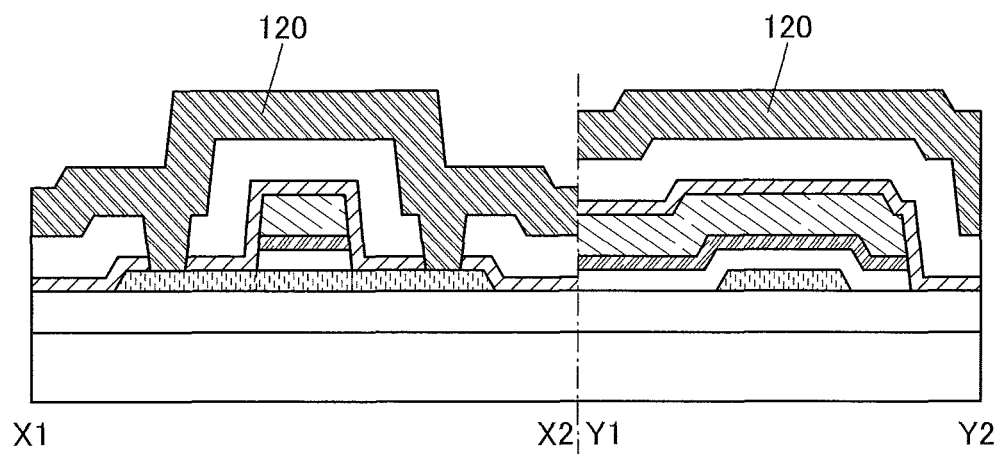

Next, a conductive film 120 is formed over the insulating film 118 to cover the openings 141a and 141b (see FIG. 17B).

The conductive film 120 can be formed using a material that can be used for the conductive films 120a and 120b. In this embodiment, as the conductive film 120, a stack including a 50-nm-thick tungsten film and a 400-nm-thick copper film is formed with a sputtering apparatus.

Figure 17C:
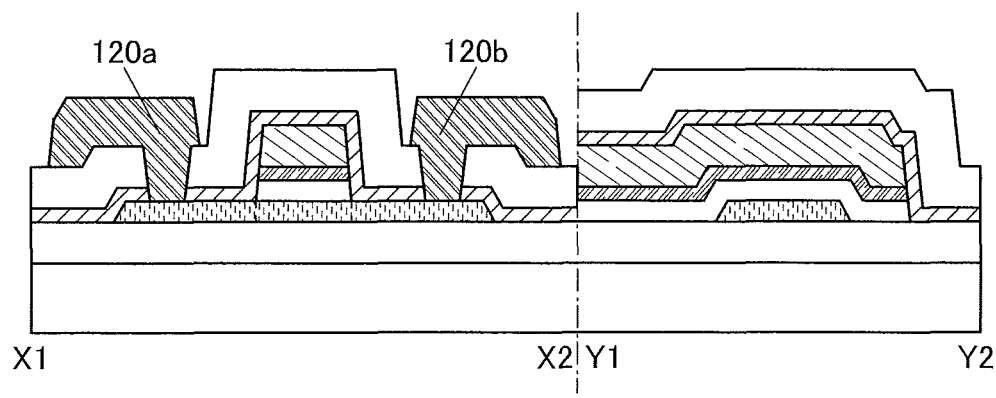

Subsequently, a mask is formed by a lithography process in a desired position over the conductive film 120, and then, the conductive film 120 is partly etched, so that the conductive films 120a and 120b are formed (see FIG. 17C).

To process the conductive film 120, a wet etching method and/or a dry etching method can be used. In this embodiment, in the processing of the conductive film 120 into the conductive films 120a and 120b, the copper film is etched by a wet etching method and then the tungsten film is etched by a dry etching method.

Through the above steps, the transistor 100 in FIGS. 1A to 1C can be manufactured.

Note that the films constituting a part of the transistor 100 (the insulating film, the metal oxide film, the oxide semiconductor film, the conductive film, and the like) can be formed by, other than the above methods, a sputtering method, a chemical vapor deposition (CVD) method, a vacuum evaporation method, a pulsed laser deposition (PLD) method, or an ALD method. Alternatively, a coating method or a printing method can be used. Although a sputtering method and a plasma-enhanced chemical vapor deposition (PECVD) method are typical deposition methods, a thermal CVD method may also be used. As an example of a thermal CVD method, a metal organic chemical vapor deposition (MOCVD) method can be given.

Deposition by a thermal CVD method is performed in the following manner: a source gas and an oxidizer are supplied at a time to a chamber in which the pressure is set to an atmospheric pressure or a reduced pressure, and the source gas and the oxidizer react with each other in the vicinity of the substrate or over the substrate. As seen above, no plasma is generated during deposition by a thermal CVD method, which has an advantage in that no defect due to plasma damage is formed.

Films such as the conductive film, the insulating film, the oxide semiconductor film, and the metal oxide film can be formed by a thermal CVD method such as an MOCVD method. For example, in the case where an In—Ga—Zn—O film is deposited, trimethylindium (In(CH$_3$)$_3$), trimethylgallium (Ga(CH$_3$)$_3$), and dimethylzinc (Zn(CH$_3$)$_2$) are used. Without being limited to the above combination, triethylgallium (Ga(C$_2$H$_5$)$_3$) can be used instead of trimethylgallium, and diethylzinc (Zn(C$_2$H$_5$)$_2$) can be used instead of dimethylzinc.

For example, in the case where a hafnium oxide film is formed with a deposition apparatus employing an ALD method, two kinds of gases are used, namely, ozone ($O_3$) as an oxidizer and a source gas which is obtained by vaporizing liquid containing a solvent and a hafnium precursor (hafnium alkoxide or hafnium amide such as tetrakis(dimethylamide)hafnium (TDMAH, $Hf[N(CH_3)_2]_4$) or tetrakis(ethylmethylamide)hafnium).

For example, in the case where an aluminum oxide film is formed with a deposition apparatus employing an ALD method, two kinds of gases are used, namely, $H_2O$ as an oxidizer and a source gas which is obtained by vaporizing liquid containing a solvent and an aluminum precursor (e.g., trimethylaluminum (TMA, $Al(CH_3)_3$)). Examples of another material include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing an ALD method, hexachlorodisilane is adsorbed on a surface on which a film is to be deposited, and radicals of an oxidizing gas ($O_2$ or dinitrogen monoxide) are supplied to react with the adsorbate.

For example, in the case where a tungsten film is formed with a deposition apparatus employing an ALD method, a $WF_6$ gas and a $B_2H_6$ gas are sequentially introduced to form an initial tungsten film, and then, a $WF_6$ gas and an $H_2$ gas are used to form a tungsten film. Note that an $SiH_4$ gas may be used instead of a $B_2H_6$ gas.

For example, in the case where an oxide semiconductor film such as an In—Ga—Zn—O film is formed with a deposition apparatus employing an ALD method, an $In(CH_3)_3$ gas and an $O_3$ gas are used to form an In—O layer, a $Ga(CH_3)_3$ gas and an $O_3$ gas are used to form a Ga—O layer, and then, a $Zn(CH_3)_2$ gas and an $O_3$ gas are used to form a Zn—O layer. Note that the order of these layers is not limited to this example. A mixed compound layer such as an In—Ga—O layer, an In—Zn—O layer, or a Ga—Zn—O layer may be formed using these gases. Although an $H_2O$ gas which is obtained by bubbling water with an inert gas such as Ar may be used instead of an $O_3$ gas, it is preferable to use an $O_3$ gas, which does not contain H.

<1-7. Method 2 for Manufacturing Semiconductor Device>

Next, an example of a method for manufacturing the transistor 100A in FIGS. 2A to 2C will be described with reference to FIGS. 18A to 18D, FIGS. 19A to 19D, and FIGS. 20A to 20D. Note that FIGS. 18A to 18D, FIGS. 19A to 19D, and FIGS. 20A to 20D are cross-sectional views in the channel length (L) direction and the channel width (W) direction and illustrate a method for manufacturing the transistor 100A.

First, the conductive film 106 is formed over the substrate 102. Then, the insulating film 104 is formed over the substrate 102 and the conductive film 106, and an oxide semiconductor film is formed over the insulating film 104. After that, the oxide semiconductor film is processed into an island shape, whereby the oxide semiconductor film 107 is formed (see FIG. 18A).

The conductive film 106 can be formed using a material and a method similar to those of the conductive films 112*a* and 112*b*. In this embodiment, as the conductive film 106, a 100-nm-thick tungsten film is formed by a sputtering method.

Next, the insulating film 110_0 is formed over the insulating film 104 and the oxide semiconductor film 107. Then, the metal oxide film 112_0 is formed over the insulator 110_0 (see FIG. 18B).

Figure 18A:
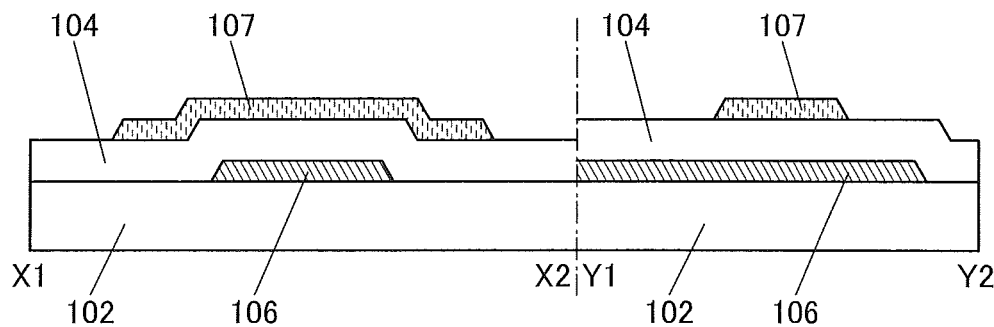
FIGS. 18A to 18D are cross-sectional views illustrating a method for manufacturing a semiconductor device.
Figure 18B:
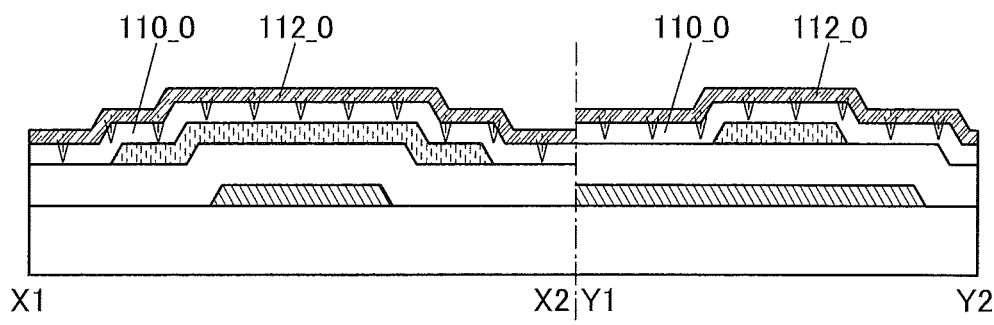

In the formation of the metal oxide film 112_0, oxygen is added to the insulating film 110_0. In FIG. 18B, the oxygen is schematically shown by arrows.

Figure 18C:
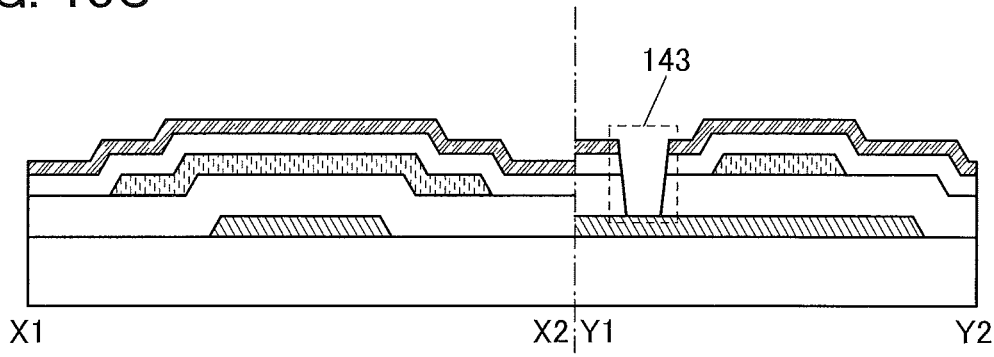

Subsequently, a mask is formed by lithography in a desired position over the metal oxide film 112_0, and then, the metal oxide film 112_0, the insulating film 110_0, and the insulating film 104 are partly etched, so that the opening 143 reaching the conductive film 106 is formed (see FIG. 18C).

To form the opening 143, a wet etching method and/or a dry etching method can be used. In this embodiment, the opening 143 is formed by a dry etching method.

Figure 18D:
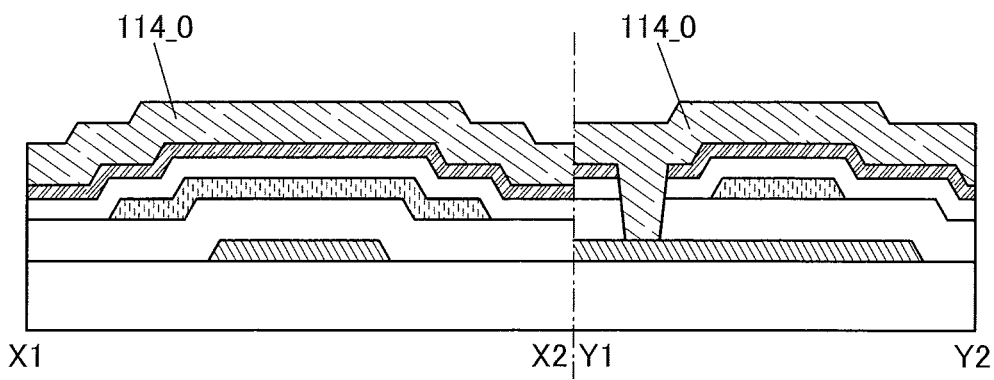

Next, the conductive film 114_0 is formed over the metal oxide film 112_0 so as to cover the opening 143 (see FIG. 18D).

Note that the conductive film 114_0 formed to cover the opening 143 is electrically connected to the conductive film 106.

Figure 19A:
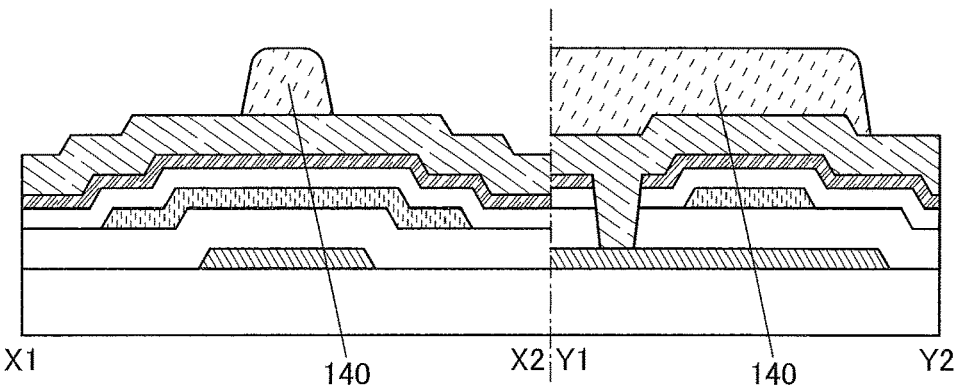
FIGS. 19A to 19D are cross-sectional views illustrating a method for manufacturing a semiconductor device.
Figure 19B:
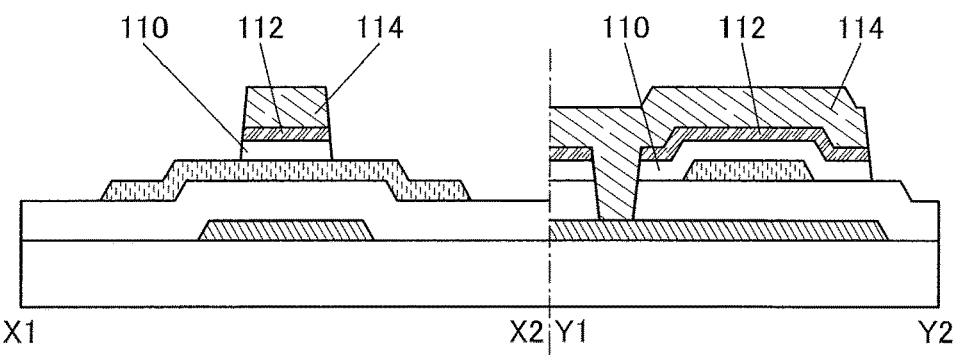

Subsequently, the mask 140 is formed by a lithography process in a desired position over the conductive film 114_0 (see FIG. 19A).

Next, etching is performed from above the mask 140 to process the conductive film 114_0, the metal oxide film 112_0, and the insulating film 110_0. As a result of the processing of the conductive film 114_0, the metal oxide film 112_0, and the insulating film 110_0, the island-shaped conductive film 114, the island-shaped metal oxide film 112, and the island-shaped insulating film 110 are formed (see FIG. 19B).

In this embodiment, the conductive film 114_0, the metal oxide film 112_0, and the insulating film 110_0 are processed by a dry etching method.

Figure 19C:
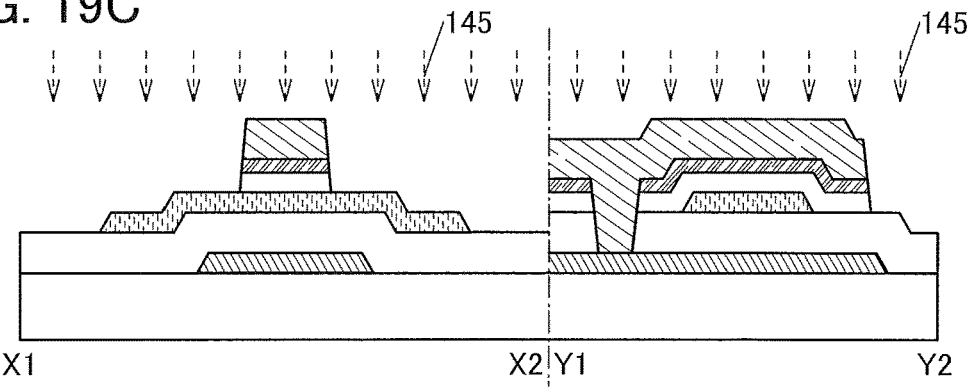
Figure 19D:
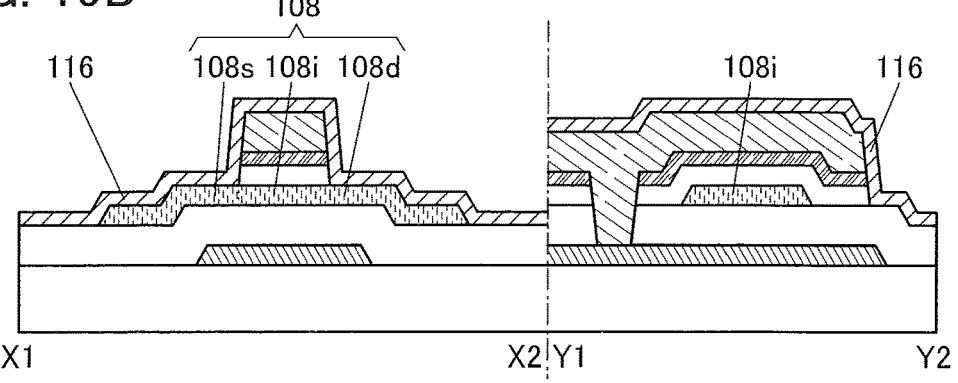

Next, the mask 140 is removed, and then, the impurity element 145 is added from above the insulating film 104, the oxide semiconductor film 107, and the conductive film 114 (see FIG. 19C).

In this embodiment, argon is added to the oxide semiconductor film 107 as the impurity element 145 with a doping apparatus.

Next, the insulating film 116 is formed over the insulating film 104, the oxide semiconductor film 107, and the conductive film 114. Note that the oxide semiconductor film 107 is in contact with the insulating film 116 by formation of the insulating film 116 and serves as the source region 108*s* and the drain region 108*d*. The oxide semiconductor film 107 which is not in contact with the insulating film 116, i.e., the oxide semiconductor film 107 in contact with the insulating film 110 serves as the channel region 108*i*. Accordingly, the oxide semiconductor film 108 including the channel region 108*i*, the source region 108*s*, and the drain region 108*d* is formed (see FIG. 19D).

Figure 20A:
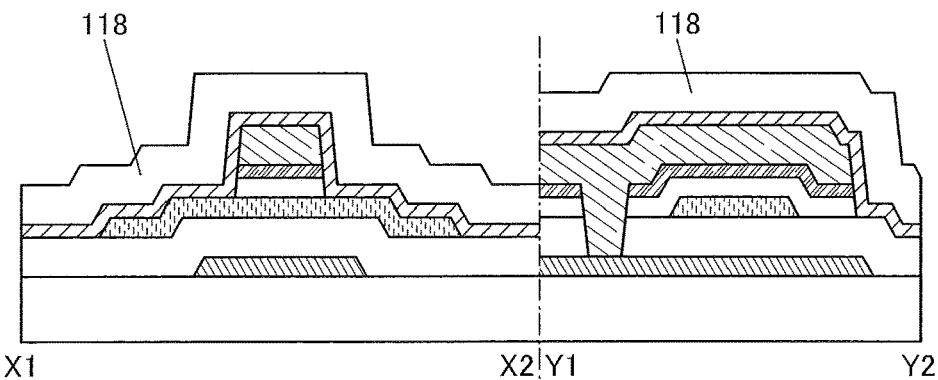
FIGS. 20A to 20D are cross-sectional views illustrating a method for manufacturing a semiconductor device.

Next, the insulating film 118 is formed over the insulating film 116 (see FIG. 20A).

Figure 20B:
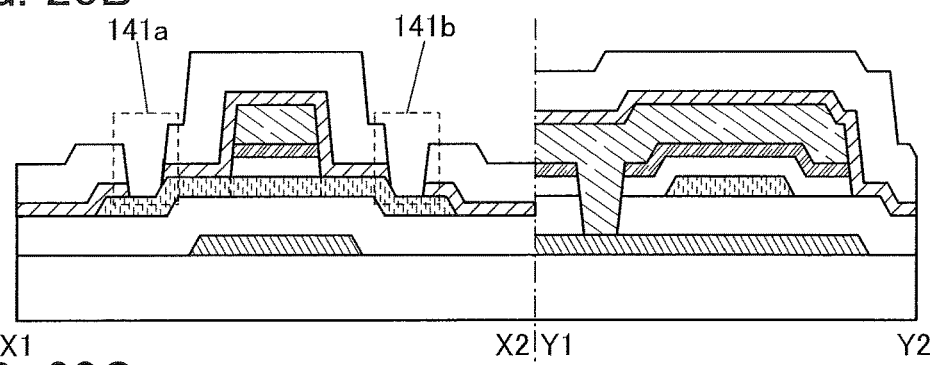

Subsequently, a mask is formed by lithography in a desired position over the insulating film 118, and then, the insulating film 118 and the insulating film 116 are partly etched, so that the opening 141*a* reaching the source region 108*s* and the opening 141*b* reaching the drain region 108*d* are formed (see FIG. 20B).

Figure 20C:
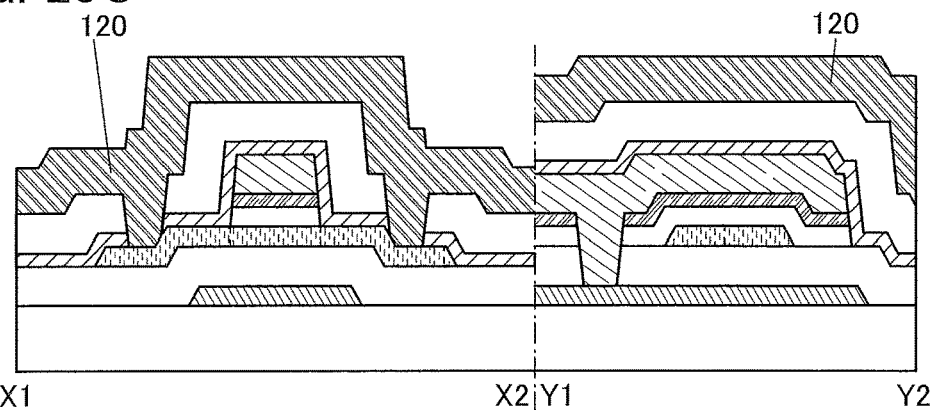

Next, the conductive film 120 is formed over the insulating film 118 to cover the openings 141*a* and 141*b* (see FIG. 20C).

Figure 20D:
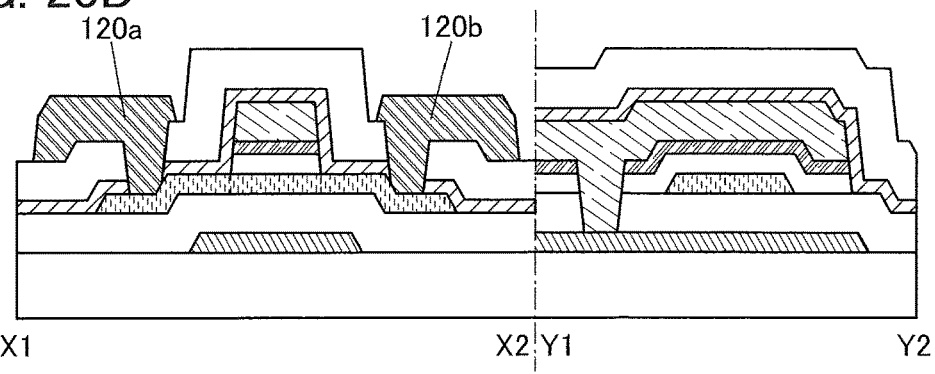

Subsequently, a mask is formed by a lithography process in a desired position over the conductive film 120, and then, the conductive film 120 is partly etched, so that the conductive films 120*a* and 120*b* are formed (see FIG. 20D).

Through the above steps, the transistor 100A in FIGS. 2A to 2C can be manufactured.

One embodiment of the present invention is not limited to the example described in this embodiment, in which the transistor includes an oxide semiconductor film. In one embodiment of the present invention, the transistor does not necessarily include an oxide semiconductor film. For example, a channel region, the vicinity of the channel region, a source region, or a drain region of the transistor may be formed using a material containing silicon (Si), germanium (Ge), silicon germanium (SiGe), gallium arsenide (GaAs), or the like.

The structures and the methods described in this embodiment can be combined as appropriate with any of the structures and the methods described in the other embodiments.

(Embodiment 2)

In this embodiment, an oxygen vacancy ($V_O$) formed in an oxide semiconductor and the case where an impurity (fluorine or hydrogen) enters the oxygen vacancy are described in detail.

<2-1. Model of Oxygen Vacancy ($V_O$) Formed in Oxide Semiconductor>

First, a model of an oxygen vacancy ($V_O$) formed in an oxide semiconductor is described. In an oxide semiconductor, an oxygen vacancy forms a deep level (also referred to as dDOS). The dDOS degrades the electrical characteristics of a transistor including an oxide semiconductor in some cases. Described here are the results of examining a model where a cluster of oxygen vacancies (also referred to as a $V_O$ cluster) is formed in an oxide semiconductor.

Figure 21A:
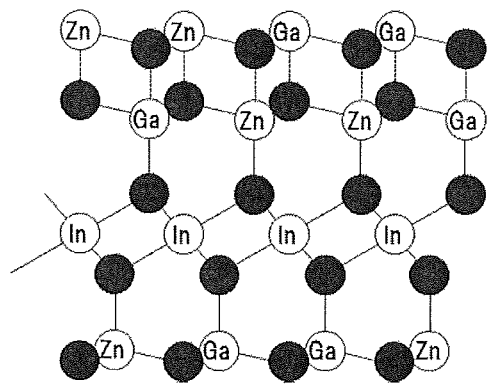
FIGS. 21A to 21C illustrate a model where oxygen vacancies are formed.

FIG. 21A illustrates an InGaZnO$_4$ crystal model in an initial state (before an oxygen vacancy is formed). FIGS. 21B and 21C and FIGS. 22A to 22C illustrate a model where oxygen vacancies are formed in the InGaZnO$_4$ crystal model in the initial state shown in FIG. 21A. In FIGS. 21A to 21C and FIGS. 22A to 22C, a white circle represents a metal atom, and the name of the atom is written in the white circle. A black circle represents an oxygen atom, and a dotted circle represents a $V_O$.

[$V_O$ Formation 1]

Figure 21B:
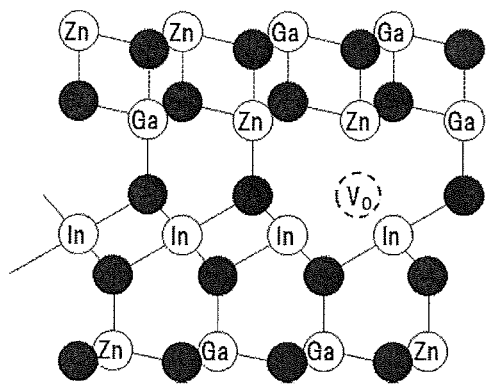

As shown in FIG. 21B following the initial state shown in FIG. 21A, a $V_O$ is formed in an oxygen site surrounded by In and Zn atoms.

[Vzn Formation 1]

Figure 21C:
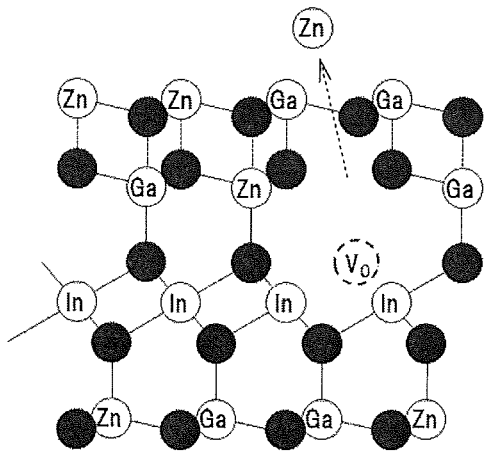

Then, as shown in FIG. 21C following the model shown in FIG. 21B, the Zn atom in the vicinity of the $V_O$ is released to form a Zn vacancy (Vzn).

[$V_O$ Formation 2]

Figure 22A:
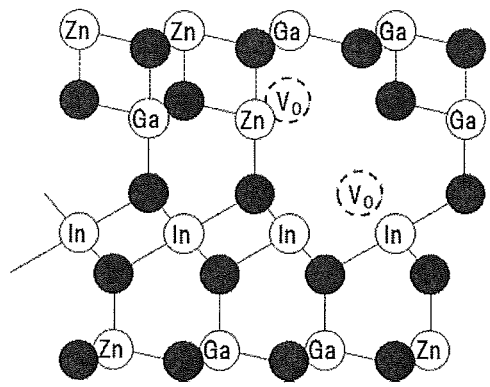
FIGS. 22A to 22C illustrate a model where oxygen vacancies are formed.

Then, as shown in FIG. 22A following the model shown in FIG. 21C, a $V_O$ is formed in an oxygen site. The oxygen site is in the vicinity of the Vzn and bonded to fewer Ga atoms.

[Vzn Formation 2]

Figure 22B:
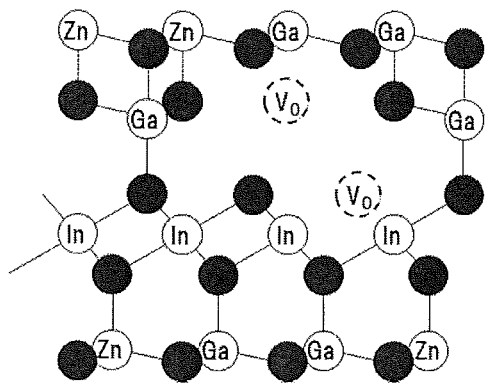

Then, as shown in FIG. 22B following the model shown in FIG. 22A, the Zn atom in the vicinity of the $V_O$ is released to form a Vzn.

[$V_O$ Formation 3]

Figure 22C:
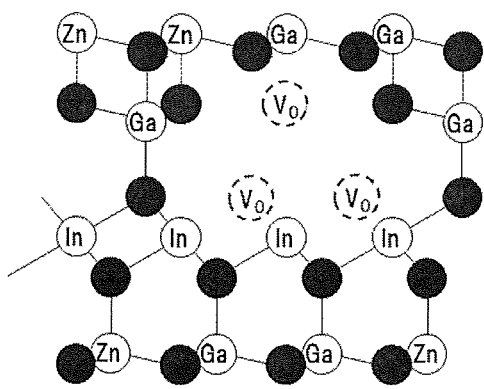

Then, as shown in FIG. 22C following the model shown in FIG. 22B, a $V_O$ is formed in the vicinity of the Vzn.

Thus, one oxygen vacancy is formed in an oxide semiconductor, whereby another oxygen vacancy is formed in the vicinity of the oxygen vacancy. As a result, a plurality of oxygen vacancies or a cluster of oxygen vacancies ($V_O$ cluster) is formed. Therefore, terminating an oxygen vacancy by a stable bond is important when the oxygen vacancy is formed.

<2-2. Termination 1 of $V_O$ by F Atom>

Next, the case where fluorine enters an oxide semiconductor to terminate an oxygen vacancy ($V_O$) is described. Which of a model where an F atom exists outside a $V_O$ and a model where an F atom enters a $V_O$ is stable in terms of energy was calculated to examine ease of occurrence of a $V_O$ terminated by an F atom (hereinafter referred to as a $V_O$F).

Figure 23A:
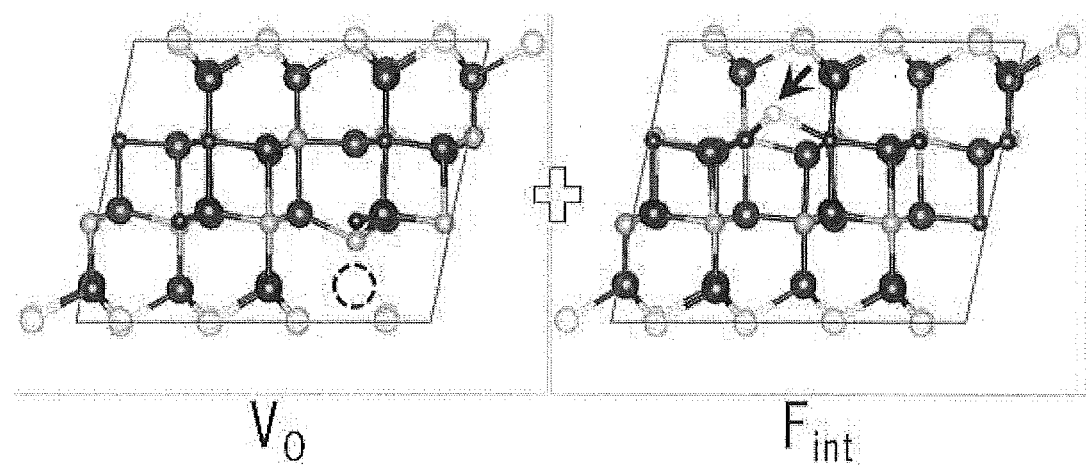
FIGS. 23A and 23B each illustrate a model used for calculation.
Figure 23B:
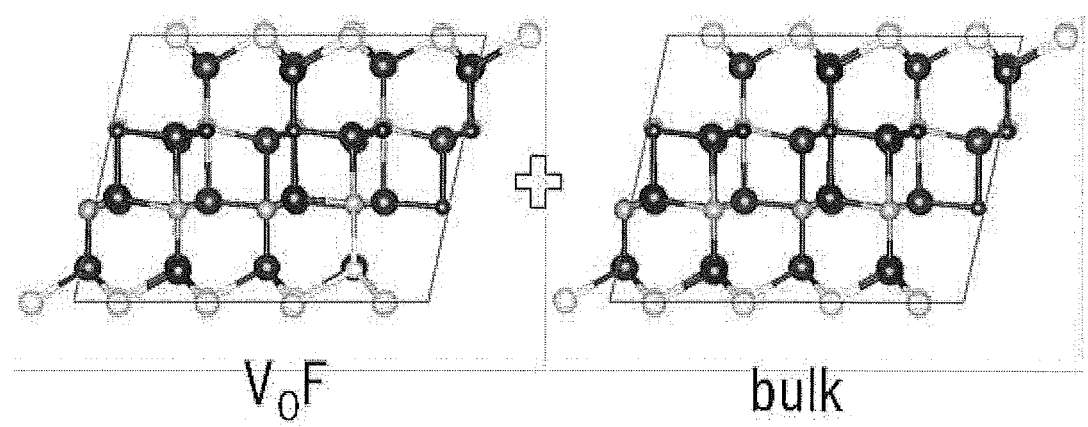

FIGS. 23A and 23B show model diagrams used for calculation and Table 1 shows the calculation conditions. In FIGS. 23A and 23B, a large black sphere represents an oxygen atom; a white sphere, a small black sphere, and a gray sphere represent metal atoms (In, Ga, and Zn, respectively); a dotted sphere represents a $V_O$; and a sphere pointed by an arrow represents an F atom.

TABLE 1

| Software | VASP |
|---|---|
| Model | InGaZnO$_4$ crystal (112 atoms) |
| Functional | GGA-PBE |
| Pseudopotential | PAW |
| Cut-off energy | 800 eV |
| k points | 2 × 2 × 3 |

Each of the models used for calculation is an InGaZnO$_4$ crystal model (112 atoms). FIG. 23A shows a model where an F atom exists outside a $V_O$ (such a model is hereinafter referred to as a $V_O$+F$_{int}$ model) and FIG. 23B shows a model where an F atom enters a $V_O$ (such a model is hereinafter referred to as a $V_O$F+bulk model).

Note that an oxygen site bonded to three In atoms and one Zn atom and located in an InO$_2$ layer is used as a site where a $V_O$ and a $V_O$F are to be formed. In the case where an F atom exists outside a $V_O$, the F atom is assumed to exist in an interstitial site (such an F atom is referred to as an F$_{int}$). In view of this, F atoms are located in conceivable interstitial sites, and a site that is the most stable in terms of energy is selected from the sites.

It is assumed that a $V_O$ and an F$_{int}$ in the $V_O$+F$_{int}$ model in FIG. 23A are so apart from each other as not to affect each other. In that case, the model where the F atom enters the $V_O$ and the $V_O$+F$_{int}$ model shown in FIG. 23A need to have the same number of atoms in order to compare the energies of the models. The energy of the $V_O$+F$_{int}$ model ($E_{tot}$($V_O$+F$_{int}$) is assumed to be the sum of the energy of the $V_O$ model (E($V_O$)) and the energy of the F$_{int}$ model (E(F$_{int}$)), and the energy of the $V_O$F model ($E_{tot}$($V_O$F)) is assumed to be the sum of the energy of the $V_O$F model (E($V_O$F) and the energy of a bulk model without defects (E(bulk)).

Formulae which satisfy the above relationships are shown below.

$$E_{tot}(V_O+F_{int})=E(V_O)+E(F_{int}) \qquad \text{[Formula 1]}$$

$$E_{tot}(V_OF)=E(V_OF)+E(bulk) \qquad \text{[Formula 2]}$$

Table 2 shows results of the relative energies calculated by Formulae 1 and 2.

TABLE 2

| | Relative energy [eV] |
|---|---|
| $V_O$ + F$_{int}$ | 0.00 |
| $V_O$F | −4.68 |

According to the results shown in Table 2, the relative energy of the $V_O$F is lower than that of the $V_O$+F$_{int}$. This indicates that the case where the $V_O$F is formed is more stable than the case where the $V_O$ is apart from the $F_{int}$. That is, in the case where a $V_O$ exists in an IGZO film, it is likely that an $F_{int}$ fills the $V_O$ and forms a $V_OF$.

<2-3. Density of States in $V_OF$ Model>

Figure 24:
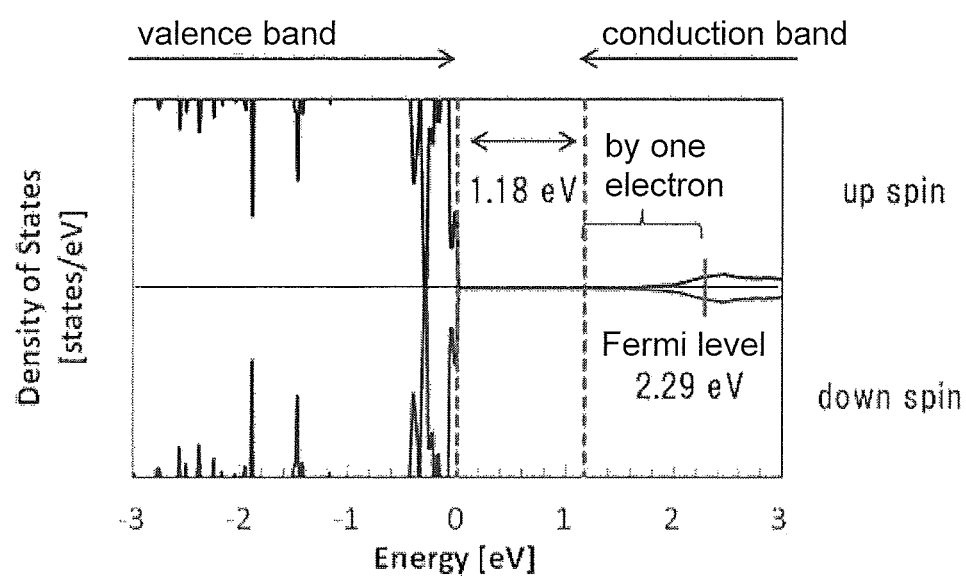
FIG. 24 shows the calculation results of the density of states of a $V_OF$ model.

Next, the density of states in a $V_OF$ model was calculated. FIG. 24 shows the calculation results of the density of states in the $V_OF$ model.

GGA (Generalized-gradient-approximation) was used as the functional to calculate the density of states in the $V_OF$ model. Furthermore, in FIG. 24, an upper portion and a lower portion show up spins and down spins, respectively, the horizontal axis indicates energy, and the position of 0 eV on the horizontal axis corresponds to the valence band maximum.

According to the results shown in FIG. 24, when a $V_OF$ is formed, one electron is released to the conduction band. This is probably because of a difference in ionic valences between an O atom and an F atom. That is, in this embodiment, when the F atom enters a $V_O$, the InGaZnO$_4$ crystal model may become n-type by releasing an electron.

<2-4. Termination of $V_O$ by O Atom>

Next, the termination of a $V_O$ by an O atom was calculated for comparison with the above-described termination of a $V_O$ by an F atom. The termination of a $V_O$ by an O atom is to repair the $V_O$, which means that no defect exists after the termination of a $V_O$ by an O atom. First, the energies are compared between the model where an O atom exists outside a $V_O$ and a model after a $V_O$ is repaired (without defects).

Figure 25A:
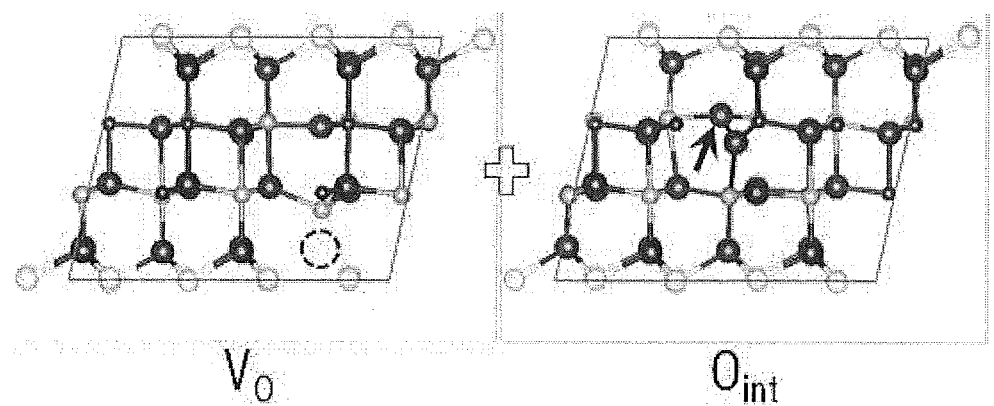
FIGS. 25A and 25B each illustrate a model used for calculation.
Figure 25B:
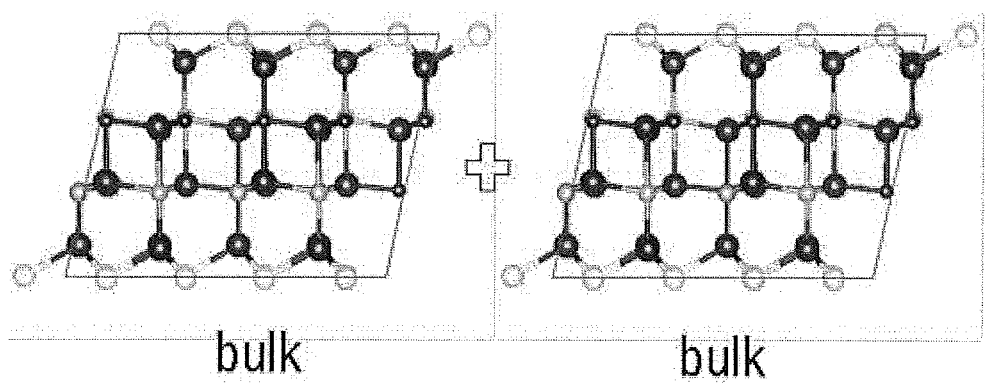

FIGS. 25A and 25B show model diagrams used for the calculation. Note that the calculation conditions are the same as those in the $V_OF$ described above.

Each of the models used for calculation is an InGaZnO$_4$ crystal model (112 atoms). FIG. 25A shows a model where an O atom exists outside a $V_O$ (such a model is hereinafter referred to as a $V_O+O_{int}$ model) and FIG. 25B shows a model without defects (such a model is hereinafter referred to as a bulk+bulk model). In FIGS. 25A and 25B, a large black sphere represents an oxygen atom; a white sphere, a small black sphere, and a gray sphere represent metal atoms (In, Ga, and Zn, respectively); a dotted sphere represents a $V_O$; and a sphere pointed by an arrow represents $O_{int}$.

It is assumed that a $V_O$ and an $O_{int}$ in the $V_O+O_{int}$ model in FIG. 25A are so apart from each other as not to affect each other. In that case, the model where the O atom enters the $V_O$ (the model without defects) shown in FIG. 25B and the $V_O+O_{int}$ model shown in FIG. 25A need to have the same number of atoms in order to compare the energies of the models. The energy of the $V_O+O_{int}$ model ($E_{int}(V_O+O_{int})$) shown in FIG. 25A is assumed to be the sum of the energy of the $V_O$ model ($E(V_O)$) and the energy of the $O_{int}$ model ($E(O_{int})$), and the energy of the model after the $V_O$ is repaired (without defects) ($E_{tot}$(cure)) shown in FIG. 25B is assumed to be twice the energy of the bulk model without defects ($E$(bulk)).

Formulae which satisfy the above relationships are shown below.

$$E_{tot}(V_O+O_{int})=E(V_O)+E(O_{int})$$ [Formula 3]

$$E_{tot}(\text{cure})=2E(\text{bulk})$$ [Formula 4]

Table 3 shows results of the relative energies calculated by Formulae 3 and 4.

TABLE 3

| | Relative energy [eV] |
|---|---|
| $V_O + O_{int}$ | 0.00 |
| cure ($V_O$ repair) | −6.08 |

According to the results shown in Table 3, the relative energy of the $V_O$ repair is lower than that of the $V_O+O_{int}$. This indicates that the case where the $V_O$ is repaired is more stable than the case where the $V_O$ is apart from the $O_{int}$. That is, in the case where a $V_O$ exists in an IGZO film, it is likely that an $O_{int}$ fills and repairs the $V_O$. Note that carriers are not generated in repairing the $V_O$.

<2-5. Termination 2 of $V_O$ by F Atom>

Next, the termination of a $V_O$ by an F atom is described using a calculation method different from the above calculation method. A GGA functional was used for the above calculation, whereas a Hybrid functional was used below. The calculation conditions are shown in Table 4.

TABLE 4

| Software | VASP |
|---|---|
| Model | InGaZnO$_4$ crystal + defects (112 atoms) |
| Functional | Hybrid (HSE06) |
| Pseudopotential | PAW |
| Cut-off energy | 800 eV |
| k points | Γ point (1 × 1 × 1) |

Under the calculation conditions shown in Table 4, the lattice constant and the atomic positions of crystal models without defects were optimized, and then, defect models were formed and only the atomic positions were optimized.

Here, four models shown in FIGS. 26A to 26D were calculated.

Figure 26A:
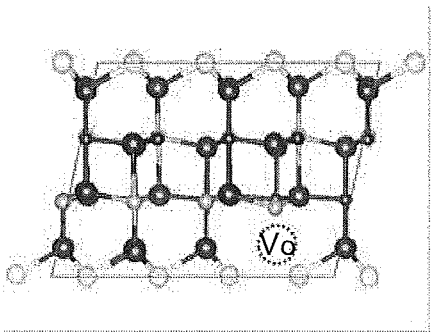
FIGS. 26A to 26D each illustrate a model used for calculation.
Figure 26B:
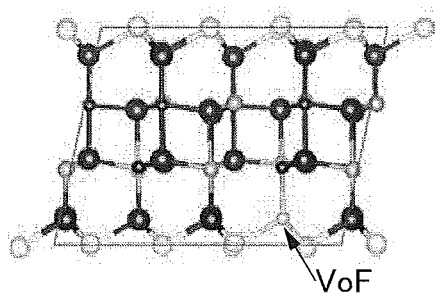
Figure 26C:
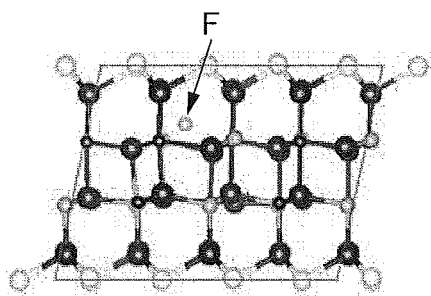
Figure 26D:
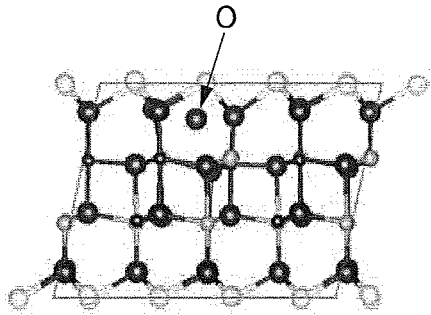

FIG. 26A is a model diagram showing an oxygen vacancy ($V_O$), FIG. 26B is a model diagram showing a structure where an F atom fills a $V_O$ ($V_OF$), FIG. 26C is a model diagram showing a structure where an F atom is inserted into an interstitial site ($F_{int}$), and FIG. 26D is a model diagram showing a structure where an O atom is inserted into an interstitial site ($O_{int}$). In FIGS. 26A to 26D, a large black sphere represents an oxygen atom; a white sphere, a small black sphere, and a gray sphere represent metal atoms (In, Ga, and Zn, respectively); a dotted sphere represents a $V_O$; a white sphere pointed by an arrow represents an $F_{int}$; and a black sphere pointed by an arrow represents an $O_{int}$.

In FIG. 26A, the formation position of a $V_O$ is assumed to be an O site next to a Zn atom in an InO$_2$ layer. That is, the formation position of a $V_O$ is a site surrounded by three In atoms and one Zn atom. In FIG. 26B, the formation position of a $V_OF$ is assumed to be in an O site next to a Zn atom in an InO$_2$ layer. That is, the formation position of a $V_OF$ is a site surrounded by three In atoms and one Zn atom. In FIG. 26C, the formation position of an $F_{int}$ is an interstitial site between an InO$_2$ layer and a (Ga, Zn)O layer. That is, the formation position of an $F_{int}$ is a site surrounded by three In atoms, two Ga atoms, and one Zn atom. In FIG. 26D, the formation position of an $O_{int}$ is assumed to be an interstitial site between an InO$_2$ layer and a (Ga, Zn)O layer. That is, the formation position of an $O_{int}$ is a site surrounded by three In atoms, two Ga atoms, and one Zn atom.

As for the model diagrams shown in FIGS. 26A to 26 D, formation energies of defect models ($E_{form}(D)$) were calculated using the following formula. Note that as the formation energy of a defect model ($E_{form}(D)$) is lower, defects are easily formed.

$$E_{form}(D,q)=E(\text{defect},q)-E(\text{bulk})-\Sigma\Delta n(X)\mu(X)+q\{\mu(e)+E_{VBM}+\Delta V\} \quad \text{[Formula 5]}$$

In Formula 5, E(defect, q) represents the total energy of a lattice having the defect D at the charge q, E(bulk) represents the total energy in a crystal without defects, $\Delta n(X)$ represents the number of atoms X removed from (or added to) the model, $\mu(X)$ represents the chemical potential of atom X removed from (or added to) the model, q represents the valence number of a charge of the model having defects, $\mu(e)$ represents the chemical potential of an electron (Fermi level when the valence band maximum is considered as a base), $E_{VBM}$ represents the energy at the valence band maximum (VBM), and $\Delta V$ represents the correction term relating to the electrostatic potential energy.

Figure 27:
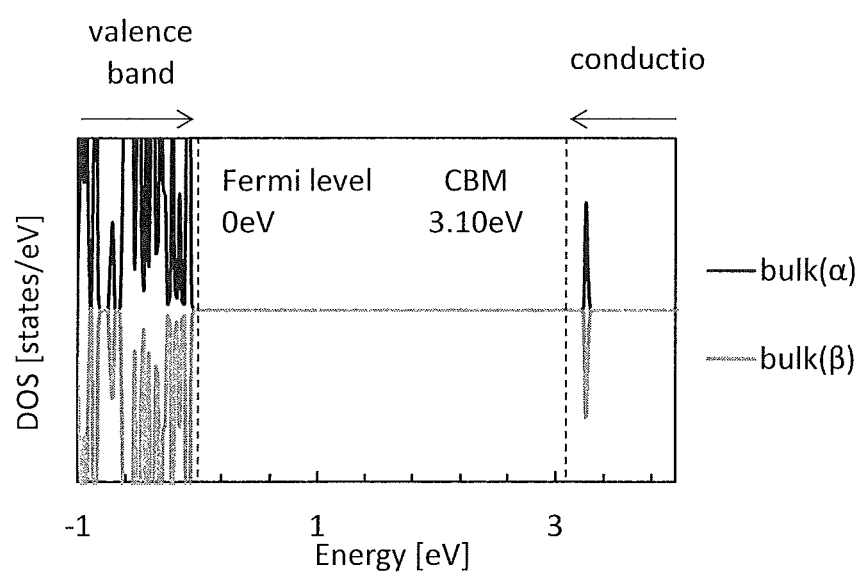
FIG. 27 shows the calculation result of the density of states of a crystal model.

FIG. 27 shows the calculation result of the density of states in a crystal model without defects (perfect crystal).

In FIG. 27, the Fermi level represents the highest occupied level of electrons. Note that the levels exist discretely because the calculation was performed only at a r point. All electrons exist in the valence band, and the level in the gap does not exist. According to the calculation results in FIG. 27, the bandgap was 3.10 eV.

Figure 28A:
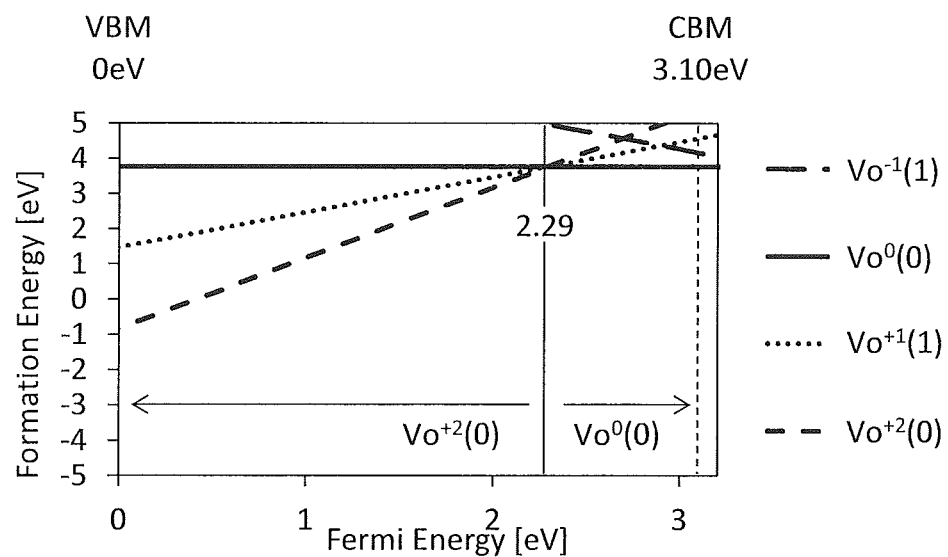
FIGS. 28A and 28B show the calculation results of formation energies of a $V_O$ and a $V_OF$.
Figure 28B:
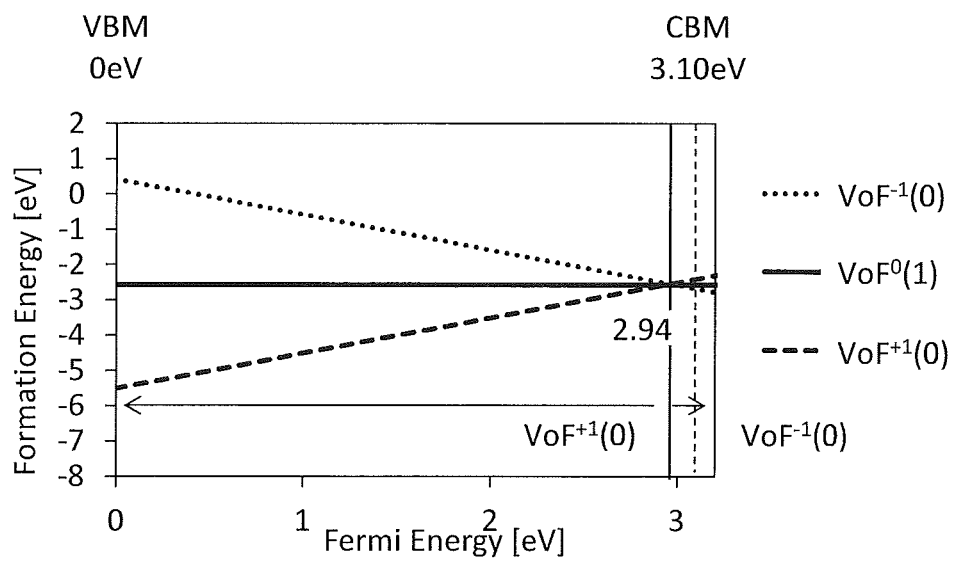
Figure 29A:
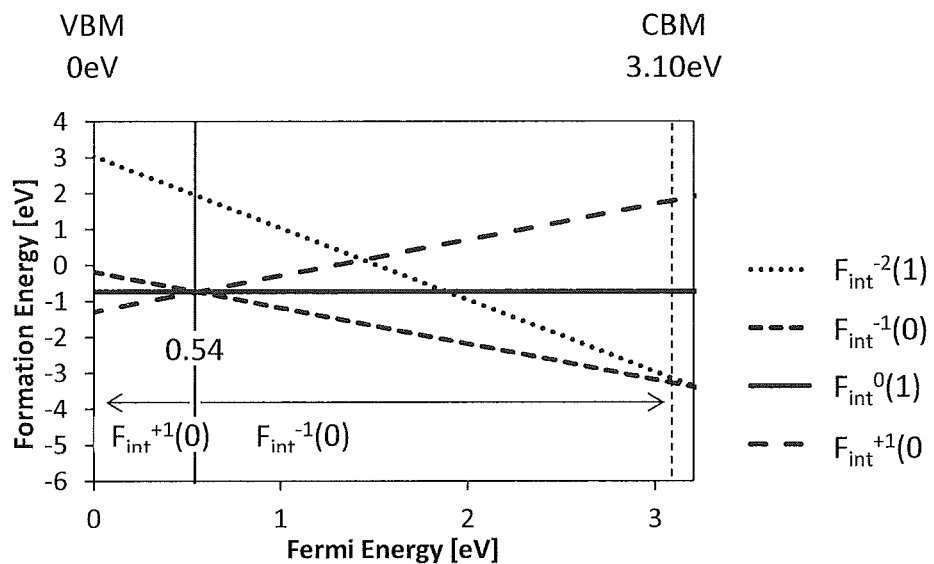
FIGS. 29A and 29B show the calculation results of formation energies of an $F_{int}$ and an $O_{int}$.
Figure 29B:
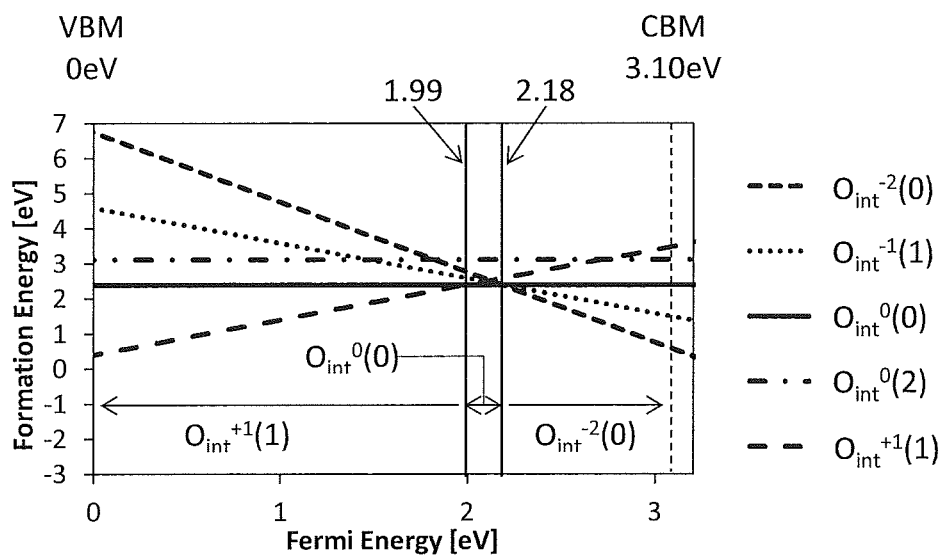

Next, FIG. 28A shows the calculation results of formation energy of a $V_O$, FIG. 28B shows the calculation results of formation energy of a $V_OF$, FIG. 29A shows the calculation results of formation energy of an $F_{int}$, and FIG. 29B shows the calculation results of formation energy of an $O_{int}$. In FIGS. 28A and 28B and FIGS. 29A and 29B, the vertical axis indicates the formation energy calculated using Formula (5) and the horizontal axis indicates the Fermi level. Moreover, in the horizontal axis in each of FIGS. 28A and 28B and FIGS. 29A and 29B, 0.0 eV corresponds to the valence band maximum (VBM) and 3.10 eV corresponds to the conduction band minimum (CBM).

In FIGS. 28A and 28B and FIGS. 29A and 29B, $X^q(Y)$ is used where X represents the kinds of defects ($V_O$, $V_OF$, $F_{int}$, or $O_{int}$), q represents the valence number of electrons of a model, and Y represents the number of spins per unit lattice (the up-spin electron number–the down-spin electron number).

According to the results in FIG. 28A, the charge state of a $V_O$ is +2 when the Fermi level is from the VBM to 2.29 eV and is 0 (neutral) when the Fermi level is greater than or equal to 2.29 eV.

According to the results in FIG. 28B, the charge state of a $V_OF$ is +1 when the Fermi level is from the VBM to 2.94 eV and is −1 when the Fermi level is greater than or equal to 2.94 eV. The $V_OF$ becomes a donor source (n-type factor) because the Fermi energy at which the charge state changes is 2.94 eV which is close to the CBM.

According to the results in FIG. 29A, the charge state of an $F_{int}$ is +1 when the Fermi level is from the VBM to 0.54 eV and is −1 when the Fermi level is from 0.54 eV to the CBM. The $F_{int}$ traps electrons because the $F_{int}$ is likely to have a negative charge state.

According to the results in FIG. 29B, the charge state of an $O_{int}$ is +1 when the Fermi level is from the VBM to 1.99 eV, is 0 (neutral) when the Fermi level is from 1.99 eV to 2.18 eV, and is −2 when the Fermi level is from 2.18 eV to the CBM.

<2-6. Termination 3 of $V_O$ by F Atom>

Next, the following Reaction formula A and Reaction formula B were examined using the formation energy of each defect described in <2-5. Termination 2 of $V_O$ by F atom>

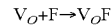  Reaction formula A:

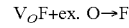  Reaction formula B:

($V_O$ repair by addition of ex. O)

In Reaction formula A, when a $V_OF$ is more stable in terms of energy than a $V_O$+F, termination of a $V_O$ by an F atom is likely to occur. In Reaction formula B, ex. O represents excess oxygen. In some cases, the left sides of Reaction formula A and Reaction formula B and the right sides thereof are described below as reactants and products, respectively.

Note that Reaction formula A and Reaction formula B were examined by Formula 6 and Formula 7, respectively.

$$\Delta E_A=E_{form}(V_OF)-\{E_{form}(V_O)+E_{form}(F_{int})\} \quad \text{[Formula 6]}$$

$$\Delta E_B=E_{form}(F_{int})-\{E_{form}(V_OF)+E_{form}(O_{int})\} \quad \text{[Formula 7]}$$

In Formula 6, $\Delta E_A$ is a value obtained by subtracting the formation energy of the reactant ($V_O$+$F_{int}$) from the formation energy of the product ($V_OF$).

in Formula 7, $\Delta_E$ is a value obtained by subtracting the formation energy of the reactant ($V_OF$+$O_{int}$) from the formation energy of the product ($F_{int}$).

Given that defects in a model are so apart from each other as not to affect each other for the calculation, the reactant is more stable at the Fermi level when the energy difference (Each of $\Delta E_A$ and $\Delta E_B$) is positive, whereas the product is more stable at the Fermi level when the energy difference (Each of $\Delta E_A$ and $\Delta E_B$) is negative. Furthermore, as described in <2-5. Termination 2 of $V_O$ by F atom>, the stable charge state of a model varies depending on the Fermi level. Therefore, the formation energy of each defect used for the calculation of $\Delta E_A$ and $\Delta E_B$ is set to the most stable charge state at each Fermi level.

Figure 30A:
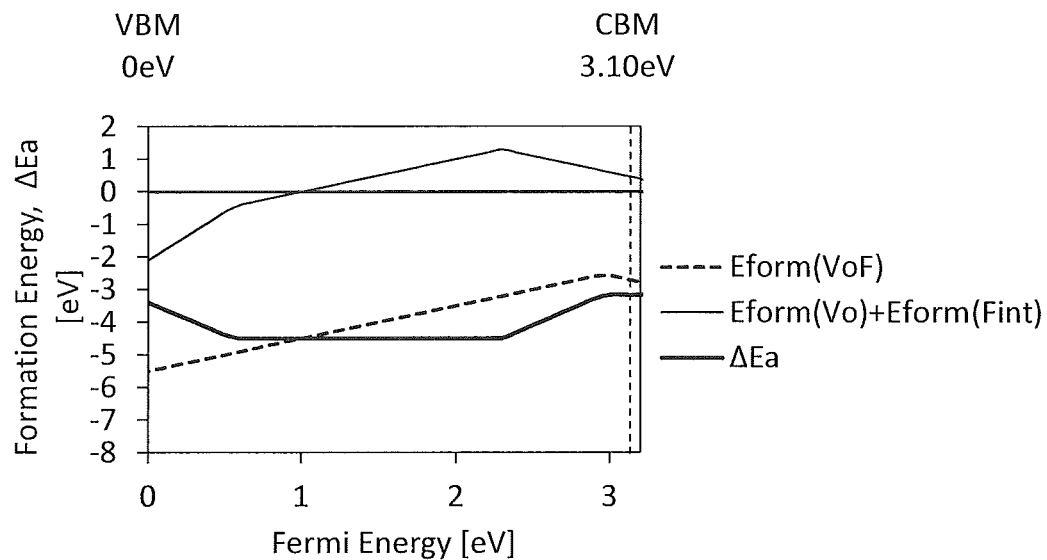
FIGS. 30A and 30B show the calculation results of formation energies of a reactant and a product and energy difference therebetween.

FIG. 30A shows the calculation results of the formation energies of the reactant and the product and the energy difference therebetween ($\Delta E_A$) in Reaction formula A. According to the results in FIG. 30A, $\Delta E_A$ is negative in the band gap; thus, it was found that when a $V_O$ and an F atom exist, the F atom fills the $V_O$, whereby a $V_OF$ is likely to be generated.

Figure 30B:
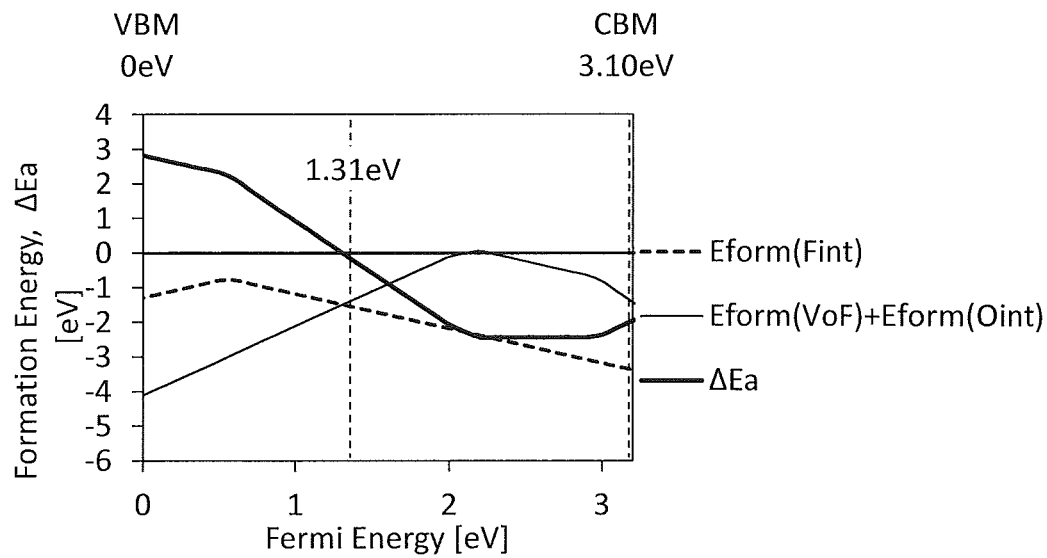

FIG. 30B shows the calculation results of the formation energies of the reactant and the product and the energy difference therebetween ($\Delta E_B$) in Reaction formula B. According to the results in FIG. 30B, when the Fermi level is less than or equal to 1.31 eV, release of an F atom from the $V_OF$ owing to an $O_{int}$ hardly occurs (that is, the reactant is more stable), and when the Fermi level is greater than or equal to 1.31 eV, release of an F atom from the $V_OF$ owing to the $O_{int}$ to an interstitial site ($F_{int}$) to fill the $V_O$ is more stable.

Therefore, when a film where a $V_OF$ is formed contains excess oxygen as much as an F atom in the $V_OF$ is released, the released F atom exists in an interstitial site, that is, the released F atom becomes an $F_{int}$, and the $F_{int}$ might trap an electron in the gap.

In the case where an oxygen vacancy ($V_O$) formed in an oxide semiconductor film includes an F atom in an interstitial site ($F_{int}$) as described above, a $V_OF$ is formed to generate an electron. In other words, the oxide semiconductor including the $V_OF$ might become n-type. Furthermore, in the case where the oxide semiconductor including the $V_OF$ includes excess oxygen (ex. O), the $V_OF$ releases an F atom to an interstitial site to become a $V_O$, and the $V_O$ is repaired by the excess oxygen. That is, an oxide semiconductor including the $F_{int}$ is formed. The $F_{int}$ traps an electron to form a negative fixed charge.

<2-7. Stability of Structure where Impurities Enter $V_O$>

Next, the stability of a structure where impurities enter a $V_O$ was calculated. Here, fluorine and hydrogen were used as the impurities. Note that a structure where fluorine enters a $V_O$ and a structure where hydrogen enters a $V_O$ are referred to as a $V_OF$ and a $V_OH$, respectively.

First, the stable positions of the impurities released from a $V_O$ were calculated. Note that the charge of the whole model was assumed to be neutral for the calculation of the stable positions of the impurities released from a $V_O$.

Figure 31:
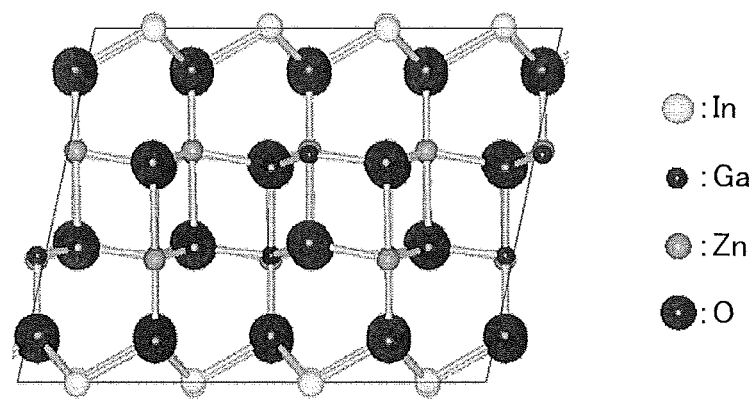
FIG. 31 shows a model used for calculation.

FIG. 31 shows the model used for the calculation, and Table 5 shows the calculation conditions.

TABLE 5

| Software | VASP |
| --- | --- |
| Model | InGaZnO$_4$ crystal (112 atoms) |
| Functional | GGA-PBE |
| Pseudopotential | PAW |
| Cut-off energy | 800 eV |
| k points | 2 × 2 × 3 |

FIG. 31 shows an InGaZnO$_4$ crystal (112 atoms) model. With the model, a model including an impurity (F or H) was made.

Figure 32A:
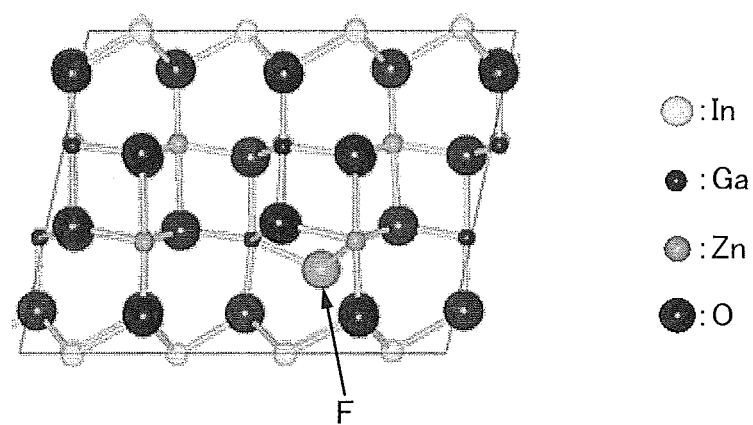
FIGS. 32A and 32B illustrate models each showing a stable position of an impurity (F or H) in an interstitial site in an $InGaZnO_4$ crystal.
Figure 32B:
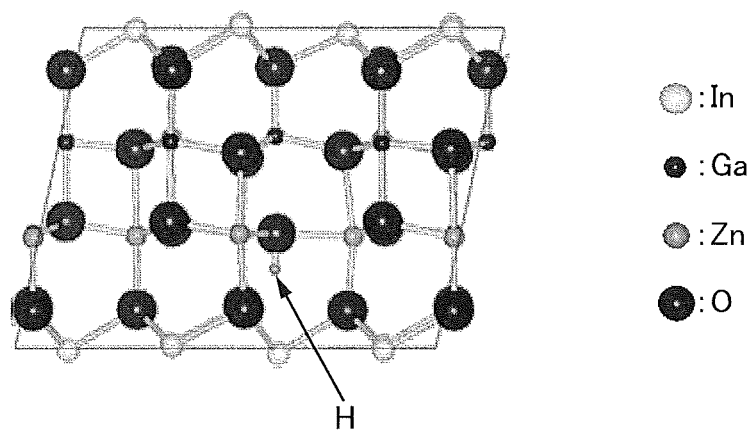

FIGS. 32A and 32B are model diagrams each showing the stable position of an impurity (F or H) in an interstitial site in an InGaZnO$_4$ crystal. FIG. 32A is a model diagram where an F atom is stably positioned in an interstitial site in an InGaZnO$_4$ crystal, and FIG. 32B is a model diagram where an H atom is stably positioned in an interstitial site in an InGaZnO$_4$ crystal.

In FIG. 32A, the F atom is stable in terms of energy at the center of an octahedron having six oxygen atoms at the vertexes. Furthermore, in FIG. 32B, the H atom is stable in terms of energy in a state where the H atom is bonded to an O atom in the InGaZnO$_4$ crystal.

Here, Table 6 shows the Pauling electronegativity.

TABLE 6

|  | F | O | H | Ga | In | Zn |
| --- | --- | --- | --- | --- | --- | --- |
| Electronegativity | 3.98 | 3.44 | 2.20 | 1.81 | 1.78 | 1.65 |

As shown in Table 6, H has a lower electronegativity than O, and the difference between the electronegativity of H and that of O is large. Thus, an H atom in an InGaZnO$_4$ crystal satisfying the stoichiometric composition probably exists in a state where the H atom is ionically bonded to an O atom. In other words, an O atom bonded to an H atom is negatively charged, and the H atom is positively charged.

Meanwhile, F has a higher electronegativity than O; thus, F is likely to be negative compared with O. The difference between the electronegativity of F and that of O is smaller than the difference between the electronegativity of H and that of O, which probably leads to large contribution of a covalent bond property. Therefore, in an IGZO crystal, an F atom is likely to exist in a position where the bonding strength with metal in a (Ga, Zn)O layer and the repulsion force of an O atom equilibrate (in an interstitial site).

Next, in order to thermodynamically examine a change between a state where a $V_O$ includes an impurity (F or H) and a state where an impurity (F or H) exist outside a $V_O$, an energy needed for an impurity (F or H) to enter and leave a $V_O$ and the diffusion frequency were calculated by a nudged elastic band (NEB) method which is one of methods for finding a chemical reaction path.

The diffusion barrier (Ea) needed to estimate the diffusion frequency was evaluated by an NEB method. Furthermore, models in an initial state and a final state of the diffusion path were prepared. The initial state refers to a state where an impurity (F or H) enters a $V_O$, and the final state refers to a state where an impurity (F or H) is released from a $V_O$. In other words, with the InGaZnO$_4$ crystal (112 atoms) model shown in FIG. 31, models including an impurity (F or H) were made. As for a crystal model including a $V_O$, a model where an impurity (F or H) enters a $V_O$ ($V_OF$ or $V_OH$) is set to the initial state, and a model where an impurity (F or H) exists outside a $V_O$ ($V_O+F$ in an interstitial site or $V_O+H$ in an interstitial site) is set to the final state.

Here, the charge of the whole model is at +1, and the calculation conditions were the same as those in Table 5.

[Stability of $V_OF$]

Figure 33:
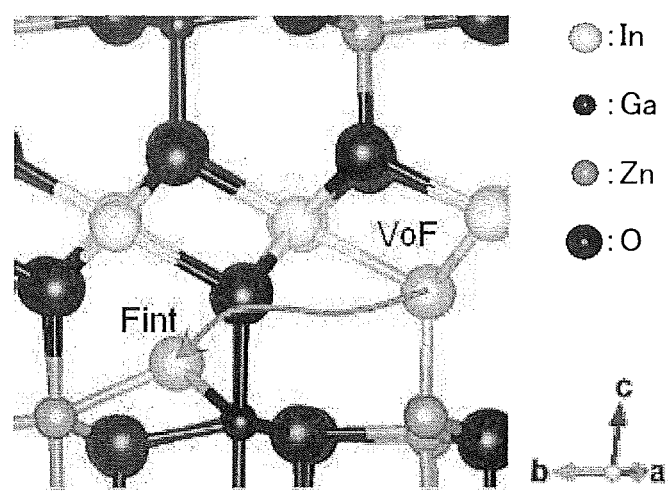
FIG. 33 shows a model of a diffusion path of an F atom in an $InGaZnO_4$ crystal.
Figure 34:
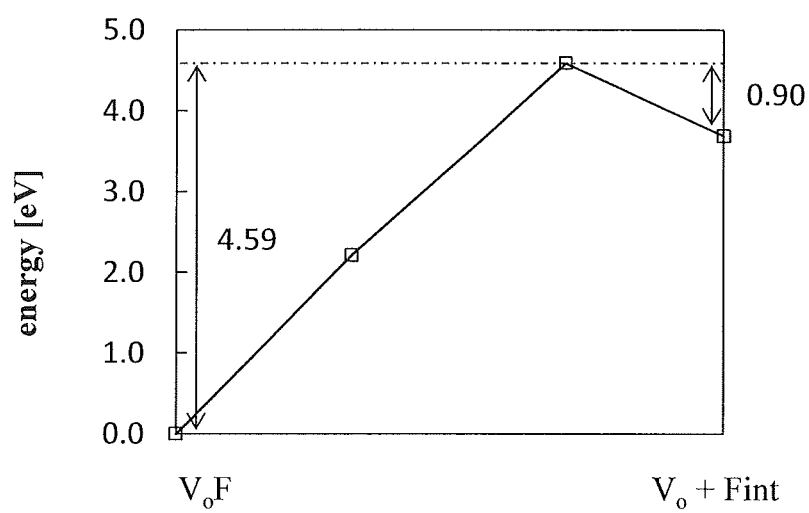
FIG. 34 shows calculation results of a change in energy corresponding to a diffusion path of an F atom.

First, the calculation results of the stability of a $V_OF$ having a structure where an F atom enters a $V_O$ are described below. FIG. 33 shows a model of a diffusion path of an F atom in an InGaZnO$_4$ crystal, and FIG. 34 shows the calculation results of a change in energy corresponding to a diffusion path of an F atom. Note that an arrow in FIG. 33 indicates the diffusion path of an F atom from a $V_OF$.

As shown in FIG. 33 and FIG. 34, at least one diffusion barrier exists in the diffusion path of the F atom. In FIG. 33, a state where an F atom enters a $V_O$ is denoted by a $V_OF$, and a state where an F atom exists in an interstitial site is denoted by an $F_{int}$. Moreover, in FIG. 34, a state where an F atom enters a $V_O$ is denoted by a $V_OF$, and a state where an F atom is released from a $V_OF$ is denoted by a $V_O+F_{int}$. Note that in FIG. 34, the right side with respect to a $V_OF$ corresponds to release of an F atom from a $V_OF$, and the left side with respect to a $V_O+F_{int}$ corresponds to entry of an F atom to a $V_O$ (trap of an F atom in a $V_O$).

According to the results in FIG. 34, energy needed for release of an F atom from a $V_OF$ (diffusion barrier) was 4.59 eV, and energy needed for entry of an F atom to a $V_O$ (diffusion barrier) was 0.90 eV. Since the energy needed for release of an F atom from a $V_OF$ is higher than the energy needed for entry of an F atom to a $V_O$, it is suggested that the F atom once entering the $V_O$ is hardly released therefrom.

[Stability of $V_OH$]

Figure 35:
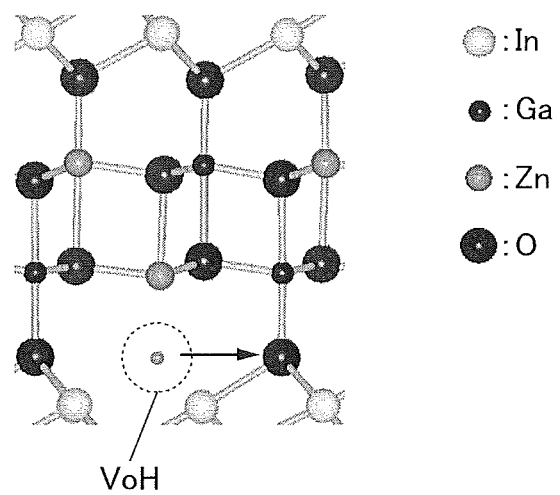
FIG. 35 shows a model of a diffusion path of an H atom in an $InGaZnO_4$ crystal.

Next, the calculation results of the stability of a $V_OH$ having a structure where an H atom enters a $V_O$ are described below. FIG. 35 shows a model of a diffusion path of an H atom in an InGaZnO$_4$ crystal, and FIG. 36 shows the calculation results of a change in energy corresponding to a diffusion path of an H atom.

Figure 36:
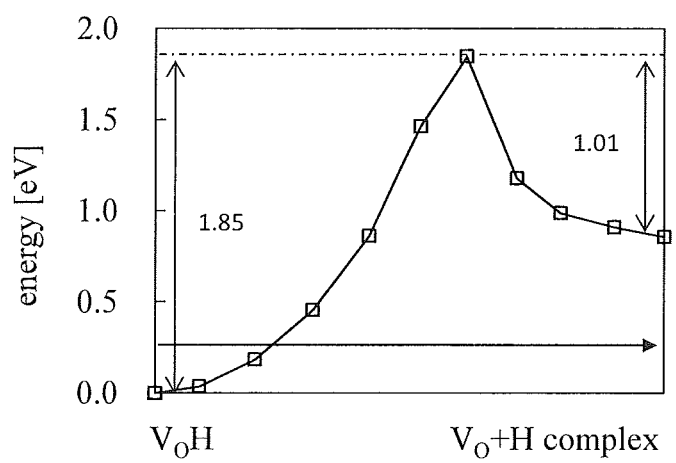
FIG. 36 shows calculation results of a change in energy corresponding to a diffusion path of an F atom.

As shown in FIG. 35 and FIG. 36, at least one diffusion barrier exists in the diffusion path of the H atom. In FIG. 35, a state where an H atom enters a $V_O$ is denoted by a $V_OH$. Moreover, in FIG. 36, a state where an H atom enters a $V_O$ is denoted by a $V_OH$, and a state where an H atom is released from a $V_OH$ is denoted by a $V_O+H$ complex. Note that in FIG. 36, the right side with respect to a $V_OH$ corresponds to release of an H atom from a $V_OH$, and the left side with respect to a $V_O+$complex corresponds to entry of an H atom to a $V_O$ (trap of an H atom in a $V_O$).

According to the results in FIG. 36, energy needed for release of an H atom from a $V_OH$ (diffusion barrier) was 1.85 eV, and energy needed for entry of an H atom to a $V_O$ (diffusion barrier) was 1.01 eV. Since the energy needed for release of an H atom from a $V_OH$ is higher than the energy needed for entry of an H atom to a $V_O$, it is suggested that the H atom once entering the $V_O$ is hardly released therefrom.

[Comparison Between Stability of $V_OF$ and Stability of $V_OH$]

According to the above calculation results, the following relationship can be obtained when the energy needed for release of an F atom from a $V_OF$ (diffusion barrier) and the energy needed for release of an H atom from a $V_OH$ (diffusion barrier) are compared.

F(4.59 eV)>H(1.85 eV)

Next, the diffusion frequency Γ of an impurity (F or H) was calculated from the above diffusion barriers by using Formula 8.

$$\Gamma = \nu \exp\left(\frac{-E_a}{k_B T}\right) \qquad \text{[Formula 8]}$$

In Formula 8, ν represents the frequency factor, Ea represents the diffusion barrier, $k_B$ represents the Boltzmann constant, and T represents the absolute temperature. Furthermore, $\nu=1.0\times10^{13}$ s$^{-1}$ was satisfied.

Table 7 shows the results calculated using Formula 8. In Table 7, the diffusion frequency of an impurity (F or H) at 350° C. and the diffusion barrier of an impurity (F or H) at 350° C. are shown, and release from a $V_O$ and trap by a $V_O$ were assumed as paths of an impurity (F or H).

TABLE 7

| | | Γ (350° C.) [/s] ($E_a$ [eV]) | |
|---|---|---|---|
| $V_O$ site | Path of impurity | F | H |
| InO$_2$ layer*[1] | Release from Vo | 8.00 × 10$^{-25}$/s (4.59 eV) | 1.11 × 10$^{-2}$/s (1.85 eV) |
| | Trap in $V_O$ | 5.48 × 10$^5$/s (0.90 eV) | 6.19 × 10$^4$/s (1.01 eV) |

*[1]Oxygen bonded to three In atoms and one Zn atom

As described above, in the case where a $V_OF$ which might be formed in an oxide semiconductor and a $V_OH$ which might be formed in an oxide semiconductor are compared, the $V_OF$ exists more stably than the $V_OH$. Therefore, an oxide semiconductor including fluorine is preferably used as a source region and a drain region which function as n-type regions in comparison with an oxide semiconductor including hydrogen because less change occurs in resistance of the n-type regions and a highly reliable semiconductor device can be provided.

The structures described in this embodiment can be combined as appropriate with any of the structures described in the other embodiments.

(Embodiment 3)

In this embodiment, the structure and the like of an oxide semiconductor will be described with reference to FIGS. 37A to 37E, FIGS. 38A to 38E, FIGS. 39A to 39D, FIGS. 40A and 40B, and FIG. 41.

<3-1. Structure of Oxide Semiconductor>

An oxide semiconductor is classified into a single-crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of the crystalline oxide semiconductor include a single-crystal oxide semiconductor, a CAAC-OS, a polycrystalline oxide semiconductor, and an nc-OS.

An amorphous structure is generally thought to be isotropic and have no non-uniform structure, to be metastable and have no fixed atomic arrangement, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that includes a void. Because of its instability, an a-like OS has physical properties similar to those of an amorphous oxide semiconductor.

<3-2. CAAC-OS>

First, a CAAC-OS will be described.

A CAAC-OS is one of oxide semiconductors and has a plurality of c-axis aligned crystal parts (also referred to as pellets).

Figure 37A:
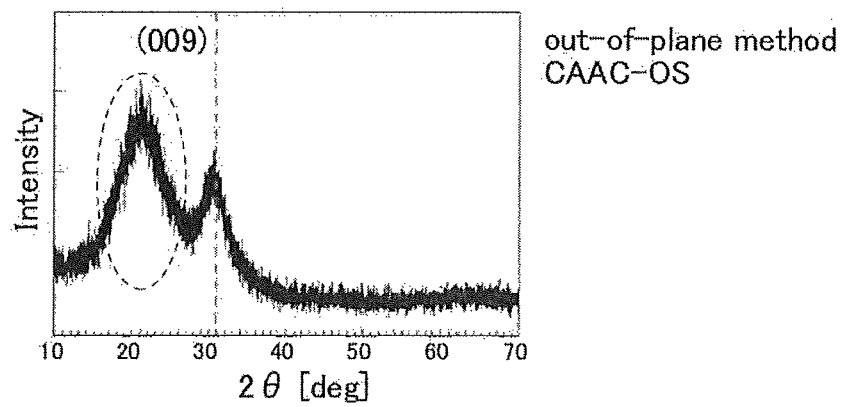
FIGS. 37A to 37E show structural analysis of a CAAC-OS and a single crystal oxide semiconductor by XRD and selected-area electron diffraction patterns of a CAAC-OS.

Analysis of a CAAC-OS by X-ray diffraction (XRD) will be described. For example, when the structure of a CAAC-OS including an InGaZnO$_4$ crystal, which is classified into the space group R-3m, is analyzed by an out-of-plane method, a peak appears at a diffraction angle (2θ) of around 31° as shown in FIG. 37A. This peak is derived from the (009) plane of the InGaZnO$_4$ crystal, which indicates that crystals in the CAAC-OS have c-axis alignment and that the c-axes are aligned in the direction substantially perpendicular to a surface over which the CAAC-OS is formed (also referred to as a formation surface) or a top surface of the CAAC-OS. Note that a peak sometimes appears at 2θ of around 36° in addition to the peak at 2θ of around 31°. The peak at 2θ of around 36° is attributed to a crystal structure classified into the space group Fd-3m; thus, this peak is preferably not exhibited in the CAAC-OS.

Figure 37B:
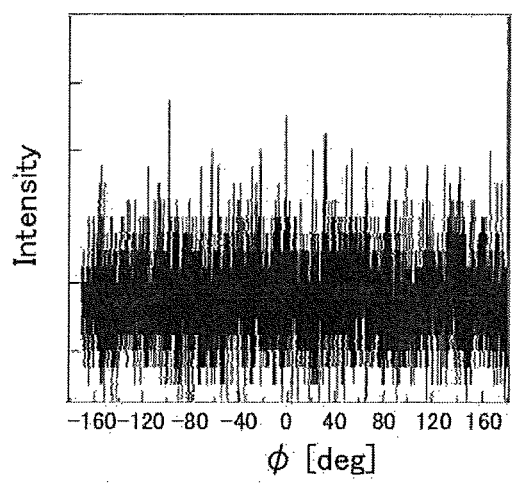
Figure 37C:
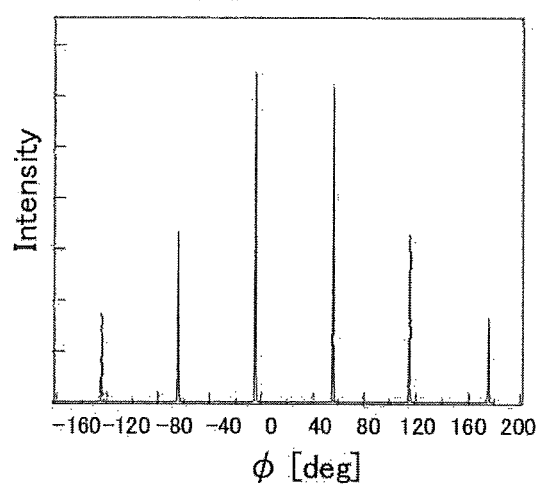
Figure 37D:
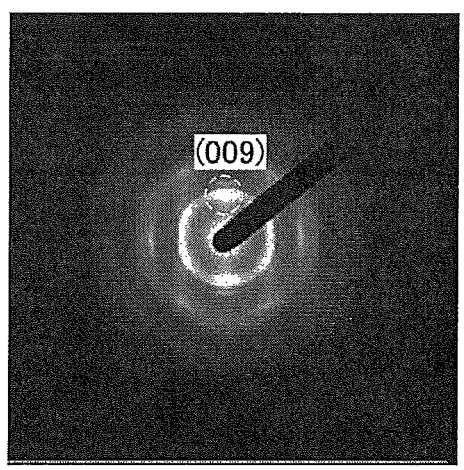

On the other hand, in structural analysis of the CAAC-OS by an in-plane method in which an X-ray is incident on the CAAC-OS in the direction parallel to the formation surface, a peak appears at 2θ of around 56°. This peak is derived from the (110) plane of the InGaZnO$_4$ crystal. When analysis (φ scan) is performed with 2θ fixed at around 56° while the sample is rotated around a normal vector to the sample surface as an axis (φ axis), as shown in FIG. 37B, a peak is not clearly observed. In contrast, in the case where single-crystal InGaZnO$_4$ is subjected to φ scan with 2θ fixed at around 56°, as shown in FIG. 37C, six peaks which are derived from crystal planes equivalent to the (110) plane are observed. Accordingly, the structural analysis using XRD shows that the directions of the a-axes and b-axes are irregularly oriented in the CAAC-OS.

Figure 37E:
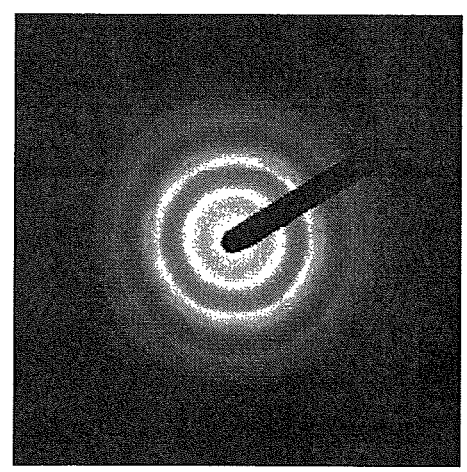

Next, a CAAC-OS analyzed by electron diffraction will be described. For example, when an electron beam with a probe diameter of 300 nm is incident on a CAAC-OS including an InGaZnO$_4$ crystal in the direction parallel to the formation surface of the CAAC-OS, a diffraction pattern (also referred to as a selected-area electron diffraction pattern) in FIG. 37D can be obtained. This diffraction pattern includes spots derived from the (009) plane of the InGaZnO$_4$ crystal. Thus, the results of electron diffraction also indicate that pellets included in the CAAC-OS have c-axis alignment and that the c-axes are aligned in the direction substantially perpendicular to the formation surface or the top surface of the CAAC-OS. Meanwhile, FIG. 37E shows a diffraction pattern obtained in such a manner that an electron beam with a probe diameter of 300 nm is incident on the same sample in the direction perpendicular to the sample surface. In FIG. 37E, a ring-like diffraction pattern is observed. Thus, the results of electron diffraction using an electron beam with a probe diameter of 300 nm also indicate that the a-axes and b-axes of the pellets included in the CAAC-OS do not have regular alignment. The first ring in FIG. 37E is derived from the (010) plane, the (100) plane, and the like of the InGaZnO$_4$ crystal. The second ring in FIG. 37E is derived from the (110) plane and the like.

In a combined analysis image (also referred to as a high-resolution transmission electron microscope (TEM) image) of a bright-field image and a diffraction pattern of a CAAC-OS, which is obtained using a TEM, a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 38A:
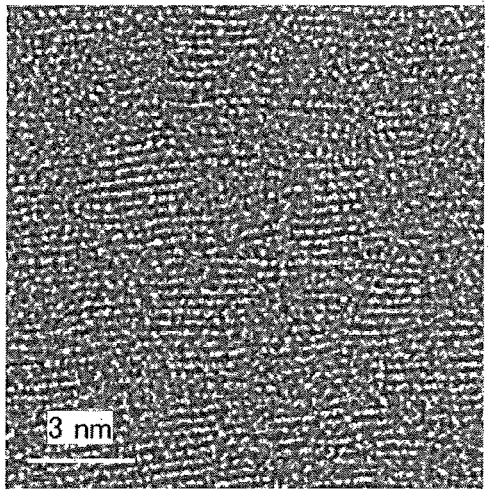
FIGS. 38A to 38E show a cross-sectional TEM image and plan-view TEM images of a CAAC-OS and images obtained through analysis thereof.

FIG. 38A shows a high-resolution TEM image of a cross section of the CAAC-OS which is observed in the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 38A shows pellets in which metal atoms are arranged in a layered manner. FIG. 38A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS and is parallel to the formation surface or the top surface of the CAAC-OS.

Figure 38B:
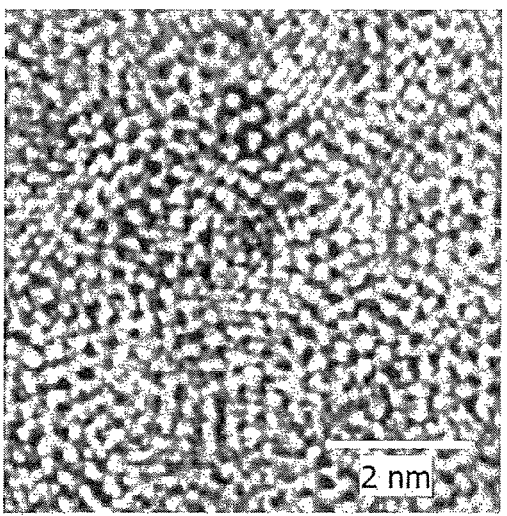
Figure 38C:
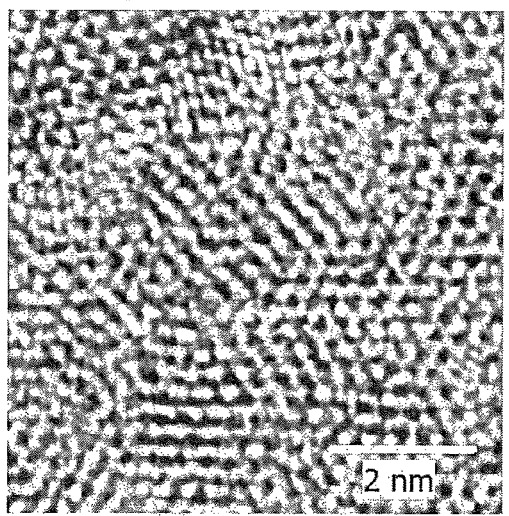
Figure 38D:
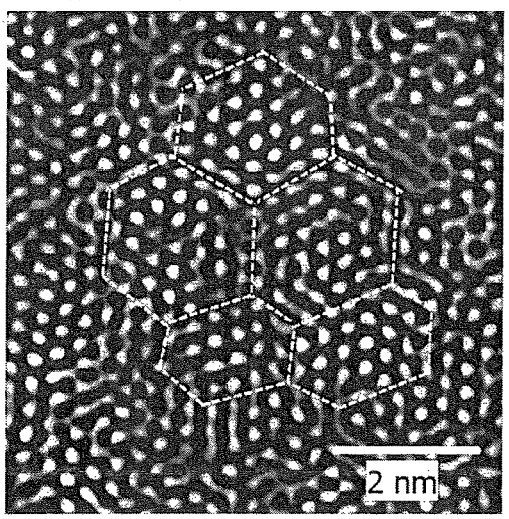
Figure 38E:
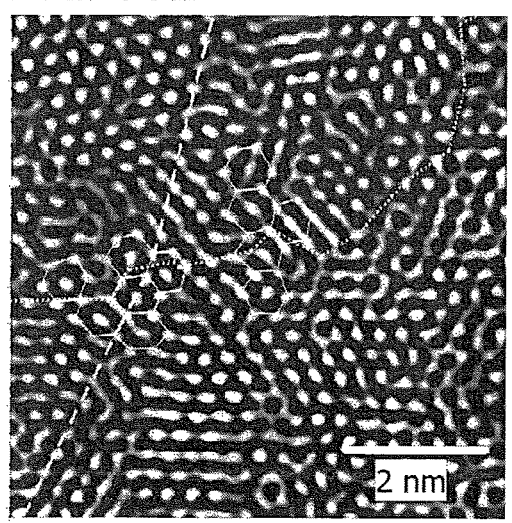

FIGS. 38B and 38C show Cs-corrected high-resolution TEM images of a plane of the CAAC-OS observed in the direction substantially perpendicular to the sample surface. FIGS. 38D and 38E are images obtained by image processing of FIGS. 38B and 38C. The method of image processing is as follows. The image in FIG. 38B is subjected to fast Fourier transform (FFT) to obtain an FFT image. Then, mask processing is performed on the obtained FFT image such that part in the range from 2.8 nm$^{-1}$ to 5.0 nm$^{-1}$ from the reference point is left. After the mask processing, the FFT image is subjected to inverse fast Fourier transform (IFFT) to obtain a processed image. The image obtained in this manner is referred to as an FFT filtering image. The FFT filtering image is a Cs-corrected high-resolution TEM image from which a periodic component is extracted and shows a lattice arrangement.

In FIG. 38D, a portion in which the lattice arrangement is broken is shown by dashed lines. A region surrounded by dashed lines corresponds to one pellet. The portion denoted by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 38E, a dotted line denotes a portion where the direction of a lattice arrangement changes between a region with a well lattice arrangement and another region with a well lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, a distorted pentagon, or a distorted heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in the a-b plane direction, and its crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has few impurities and defects (e.g., oxygen vacancies).

Note that an impurity means an element other than the main components of an oxide semiconductor, such as hydrogen, carbon, silicon, or a transition metal element. For example, an element (e.g., silicon) having stronger bonding force to oxygen than a metal element constituting a part of an oxide semiconductor extracts oxygen from the oxide semiconductor, which results in a disordered atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, an oxygen vacancy in the oxide semiconductor might serve as a carrier trap or serve as a carrier generation source when hydrogen is captured therein.

The CAAC-OS having few impurities and oxygen vacancies is an oxide semiconductor with a low carrier density (specifically, lower than $8 \times 10^{11}$/cm$^3$, preferably lower than $1 \times 10^{11}$/cm$^3$, further preferably lower than $1 \times 10^{10}$/cm$^3$, and higher than or equal to $1 \times 10^{-9}$/cm$^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be regarded as an oxide semiconductor having stable characteristics.

<3-3. nc-OS>

Next, an nc-OS will be described.

Analysis of an nc-OS by XRD will be described. When the structure of an nc-OS is analyzed by an out-of-plane method, a peak indicating orientation does not appear. That is, a crystal of an nc-OS does not have orientation.

Figure 39A:
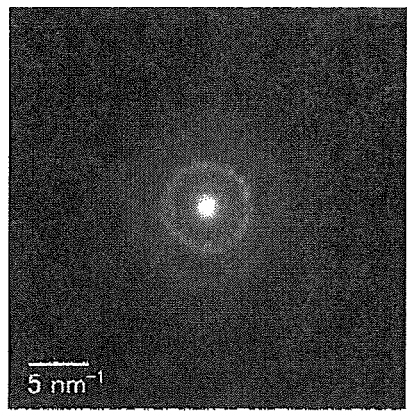
FIGS. 39A to 39D show electron diffraction patterns and a cross-sectional TEM image of an nc-OS.
Figure 39B:
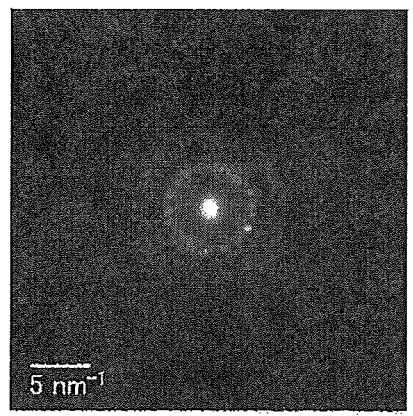

For example, when an electron beam with a probe diameter of 50 nm is incident on a 34-nm-thick region of a thinned nc-OS including an InGaZnO$_4$ crystal in the direction parallel to the formation surface, a ring-like diffraction pattern (nanobeam electron diffraction pattern) shown in FIG. 39A is observed. FIG. 39B shows a diffraction pattern (nanobeam electron diffraction pattern) obtained when an electron beam with a probe diameter of 1 nm is incident on the same sample. In FIG. 39B, a plurality of spots are observed in a ring-like region. Thus, ordering in an nc-OS is not observed with an electron beam with a probe diameter of 50 nm but is observed with an electron beam with a probe diameter of 1 nm.

Figure 39C:
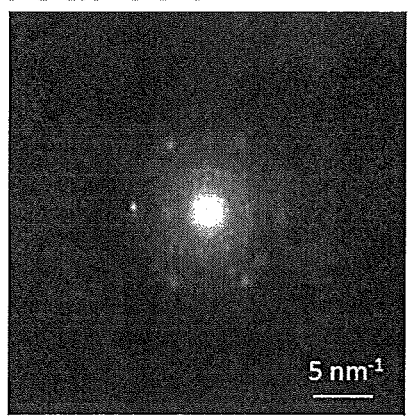

When an electron beam with a probe diameter of 1 nm is incident on a region with a thickness less than 10 nm, an electron diffraction pattern in which spots are arranged in an approximately hexagonal shape as shown in FIG. 39C is observed in some cases. This means that an nc-OS has a well-ordered region, that is, a crystal, in the thickness range of less than 10 nm. Note that an electron diffraction pattern having regularity is not observed in some regions because crystals are aligned in various directions.

Figure 39D:
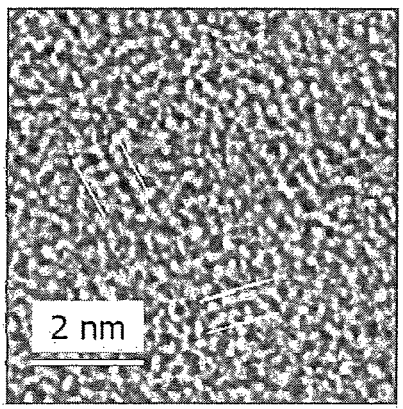

FIG. 39D shows a Cs-corrected high-resolution TEM image of a cross section of an nc-OS observed in the direction substantially parallel to the formation surface. In the high-resolution TEM image, the nc-OS has a region in which a crystal part is observed as indicated by additional lines and a region in which a crystal part is not clearly observed. In most cases, the size of a crystal part included in the nc-OS is greater than or equal to 1 nm and less than or equal to 10 nm, specifically greater than or equal to 1 nm and less than or equal to 3 nm. Note that an oxide semiconductor including a crystal part whose size is greater than 10 nm and less than or equal to 100 nm may be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, in some cases, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS.

<3-4. a-like OS>

An a-like OS has a structure between the structure of an nc-OS and the structure of an amorphous oxide semiconductor.

FIGS. 40A and 40B show high-resolution cross-sectional TEM images of an a-like OS. The high-resolution cross-sectional TEM image of the a-like OS in FIG. 40A is taken at the start of the electron irradiation. The high-resolution cross-sectional TEM image of the a-like OS in FIG. 40B is taken after the irradiation with electrons (e$^-$) at $4.3 \times 10^8$ e$^-$/nm$^2$. FIGS. 40A and 40B show that striped bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it includes a void. To verify that an a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion in which the spacing between lattice fringes is greater than or equal to 0.28 nm and less than or equal to 0.30 nm is regarded as a crystal part of InGaZnO$_4$ in the following description. Each lattice fringe corresponds to the a-b plane of the InGaZnO$_4$ crystal.

Figure 41:
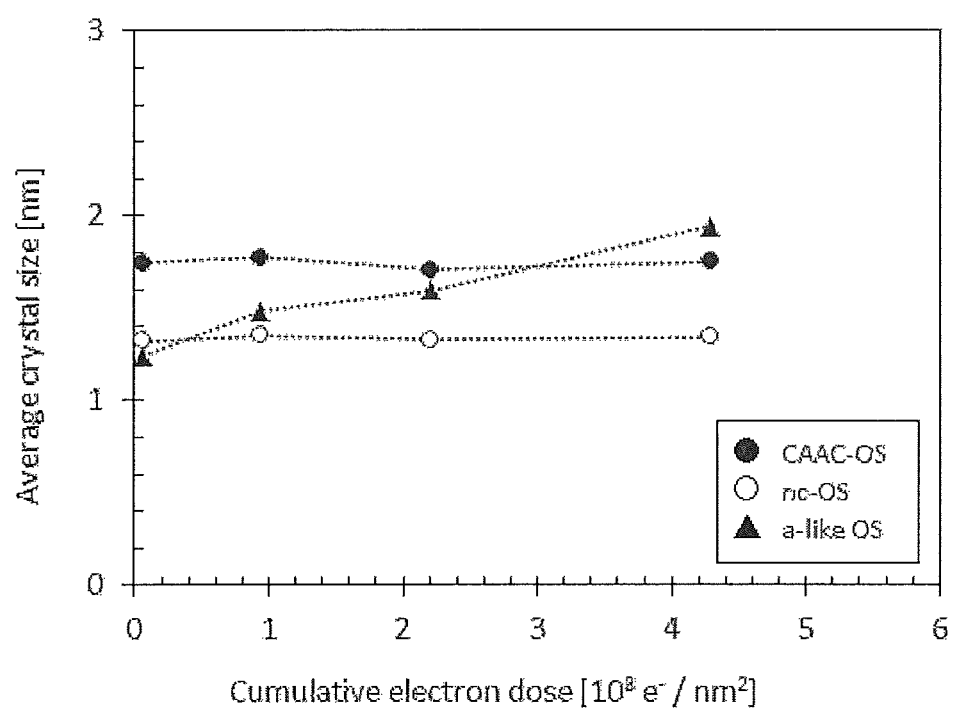
FIG. 41 shows a change in a crystal part of an In—Ga—Zn oxide induced by electron irradiation.

FIG. 41 shows a change in the average size of crystal parts (at 22 points to 30 points) in each sample. Note that the crystal part size corresponds to the length of a lattice fringe. FIG. 41 indicates that the crystal part size in the a-like OS increases with an increase in the cumulative electron dose in obtaining TEM images, for example. As shown in FIG. 41, a crystal part with a size of approximately 1.2 nm (also referred to as an initial nucleus) at the start of TEM observation grows to a size of approximately 1.9 nm at a cumulative electron (e$^-$) dose of $4.2 \times 10^8$ e$^-$/nm$^2$. In contrast, the crystal part sizes in the nc-OS and the CAAC-OS show few changes from the start of electron irradiation to a cumulative electron dose of $4.2 \times 10^8$ e$^-$/nm$^2$. As shown in FIG. 41, the crystal part sizes in the nc-OS and the CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of the electron beam irradiation were as follows: the accelerating voltage was 300 kV; the current density was $6.7 \times 10^5$ e$^-$/(nm$^2$·s); and the diameter of an irradiation region was 230 nm.

In this manner, growth of the crystal part in the a-like OS may be induced by electron irradiation. In contrast, in the nc-OS and the CAAC-OS, growth of the crystal part is hardly induced by electron irradiation. That is, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single-crystal oxide semiconductor having the same composition. The density of the nc-OS and the density of the CAAC-OS are each higher than or equal to 92.3% and lower than 100% of the density of the single-crystal oxide semiconductor having the same composition. It is difficult to deposit an oxide semiconductor having a density lower than 78% of the density of the single-crystal oxide semiconductor.

For example, in the case of an oxide semiconductor whose atomic ratio of In to Ga and Zn is 1:1:1, the density of single-crystal $InGaZnO_4$ with a rhombohedral crystal structure is 6.357 $g/cm^3$. Accordingly, in the case of the oxide semiconductor whose atomic ratio of In to Ga and Zn is 1:1:1, the density of the a-like OS is higher than or equal to 5.0 $g/cm^3$ and lower than 5.9 $g/cm^3$, for example. In the case of the oxide semiconductor whose atomic ratio of In to Ga and Zn is 1:1:1, the density of the nc-OS and the density of the CAAC-OS are each higher than or equal to 5.9 $g/cm^3$ and lower than 6.3 $g/cm^3$, for example.

In the case where an oxide semiconductor having a certain composition does not exist in a single-crystal state, single-crystal oxide semiconductors with different compositions are combined at an adequate ratio, which makes it possible to calculate a density equivalent to that of a single-crystal oxide semiconductor with the desired composition. The density of a single-crystal oxide semiconductor having the desired composition may be calculated using a weighted average with respect to the combination ratio of the single-crystal oxide semiconductors with different compositions. Note that it is preferable to use as few kinds of single-crystal oxide semiconductors as possible to calculate the density.

As described above, oxide semiconductors have various structures and various properties. Note that an oxide semiconductor may be a stacked film including two or more of an amorphous oxide semiconductor, an a-like OS, an nc-OS, and a CAAC-OS, for example.

The structures described in this embodiment can be combined as appropriate with any of the structures described in the other embodiments.

(Embodiment 4)

In this embodiment, an example of a display device that includes the transistor described in the above embodiment will be described below with reference to FIG. 42, FIG. 43, and FIG. 44.

Figure 42:
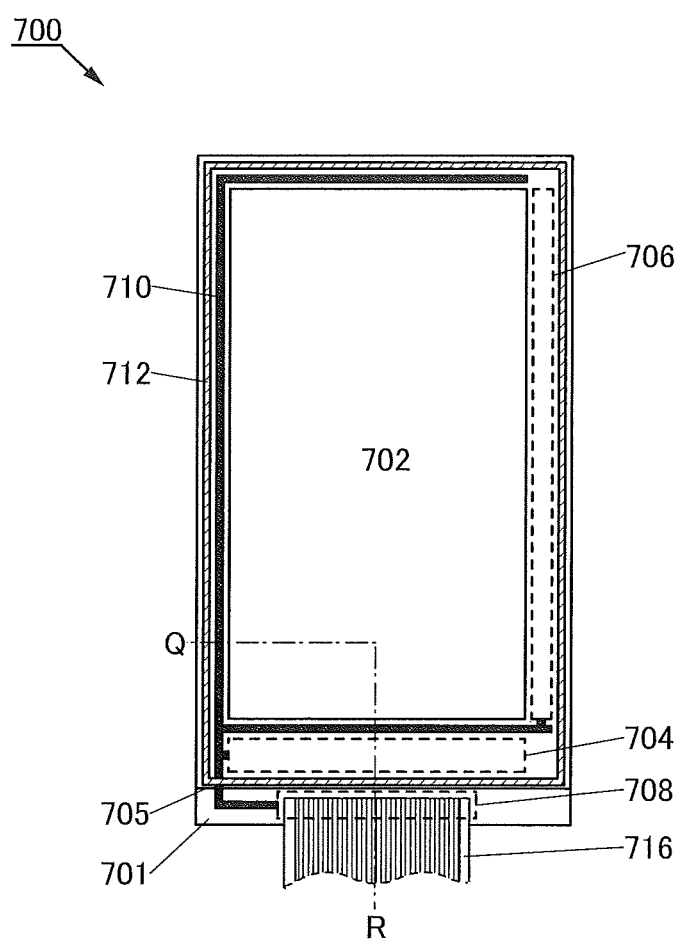
FIG. 42 is a top view illustrating one embodiment of a display device.

FIG. 42 is a top view illustrating an example of a display device. A display device 700 in FIG. 42 includes a pixel portion 702 provided over a first substrate 701, a source driver circuit portion 704 and a gate driver circuit portion 706 which are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Although not illustrated in FIG. 42, a display element is provided between the first substrate 701 and the second substrate 705.

In the display device 700, a flexible printed circuit (FPC) terminal portion 708 which is electrically connected to the pixel portion 702, the source driver circuit portion 704, and the gate driver circuit portion 706 is provided in a region different from the region which is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. The structure of the display device 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single-crystal semiconductor film or a polycrystalline semiconductor film) may be mounted on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are semiconductor devices of embodiments of the present invention can be used.

The display device 700 can include a variety of elements. As examples of the elements, electroluminescent (EL) element (e.g., an EL element containing organic and inorganic materials, an organic EL element, an inorganic EL element, or an LED), a light-emitting transistor element (a transistor which emits light depending on current), an electron emitter, a liquid crystal element, an electronic ink display, an electrophoretic element, an electrowetting element, a plasma display panel (PDP), a micro electro mechanical systems (MEMS) display (e.g., a grating light valve (GLV), a digital micromirror device (DMD), a digital micro shutter (DMS) element, or an interferometric modulator display (IMOD) element), and a piezoelectric ceramic display can be given.

An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an electronic ink display or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display device 700, a progressive system, an interlace system, or the like can be employed. Furthermore, color elements controlled in pixels at the time of color display are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ between color elements. Alternatively, one or more colors of yellow, cyan, magenta, and the like may be added to RGB. Note that the size of a display region may differ between dots of color elements. One embodiment of the disclosed invention is not limited to a color display device; the disclosed invention can also be applied to a monochrome display device.

A coloring layer (also referred to as a color filter) may be used to obtain a full-color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be suppressed, and approximately 20% to 30% of power consumption can be reduced in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

In this embodiment, a structure including a liquid crystal element as a display element and a structure including an EL element as a display element will be described with reference to FIG. 43 and FIG. 44. FIG. 43 is a cross-sectional view taken along dashed-dotted line Q-R in FIG. 42 and illustrates the structure including a liquid crystal element as a display element. FIG. 44 is a cross-sectional view taken along dashed-dotted line Q-R in FIG. 42 and illustrates the structure including an EL element as a display element.

Portions common to FIG. 43 and FIG. 44 will be described first, and then, different portions will be described.

<4-1. Portions Common to Display Devices>

Figure 43:
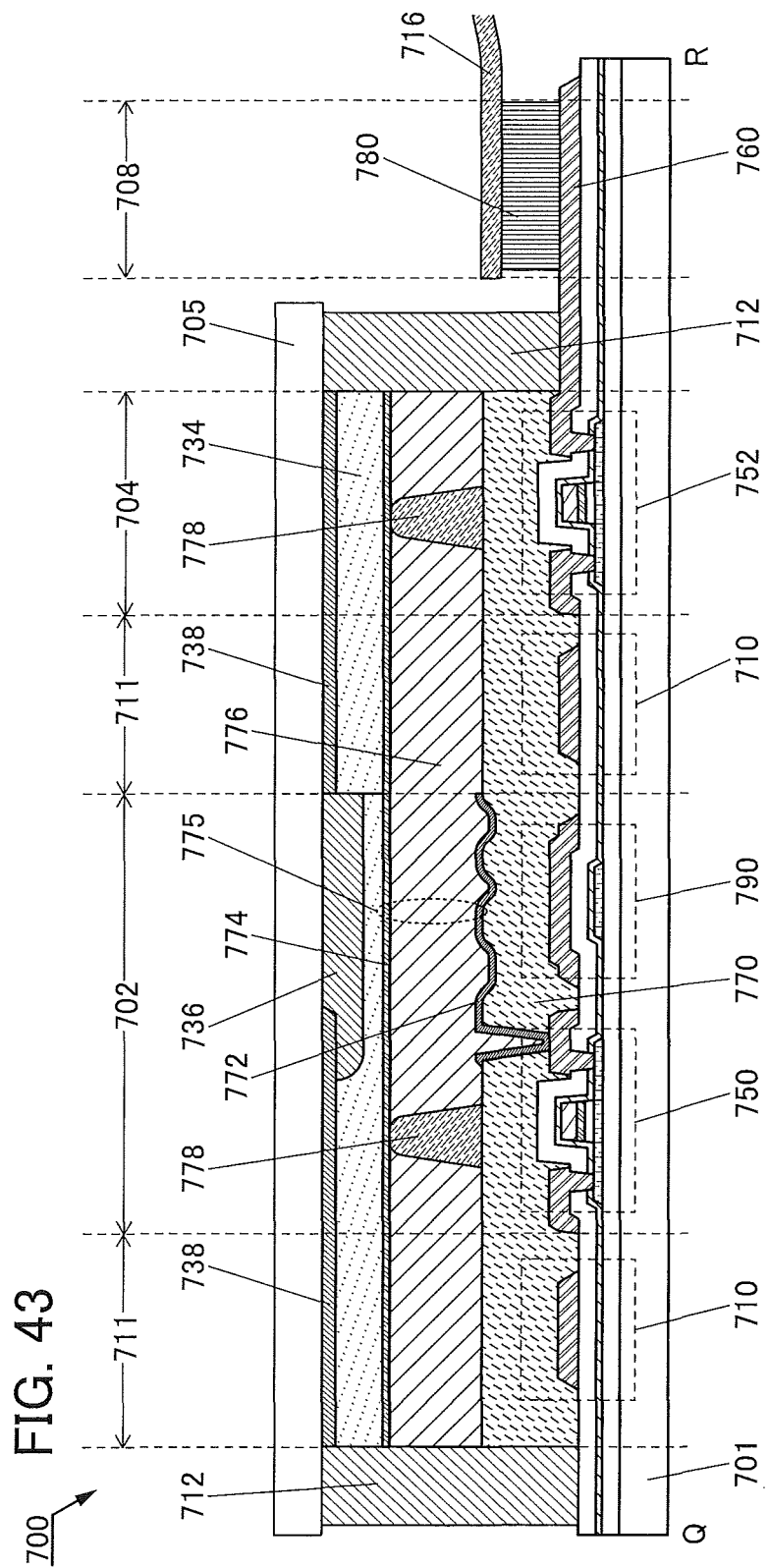
FIG. 43 is a cross-sectional view illustrating one embodiment of a display device.
Figure 44:
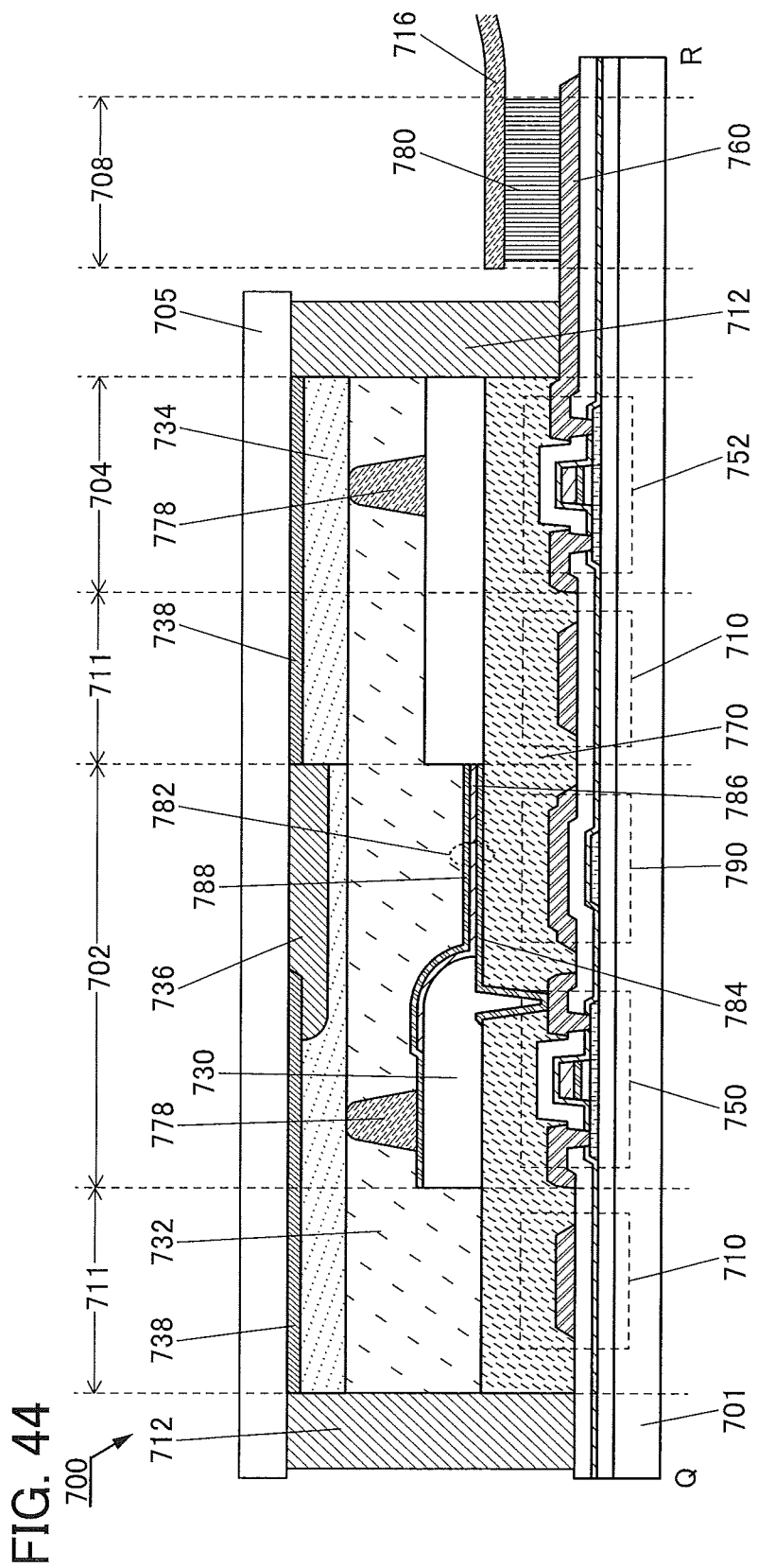
FIG. 44 is a cross-sectional view illustrating one embodiment of a display device.

The display device 700 in each of FIG. 43 and FIG. 44 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 100 described above. Note that the transistor 750 and the transistor 752 may each have the structure of any of the other transistors described in the above embodiments.

The transistor used in this embodiment includes an oxide semiconductor film which is highly purified and in which formation of an oxygen vacancy is suppressed. The transistor can have low off-state current. Accordingly, an electrical signal such as an image signal can be held for a long time, and a long writing interval can be set in an on state. Accordingly, the frequency of refresh operation can be reduced, which suppresses power consumption.

In addition, the transistor used in this embodiment can have relatively high field-effect mobility and thus is capable of high-speed operation. For example, in a liquid crystal display device which includes such a transistor capable of high-speed operation, a switching transistor in a pixel portion and a driver transistor in a driver circuit portion can be formed over one substrate. That is, no additional semiconductor device formed using a silicon wafer or the like is needed as a driver circuit; therefore, the number of components of the semiconductor device can be reduced. In addition, the transistor capable of high-speed operation can also be used in the pixel portion, whereby a high-quality image can be provided.

The capacitor 790 includes a lower electrode and an upper electrode. The lower electrode is formed through a step of processing the same oxide semiconductor film as the oxide semiconductor film included in the transistor 750. The upper electrode is formed through a step of processing the same conductive film as a conductive film functioning as a source electrode and a drain electrode of the transistor 750. Between the lower electrode and the upper electrode, an insulating film formed through a step of forming the same insulating film as a third insulating film and a fourth insulating film included in the transistor 750 is provided. That is, the capacitor 790 has a stacked-layer structure in which the insulating films functioning as a dielectric are positioned between the pair of electrodes.

In FIG. 43 and FIG. 44, a planarization insulating film 770 is provided over the transistor 750, the transistor 752, and the capacitor 790.

The planarization insulating film 770 can be formed using a heat-resistant organic material such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed using any of these materials. A structure without the planarization insulating film 770 may also be employed.

Although FIG. 43 and FIG. 44 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors.

In the case where the pixel portion 702 and the source driver circuit portion 704 include different transistors, any of the staggered transistors described in Embodiment 1 and an inverted staggered transistor may be used in combination. Specifically, a structure in which a staggered transistor is used in the pixel portion 702 and an inverted staggered transistor is used in the source driver circuit portion 704, or a structure in which an inverted staggered transistor is used in the pixel portion 702 and a staggered transistor is used in the source driver circuit portion 704 may be employed. Note that the term "source driver circuit portion 704" can be replaced by the term "gate driver circuit portion".

FIGS. 45A to 45C, FIGS. 46A to 46C, FIGS. 47A to 47C, FIGS. 48A to 48C, and FIGS. 49A to 49D illustrate examples of an inverted staggered transistor that can be used in the pixel portion 702 or the source driver circuit portion 704.

Figure 45A:
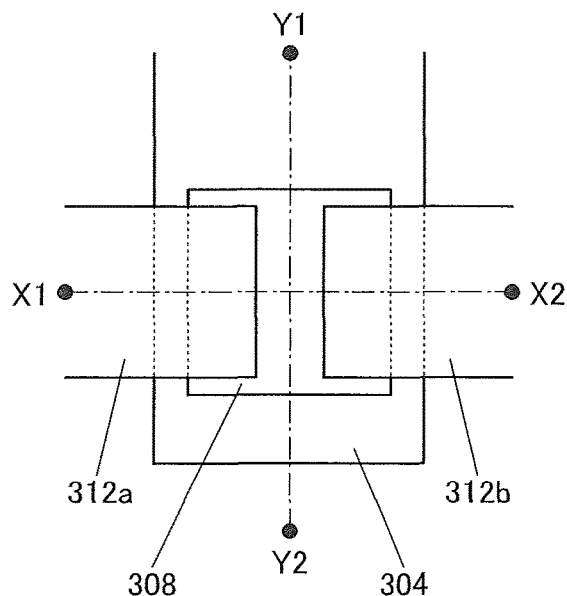
FIGS. 45A to 45C are a top view and cross-sectional views illustrating one embodiment of a semiconductor device.
Figure 45B:
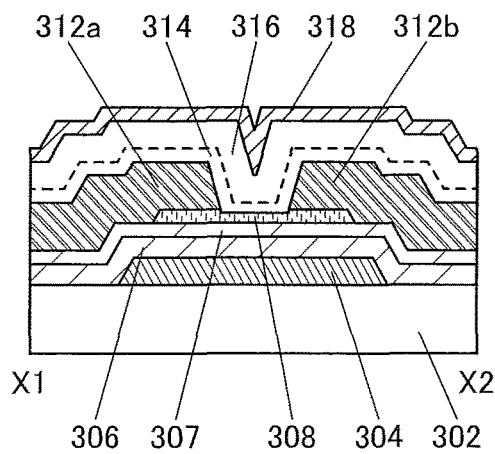
Figure 45C:
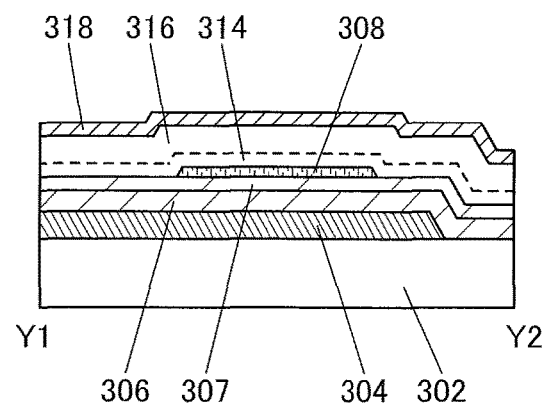

FIG. 45A is a top view of a transistor 300A. FIG. 45B is a cross-sectional view taken along dashed-dotted line X1-X2 in FIG. 45A. FIG. 45C is a cross-sectional view taken along dashed-dotted line Y1-Y2 in FIG. 45A. Note that in FIG. 45A, some components of the transistor 300A (e.g., an insulating film functioning as a gate insulating film) are not illustrated to avoid complexity. The direction of dashed-dotted line X1-X2 may be referred to as a channel length direction, and the direction of dashed-dotted line Y1-Y2 may be referred to as a channel width direction. As in FIG. 45A, some components are not illustrated in some cases in top views of transistors described below.

The transistor 300A includes a conductive film 304 functioning as a gate electrode over a substrate 302, an insulating film 306 over the substrate 302 and the conductive film 304, an insulating film 307 over the insulating film 306, an oxide semiconductor film 308 over the insulating film 307, a conductive film 312*a* functioning as a source electrode electrically connected to the oxide semiconductor film 308, and a conductive film 312*b* functioning as a drain electrode electrically connected to the oxide semiconductor film 308. Over the transistor 300A, specifically, over the conductive films 312*a* and 312*b* and the oxide semiconductor film 308, an insulating film 314, an insulating film 316, and an insulating film 318 are provided. The insulating films 314, 316, and 318 function as a protective insulating film for the transistor 300A.

Figure 46A:
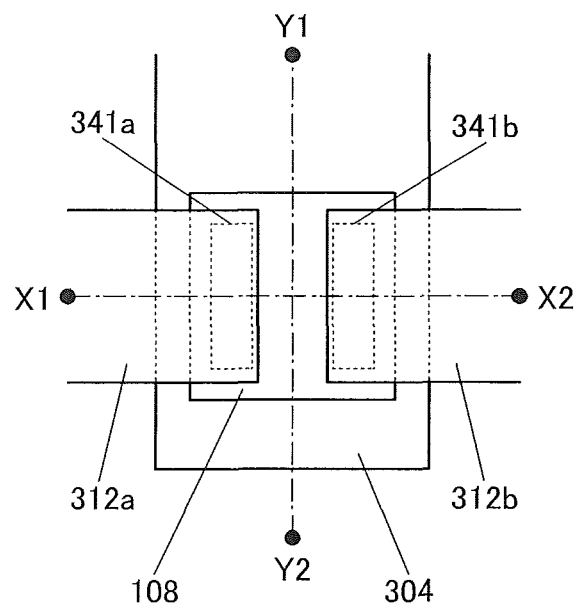
FIGS. 46A to 46C are a top view and cross-sectional views illustrating one embodiment of a semiconductor device.
Figure 46B:
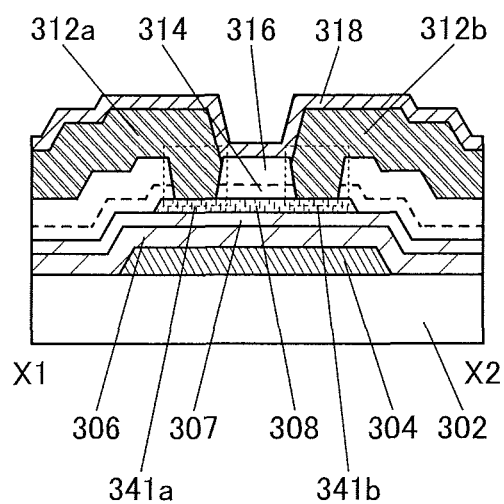
Figure 46C:
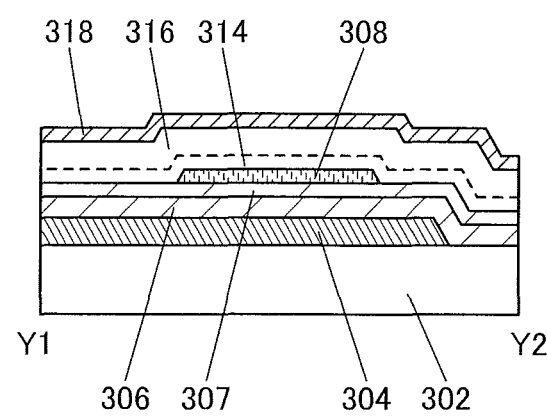

FIG. 46A is a top view of a transistor 300B. FIG. 46B is a cross-sectional view taken along dashed-dotted line X1-X2 in FIG. 46A. FIG. 46C is a cross-sectional view taken along dashed-dotted line Y1-Y2 in FIG. 46A.

The transistor 300B includes the conductive film 304 functioning as a gate electrode over the substrate 302, the insulating film 306 over the substrate 302 and the conductive film 304, the insulating film 307 over the insulating film 306, the oxide semiconductor film 308 over the insulating film 307, the insulating film 314 over the oxide semiconductor film 308, the insulating film 316 over the insulating film 314, the conductive film 312*a* functioning as a source electrode, and the conductive film 312*b* functioning as a drain electrode. The conductive film 312*a* is electrically connected to the oxide semiconductor film 308 through an opening 341*a* provided in the insulating films 314 and 316. The conductive film 312*b* is electrically connected to the oxide semiconductor film 308 through an opening 341*b* provided in the insulating films 314 and 316. Over the transistor 300B, specifically, over the conductive films 312*a* and 312*b* and the insulating film 316, the insulating film 318 is provided. The insulating films 314 and 316 function as a protective insulating film for the oxide semiconductor film 308. The insulating film 318 functions as a protective insulating film for the transistor 300B.

The transistor 300A has a channel-etched structure, whereas the transistor 300B in FIGS. 46A to 46C has a channel-protective structure.

Figure 47A:
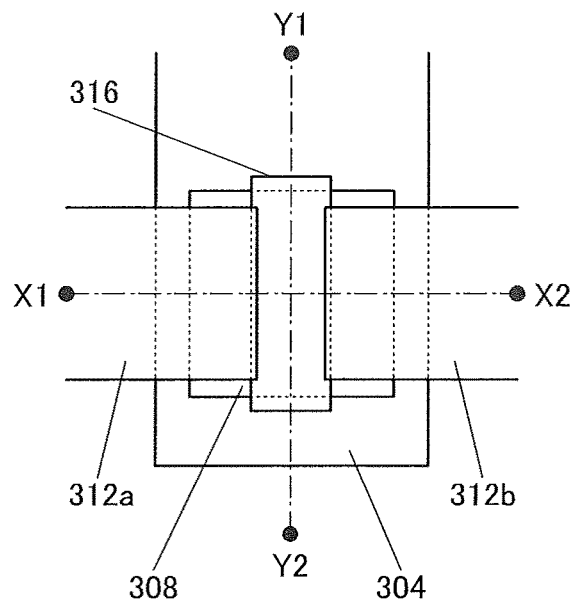
FIGS. 47A to 47C are a top view and cross-sectional views illustrating one embodiment of a semiconductor device.
Figure 47B:
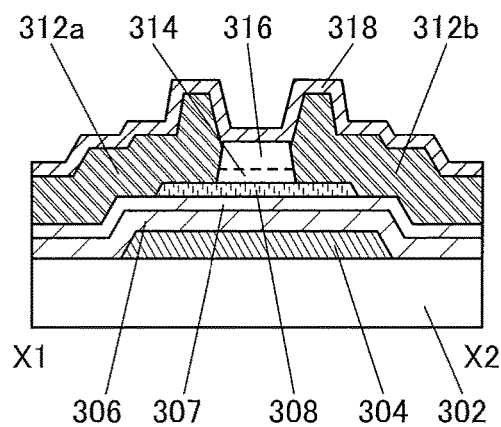
Figure 47C:
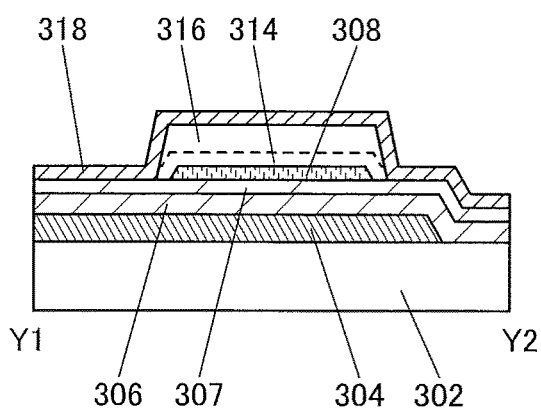

FIG. 47A is a top view of a transistor 300C. FIG. 47B is a cross-sectional view taken along dashed-dotted line X1-X2 in FIG. 47A. FIG. 47C is a cross-sectional view taken along dashed-dotted line Y1-Y2 in FIG. 47A.

The transistor 300C is different from the transistor 300B in FIGS. 46A to 46C in the shapes of the insulating films 314 and 316. Specifically, the insulating films 314 and 316 of the transistor 300C have island shapes and are provided over a channel region of the oxide semiconductor film 308. Other components are similar to those of the transistor 300B.

Figure 48A:
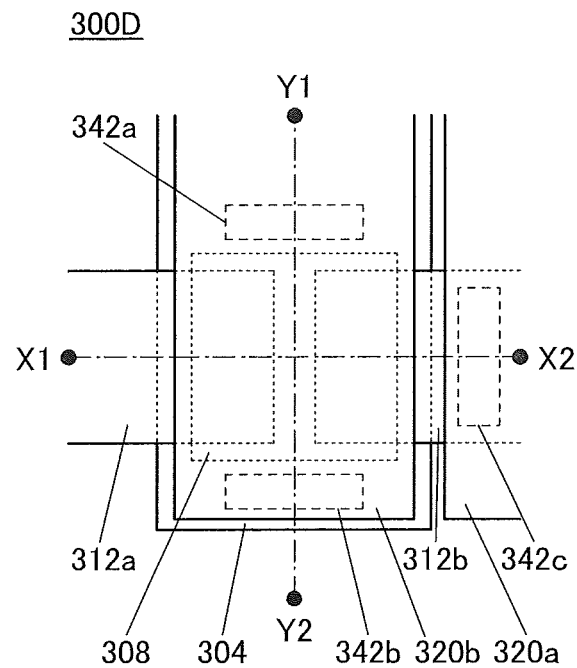
FIGS. 48A to 48C are a top view and cross-sectional views illustrating one embodiment of a semiconductor device.
Figure 48B:
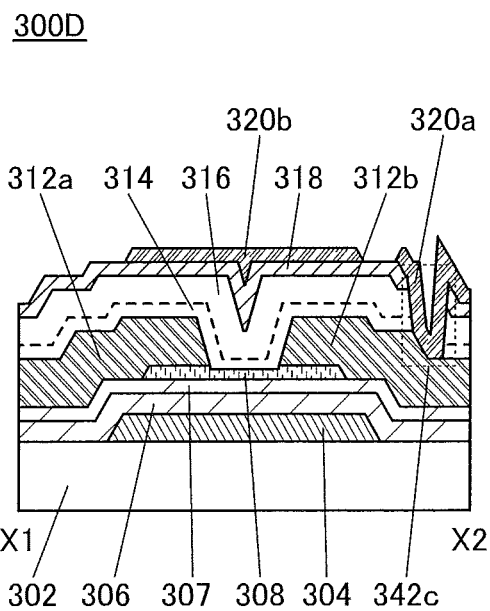
Figure 48C:
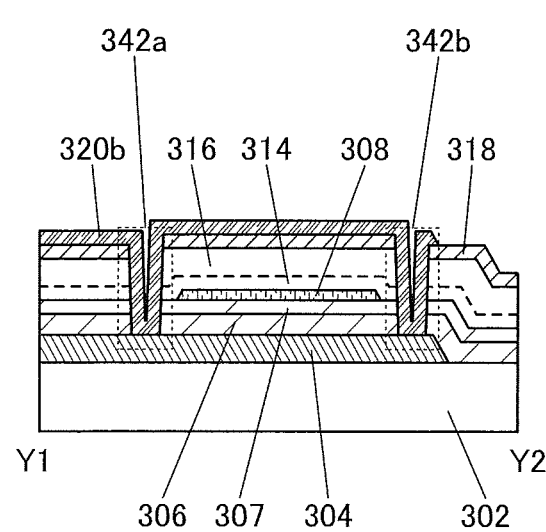

FIG. 48A is a top view of a transistor 300D. FIG. 48B is a cross-sectional view taken along dashed-dotted line X1-X2 in FIG. 48A. FIG. 48C is a cross-sectional view taken along dashed-dotted line Y1-Y2 in FIG. 48A.

The transistor 300D includes the conductive film 304 functioning as a first gate electrode over the substrate 302, the insulating film 306 over the substrate 302 and the conductive film 304, the insulating film 307 over the insulating film 306, the oxide semiconductor film 308 over the insulating film 307, the insulating film 314 over the oxide semiconductor film 308, the insulating film 316 over the insulating film 314, the conductive film 312*a* functioning as a source electrode, the conductive film 312*b* functioning as a drain electrode, the insulating film 318 over the conductive films 312*a* and 312*b* and the insulating film 316, and a conductive film 320*a* and a conductive film 320*b* over the insulating film 318. The conductive films 312*a* and 312*b* are electrically connected to the oxide semiconductor film 308.

In the transistor 300D, the insulating films 314, 316, and 318 function as a second gate insulating film of the transistor 300D. Furthermore, the conductive film 320*a* in the transistor 300D functions as a pixel electrode used for the display device. The conductive film 320*a* is connected to the conductive film 312*b* through an opening 342*c* provided in the insulating films 314, 316, and 318. In the transistor 300D, the conductive film 320*b* functions as a second gate electrode (also referred to as a back gate electrode).

As illustrated in FIG. 48C, the conductive film 320*b* is connected to the conductive film 304, which functions as the first gate electrode, in an opening 342*a* and an opening 342*b* provided in the insulating films 306, 307, 314, 316, and 318. Thus, the same potential is applied to the conductive film 320*b* and the conductive film 304.

The structure of the transistor 300D is not limited to that described above, in which the openings 342*a* and 342*b* are provided so that the conductive film 320*b* is connected to the conductive film 304. For example, a structure in which only one of the openings 342*a* and 342*b* is provided so that the conductive film 320*b* is connected to the conductive film 304, or a structure in which the conductive film 320*b* is connected to the conductive film 304 without providing the openings 342*a* and 342*b* may be employed. Note that in the case where the conductive film 320*b* is not connected to the conductive film 304, it is possible to apply different potentials to the conductive film 320*b* and the conductive film 304.

Note that the transistor 300D has the s-channel structure described above.

The oxide semiconductor film 308 included in the transistor 300A in FIGS. 45A to 45C may have a stacked-layer structure. FIGS. 49A to 49D illustrate examples of such a case.

Figure 49A:
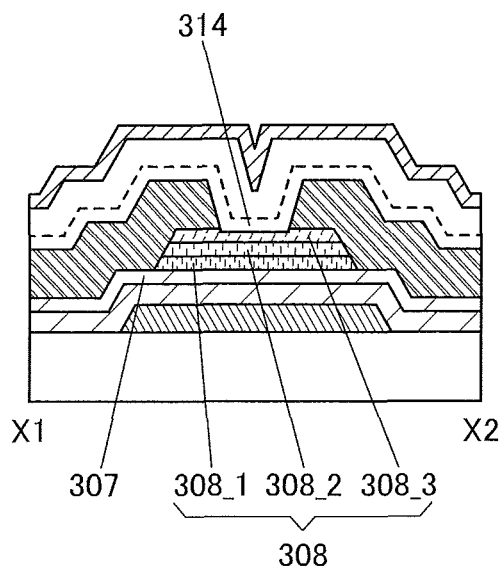
FIGS. 49A to 49D are cross-sectional views illustrating embodiments of a semiconductor device.
Figure 49B:
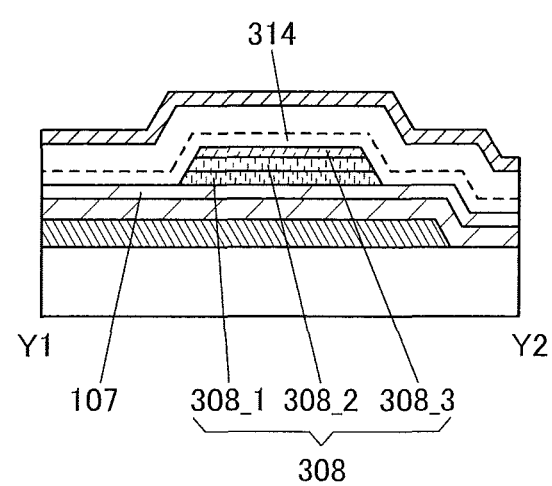
Figure 49C:
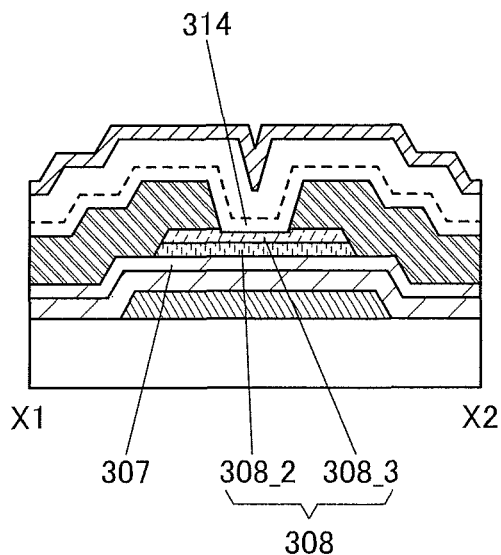
Figure 49D:
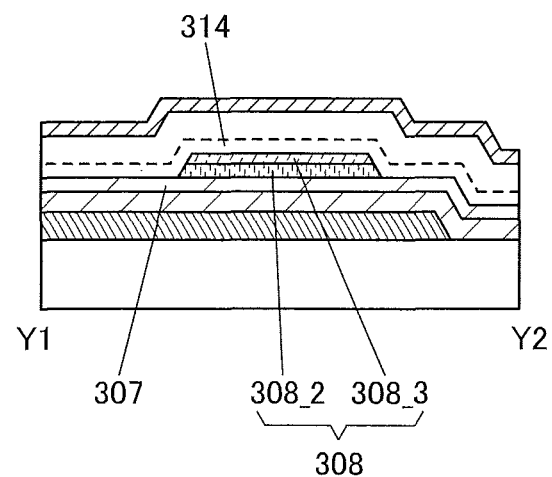

FIGS. 49A and 49B are cross-sectional views of a transistor 300E and FIGS. 49C and 49D are cross-sectional views of a transistor 300F. The top views of the transistors 300E and 300F are similar to that of the transistor 300A illustrated in FIG. 45A.

The oxide semiconductor film 308 of the transistor 300E illustrated in FIGS. 49A and 49B includes an oxide semiconductor film 308_1, an oxide semiconductor film 308_2, and an oxide semiconductor film 308_3. The oxide semiconductor film 308 of the transistor 300F illustrated in FIGS. 49C and 49D includes the oxide semiconductor film 308_2 and the oxide semiconductor film 308_3.

Note that the conductive film 304, the insulating film 306, the insulating film 307, the oxide semiconductor film 308, the conductive film 312a, the conductive film 312b, the insulating film 314, the insulating film 316, the insulating film 318, and the conductive films 320a and 320b can be formed using the materials and formation methods of the conductive film 114, the insulating film 116, the insulating film 110, the oxide semiconductor film 108, the conductive film 120a, the conductive film 120b, the insulating film 104, the insulating film 118, the insulating film 116, and the conductive film 114, respectively, described in Embodiment 1.

The structures of the transistors 300A to 300F can be freely combined with each other.

The signal line 710 is formed through the same process as the conductive films functioning as source electrodes and drain electrodes of the transistors 750 and 752. Note that the signal line 710 may be formed using a conductive film which is formed through a process different from the process of forming the source electrodes and the drain electrodes of the transistors 750 and 752. For example, an oxide semiconductor film formed through the same process as an oxide semiconductor film functioning as a gate electrode may be used. In the case where the signal line 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, glass substrates can be used as the first substrate 701 and the second substrate 705. As the first substrate 701 and the second substrate 705, flexible substrates may also be used. An example of the flexible substrate is a plastic substrate.

A structure 778 is provided between the first substrate 701 and the second substrate 705. The structure 778 is a columnar spacer obtained by selective etching of an insulating film and is provided to control the distance (cell gap) between the first substrate 701 and the second substrate 705. Alternatively, a spherical spacer may also be used as the structure 778.

A light-shielding film 738 functioning as a black matrix, a coloring film 736 functioning as a color filter, and an insulating film 734 in contact with the light-shielding film 738 and the coloring film 736 are provided on the second substrate 705 side.

<4-2. Structure Example of Display Device Including Liquid Crystal Element>

The display device 700 in FIG. 43 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 43 can display an image in such a manner that transmission or non-transmission of light is controlled by the alignment state in the liquid crystal layer 776 which is changed depending on the voltage applied between the conductive film 772 and the conductive film 774.

The conductive film 772 is connected to the conductive film functioning as the source electrode or the drain electrode of the transistor 750. The conductive film 772 is formed over the planarization insulating film 770 and functions as a pixel electrode, that is, one electrode of the display element. The conductive film 772 functions as a reflective electrode. The display device 700 in FIG. 43 is a reflective color liquid crystal display device which displays an image by utilizing external light that is reflected by the conductive film 772 and then extracted through the coloring film 736.

A conductive film that transmits visible light or a conductive film that reflects visible light can be used as the conductive film 772. For example, a material containing an element selected from indium (In), zinc (Zn), and tin (Sn) may be used for the conductive film that transmits visible light. For example, a material containing aluminum or silver may be used for the conductive film that reflects visible light. In this embodiment, a conductive film that reflects visible light is used as the conductive film 772.

Note that projections and depressions are provided in part of the planarization insulating film 770 in the pixel portion 702 of the display device 700 in FIG. 43. For example, the projections and depressions can be formed in the following manner: the planarization insulating film 770 is formed using a resin film, and projections and depressions are formed on the surface of the resin film. The conductive film 772 functioning as a reflective electrode is formed along the projections and depressions. Accordingly, external light that is incident on the conductive film 772 can be diffusely reflected by the surface of the conductive film 772, whereby visibility can be improved.

Note that the display device 700 is not limited to the example in FIG. 43, which illustrates a reflective color liquid crystal display device, and may be a transmissive color liquid crystal display device in which a conductive film that transmits visible light is used as the conductive film 772. In a transmissive color liquid crystal display device, projections and depressions are not necessarily provided on the planarization insulating film 770.

Although not illustrated in FIG. 43, alignment films may be provided on the conductive film 772 side in contact with the liquid crystal layer 776 and on the conductive film 774 side in contact with the liquid crystal layer 776. Although not illustrated in FIG. 43, an optical member (optical substrate) or the like, such as a polarizing member, a retardation member, or an anti-reflection member, may be provided as appropriate. For example, circular polarization may be obtained by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary, accordingly, electrostatic discharge damage caused by the rubbing treatment can be prevented, and defects and damage of a liquid crystal display device in the manufacturing process can be reduced. Moreover, the liquid crystal material which exhibits a blue phase has a small viewing angle dependence.

In the case where a liquid crystal element is used as a display element, a twisted nematic (TN) mode, an in-plane switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Furthermore, a normally black liquid crystal display device such as a vertical alignment (VA) mode transmissive liquid crystal display device may also be used. Examples of a possible vertical alignment mode include a multi-domain vertical alignment (MVA) mode, a patterned vertical alignment (PVA) mode, and an ASV mode.

<4-3. Display Device Including Light-emitting Element>

The display device 700 illustrated in FIG. 44 includes a light-emitting element 782. The light-emitting element 782 includes a conductive film 784, an EL layer 786, and a conductive film 788. The display device 700 illustrated in FIG. 44 can display an image by utilizing light emission from the EL layer 786 of the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

The conductive film 784 is connected to a conductive film functioning as a source electrode or a drain electrode of the transistor 750. The conductive film 784 is formed over the planarization insulating film 770 and functions as a pixel electrode, that is, one electrode of the display element. A conductive film that transmits visible light or a conductive film that reflects visible light can be used as the conductive film 784. For example, a material containing an element selected from indium (In), zinc (Zn), and tin (Sn) may be used for the conductive film that transmits visible light. For example, a material containing aluminum or silver may be used for the conductive film that reflects visible light.

In the display device 700 in FIG. 44, an insulating film 730 is provided over the planarization insulating film 770 and the conductive film 784. The insulating film 730 covers part of the conductive film 784. Note that the light-emitting element 782 has a top-emission structure. Therefore, the conductive film 788 has a light-transmitting property and transmits light emitted from the EL layer 786. Although the top-emission structure is described as an example in this embodiment, the structure is not limited thereto. For example, a bottom-emission structure in which light is emitted to the conductive film 784 side or a dual-emission structure in which light is emitted to both the conductive film 784 side and the conductive film 788 side may also be employed.

The coloring film 736 is provided to overlap with the light-emitting element 782, and the light-shielding film 738 is provided in the lead wiring portion 711 and the source driver circuit portion 704 to overlap with the insulating film 730. The coloring film 736 and the light-shielding film 738 are covered with the insulating film 734. A space between the light-emitting element 782 and the insulating film 734 is filled with a sealing film 732. The structure of the display device 700 is not limited to the example in FIG. 44, in which the coloring film 736 is provided. For example, a structure without the coloring film 736 may also be employed in the case where the EL layer 786 is formed by separate coloring.

The structures described in this embodiment can be combined as appropriate with any of the structures described in the other embodiments.

(Embodiment 5)

In this embodiment, an example of a circuit configuration of a semiconductor device which can hold stored data even when not powered and does not have a limitation on the number of write cycles will be described with reference to FIG. 50.

<5-1. Circuit Configuration>

Figure 50:
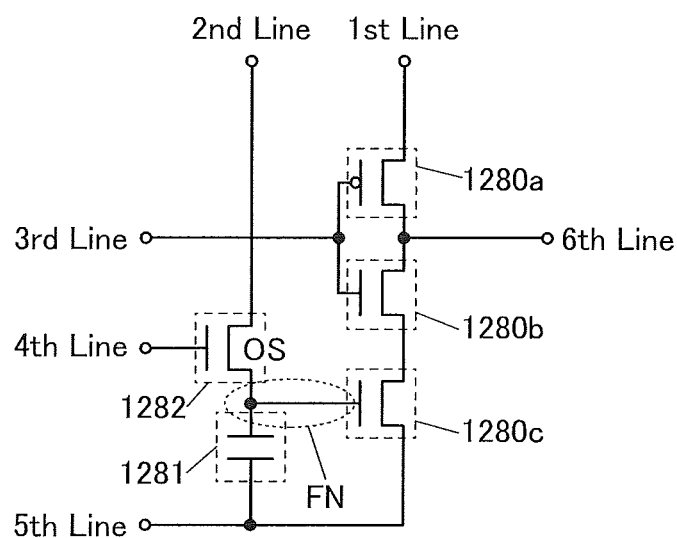
FIG. 50 illustrates a circuit configuration of a semiconductor device.

FIG. 50 illustrates a circuit configuration of a semiconductor device. In FIG. 50, a first wiring (1st Line) is electrically connected to one of a source electrode and a drain electrode of a p-channel transistor 1280a. The other of the source electrode and the drain electrode of the p-channel transistor 1280a is electrically connected to one of a source electrode and a drain electrode of an n-channel transistor 1280b. The other of the source electrode and the drain electrode of the n-channel transistor 1280b is electrically connected to one of a source electrode and a drain electrode of an n-channel transistor 1280c.

A second wiring (2nd Line) is electrically connected to one of a source electrode and a drain electrode of a transistor 1282. The other of the source electrode and the drain electrode of the transistor 1282 is electrically connected to one electrode of a capacitor 1281 and a gate electrode of the n-channel transistor 1280c.

A third wiring (3rd Line) is electrically connected to gate electrodes of the p-channel transistor 1280a and the n-channel transistor 1280b. A fourth wiring (4th Line) is electrically connected to a gate electrode of the transistor 1282. A fifth wiring (5th Line) is electrically connected to the other electrode of the capacitor 1281 and the other of the source electrode and the drain electrode of the n-channel transistor 1280c. A sixth wiring (6th Line) is electrically connected to the other of the source electrode and the drain electrode of the p-channel transistor 1280a and the one of the source electrode and the drain electrode of the n-channel transistor 1280b.

Note that the transistor 1282 can be formed using an oxide semiconductor (OS). Therefore, in FIG. 50, "OS" is written beside the transistor 1282. Note that the transistor 1282 may be formed using a material other than an oxide semiconductor.

In FIG. 50, "FN", which denotes a floating node, is written at a connection portion of the other of the source electrode and the drain electrode of the transistor 1282, the one electrode of the capacitor 1281, and the gate electrode of the n-channel transistor 1280c. When the transistor 1282 is turned off, a potential supplied to the floating node, the one electrode of the capacitor 1281, and the gate electrode of the n-channel transistor 1280c can be held.

The circuit configuration in FIG. 50 utilizes the advantage that the potential of the gate electrode of the n-channel transistor 1280c can be held, whereby writing, holding, and reading of data can be performed as described below.

<5-2. Writing and Holding of Data>

First, writing and holding of data will be described. The potential of the fourth wiring is set to a potential at which the transistor 1282 is turned on, so that the transistor 1282 is turned on. Accordingly, the potential of the second wiring is supplied to the gate electrode of the n-channel transistor 1280c and the capacitor 1281. That is, predetermined charge is applied to the gate electrode of the n-channel transistor 1280c (writing). After that, the potential of the fourth wiring is set to a potential at which the transistor 1282 is turned off, so that the transistor 1282 is turned off. Accordingly, charge applied to the gate electrode of the n-channel transistor 1280c is held (holding).

Since the off-state current of the transistor 1282 is extremely low, the charge in the gate electrode of the n-channel transistor 1280c is held for a long time.

<5-3. Data Reading>

Next, data reading will be described. When the potential of the third wiring is set to a low-level potential, the p-channel transistor 1280a is turned on and the n-channel transistor 1280b is turned off. In this case, the potential of the first wiring is supplied to the sixth wiring. On the other hand, when the potential of the third wiring is set to a high-level potential, the p-channel transistor 1280a is turned off and the n-channel transistor 1280b is turned on. In this case, the potential of the sixth wiring depends on the amount of charge held in the floating node (FN). Therefore, the stored data can be read out by measuring the potential of the sixth wiring (reading).

The transistor 1282, whose channel formation region is formed using an oxide semiconductor, has extremely low off-state current. The off-state current of the transistor 1282 including an oxide semiconductor is less than or equal to one hundred-thousandth of the off-state current of a transistor formed using a silicon semiconductor or the like; thus, loss of charge accumulated in the floating node (FN) due to leakage current of the transistor 1282 is negligible. That is, the transistor 1282 including an oxide semiconductor makes it possible to provide a nonvolatile memory circuit which can hold data even when not powered.

By using the semiconductor device having the above-described circuit configuration for a memory device such as a register or a cache memory, data in the memory device can be prevented from being lost owing to the stop of the supply of a power supply voltage. Furthermore, shortly after the supply of the power supply voltage is restarted, the memory device can return to the same state as before the power supply is stopped. Therefore, the power supply can be stopped even for a short time when the whole memory device or one or a plurality of logic circuits constituting a part of the memory device is in a standby state. Accordingly, power consumption can be suppressed.

The structures, the methods, and the like described in this embodiment can be combined as appropriate with any of the structures, the methods, and the like described in the other embodiments.

(Embodiment 6)

In this embodiment, a configuration of a pixel circuit that can be used for the semiconductor device of one embodiment of the present invention will be described below with reference to FIG. 51A.

<6-1. Configuration of Pixel Circuit>

Figure 51A:
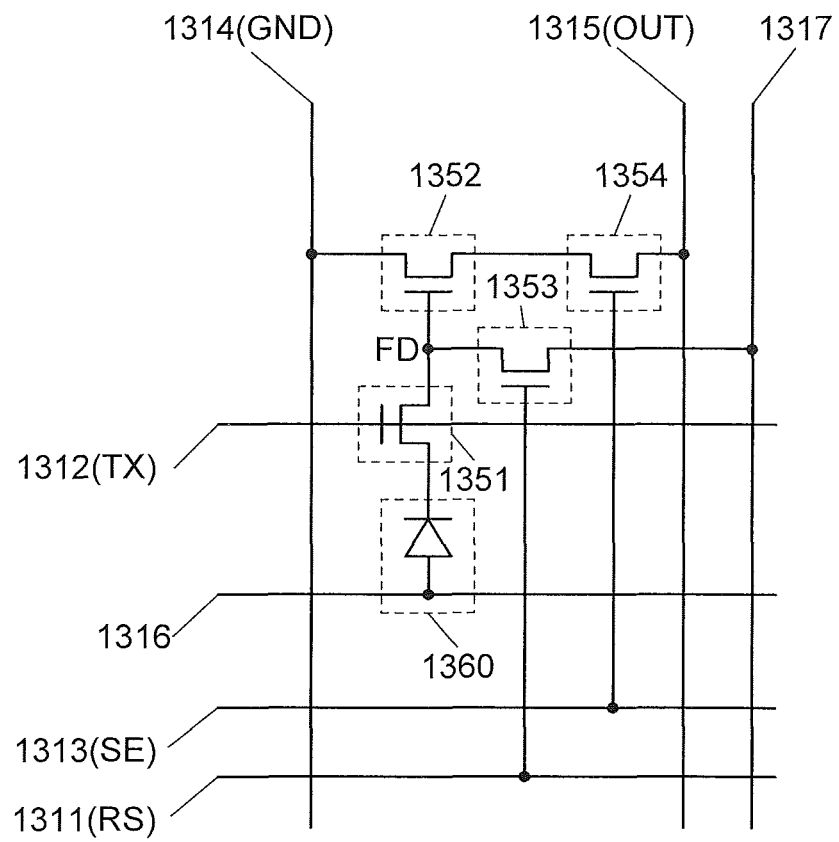
FIG. 51A is a diagram illustrating a configuration of a pixel circuit.

FIG. 51A illustrates a configuration of a pixel circuit. The circuit in FIG. 51A includes a photoelectric conversion element 1360, a transistor 1351, a transistor 1352, a transistor 1353, and a transistor 1354.

An anode of the photoelectric conversion element 1360 is connected to a wiring 1316, and a cathode of the photoelectric conversion element 1360 is connected to one of a source electrode and a drain electrode of the transistor 1351. The other of the source electrode and the drain electrode of the transistor 1351 is connected to a charge accumulation portion (FD). A gate electrode of the transistor 1351 is connected to a wiring 1312 (TX). One of a source electrode and a drain electrode of the transistor 1352 is connected to a wiring 1314 (GND). The other of the source electrode and the drain electrode of the transistor 1352 is connected to one of a source electrode and a drain electrode of the transistor 1354. A gate electrode of the transistor 1352 is connected to the charge accumulation portion (FD). One of a source electrode and a drain electrode of the transistor 1353 is connected to the charge accumulation portion (FD). The other of the source electrode and the drain electrode of the transistor 1353 is connected to a wiring 1317. A gate electrode of the transistor 1353 is connected to a wiring 1311 (RS). The other of the source electrode and the drain electrode of the transistor 1354 is connected to a wiring 1315 (OUT). A gate electrode of the transistor 1354 is connected to a wiring 1313 (SE). Note that all the above connections are electrical connections.

A potential such as GND, VSS, or VDD may be supplied through the wiring 1314. Here, a potential or a voltage has a relative value. Therefore, the potential GND is not necessarily 0 V.

The photoelectric conversion element 1360 is a light-receiving element and has a function of generating current corresponding to the amount of light that enters the pixel circuit. The transistor 1353 has a function of controlling accumulation of charge in the charge accumulation portion (FD) by the photoelectric conversion element 1360. The transistor 1354 has a function of outputting a signal corresponding to the potential of the charge accumulation portion (FD). The transistor 1352 has a function of resetting the potential of the charge accumulation portion (FD). The transistor 1352 has a function of controlling selection of the pixel circuit at the time of reading.

Note that the charge accumulation portion (FD) is a charge retention node and retains charge that is changed depending on the amount of light received by the photoelectric conversion element 1360.

Note that the transistor 1352 and the transistor 1354 only need to be connected in series between the wiring 1314 and the wiring 1315. Therefore, the wiring 1314, the transistor 1352, the transistor 1354, and the wiring 1315 may be arranged in this order, or the wiring 1314, the transistor 1354, the transistor 1352, and the wiring 1315 may be arranged in this order.

The wiring 1311 (RS) functions as a signal line for controlling the transistor 1353. The wiring 1312 (TX) functions as a signal line for controlling the transistor 1351. The wiring 1313 (SE) functions as a signal line for controlling the transistor 1354. The wiring 1314 (GND) functions as a signal line for supplying a reference potential (e.g., GND). The wiring 1315 (OUT) functions as a signal line for reading a signal output from the transistor 1352. The wiring 1316 functions as a signal line for outputting charge from the charge accumulation portion (FD) through the photoelectric conversion element 1360 and is a low potential line in the circuit in FIG. 51A. The wiring 1317 functions as a signal line for resetting the potential of the charge accumulation portion (FD) and is a high potential line in the circuit in FIG. 51A.

Next, the structure of each component in FIG. 51A will be described.

<6-2. Photoelectric Conversion Element>

An element including selenium or a selenium-containing compound (hereinafter referred to as a selenium-based material) or an element including silicon (e.g., an element in which a pin junction is formed) can be used as the photoelectric conversion element 1360. The photoelectric conversion element including a selenium-based material is preferably used in combination with a transistor including an oxide semiconductor, in which case high reliability can be achieved.

<6-3. Transistor>

Although a silicon semiconductor such as amorphous silicon, microcrystalline silicon, polycrystalline silicon, or single-crystal silicon can be used to form the transistor 1351, the transistor 1352, the transistor 1353, and the transistor 1354, an oxide semiconductor is preferably used to form the transistors. A transistor whose channel formation region is formed using an oxide semiconductor has extremely low off-state current. For example, the transistor described in Embodiment 1 can be used as a transistor whose channel formation region is formed using an oxide semiconductor.

In particular, when the transistor 1351 and the transistor 1353 which are connected to the charge accumulation portion (FD) have high leakage current, charge accumulated in the charge accumulation portion (FD) cannot be held for a sufficient time. The use of an oxide semiconductor at least for the two transistors prevents unwanted leakage of charge from the charge accumulation portion (FD).

Unwanted leakage of charge to the wiring 1314 or the wiring 1315 also occurs when the transistor 1352 and the transistor 1354 have high leakage current; thus, a transistor whose channel formation region is formed using an oxide semiconductor is preferably used as each of these transistors.

One embodiment of the present invention is not limited to the example in FIG. 51A, in which the transistor includes one gate electrode. For example, the transistor may include a plurality of gate electrodes. The transistor including a plurality of gate electrodes may include, for example, a first gate electrode and a second gate electrode (also referred to as a back gate electrode) which overlap with a semiconductor film in which a channel formation region is formed. The back gate electrode may be supplied with the same potential as the first gate electrode, a floating potential, or a potential different from that supplied to the first gate electrode, for example.

<6-4. Timing Chart of Circuit Operation>

An example of the operation of the circuit in FIG. 51A will be described with reference to a timing chart in FIG. 51B.

Figure 51B:
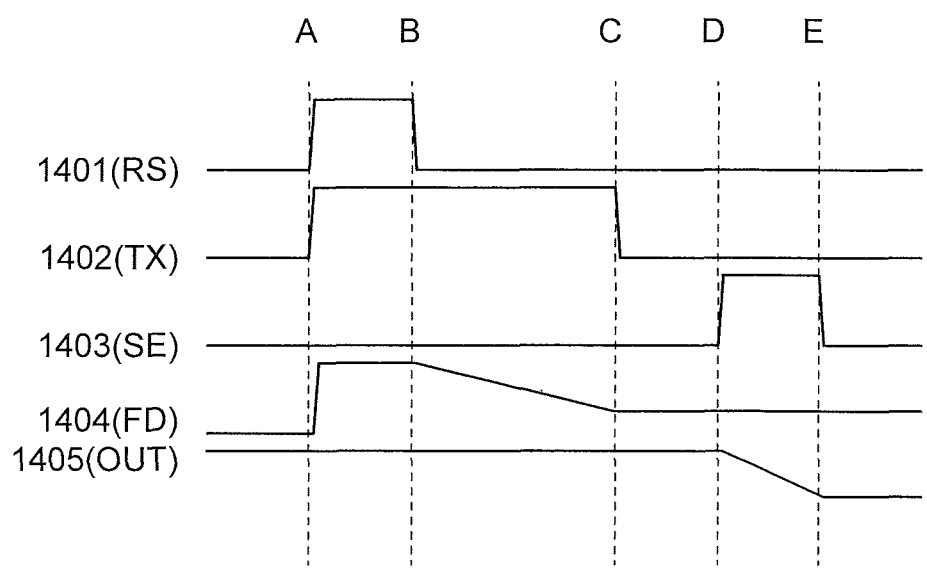
FIG. 51B is a timing chart of the operation of the pixel circuit.

In FIG. 51B, the potential of each wiring is denoted by a signal which varies between two levels for simplicity. Note that each potential is an analog signal; therefore, in practice, the potential can have various levels depending on conditions without being limited to two levels. In FIG. 51B, a signal 1401 corresponds to the potential of the wiring 1311 (RS), a signal 1402 corresponds to the potential of the wiring 1312 (TX), a signal 1403 corresponds to the potential of the wiring 1313 (SE), a signal 1404 corresponds to the potential of the charge accumulation portion (FD), and a signal 1405 corresponds to the potential of the wiring 1315 (OUT). The potential of the wiring 1316 is always at a low level, and the potential of the wiring 1317 is always at a high level.

At time A, the potential of the wiring 1311 (signal 1401) and the potential of the wiring 1312 (signal 1402) are set to the high level, so that the potential of the charge accumulation portion (FD) (signal 1404) is initialized to the potential (high level) of the wiring 1317, and reset operation is started. Note that the potential of the wiring 1315 (signal 1405) is precharged to the high level.

At time B, the potential of the wiring 1311 (signal 1401) is set to the low level, so that the reset operation is terminated and accumulation operation is started. Here, a reverse bias is applied to the photoelectric conversion element 1360, so that the potential of the charge accumulation portion (FD) (signal 1404) starts to decrease owing to reverse current. Since irradiation of the photoelectric conversion element 1360 with light increases the reverse current, the rate of decrease in the potential of the charge accumulation portion (FD) (signal 1404) changes depending on the amount of irradiation light. In other words, the channel resistance between the source and the drain of the transistor 1354 changes depending on the amount of light delivered to the photoelectric conversion element 1360.

At time C, the potential of the wiring 1312 (signal 1402) is set to the low level to terminate the accumulation operation, so that the potential of the charge accumulation portion (FD) (signal 1404) becomes constant. Here, the potential is determined by the amount of charge generated by the photoelectric conversion element 1360 during the accumulation operation. That is, the potential changes depending on the amount of light delivered to the photoelectric conversion element 1360. Furthermore, since each of the transistors 1351 and 1353 is a transistor whose channel formation region is formed using an oxide semiconductor and which has extremely low off-state current, the potential of the charge accumulation portion (FD) can be kept constant until subsequent selection operation (read operation) is performed.

When the potential of the wiring 1312 (signal 1402) is set to the low level, the potential of the charge accumulation portion (FD) might change owing to parasitic capacitance between the wiring 1312 and the charge accumulation portion (FD). In the case where the potential change is significant, the amount of charge generated by the photoelectric conversion element 1360 during the accumulation operation cannot be obtained accurately. Examples of effective measures to reduce the potential change include reducing the capacitance between the gate electrode and the source electrode (or between the gate electrode and the drain electrode) of the transistor 1351, increasing the gate capacitance of the transistor 1352, and providing a storage capacitor in the charge accumulation portion (FD). In this embodiment, the potential change can be ignored by the adoption of these measures.

At time D, the potential of the wiring 1313 (signal 1403) is set to the high level to turn on the transistor 1354, so that the selection operation is started and the wiring 1314 and the wiring 1315 are electrically connected to each other through the transistor 1352 and the transistor 1354. Thus, the potential of the wiring 1315 (signal 1405) starts to decrease. Note that the precharge of the wiring 1315 is terminated before time D. Here, the rate at which the potential of the wiring 1315 (signal 1405) decreases depends on current between the source electrode and the drain electrode of the transistor 1352, that is, the amount of light delivered to the photoelectric conversion element 1360 during the accumulation operation.

At time E, the potential of the wiring 1313 (signal 1403) is set to the low level to turn off the transistor 1354, so that the selection operation is terminated and the potential of the wiring 1315 (signal 1405) becomes a constant value. Here, the constant value changes depending on the amount of light delivered to the photoelectric conversion element 1360. Therefore, the amount of light delivered to the photoelectric conversion element 1360 during the accumulation operation can be determined by measuring the potential of the wiring 1315.

Specifically, when the photoelectric conversion element 1360 is irradiated with intense light, the potential of the charge accumulation portion (FD), that is, the gate voltage of the transistor 1352 decreases. Therefore, the current flowing between the source electrode and the drain electrode of the transistor 1352 becomes low; as a result, the potential of the wiring 1315 (signal 1405) gradually decreases. Thus, a relatively high potential can be read out from the wiring 1315.

In contrast, when the photoelectric conversion element 1360 is irradiated with light with low intensity, the potential of the charge accumulation portion (FD), that is, the gate voltage of the transistor 1352 increases. Therefore, the current flowing between the source electrode and the drain electrode of the transistor 1352 becomes high; as a result, the potential of the wiring 1315 (signal 1405) rapidly decreases. Thus, a relatively low potential can be read out from the wiring 1315.

This embodiment can be implemented in an appropriate combination with any of the structures described in the other embodiments.

(Embodiment 7)

In this embodiment, a display device including the semiconductor device of one embodiment of the present invention will be described with reference to FIGS. 52A to 52C.

<7. Circuit Configuration of Display Device>

A display device illustrated in FIG. 52A includes a region including pixels of display elements (hereinafter referred to as a pixel portion 502), a circuit portion which is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, the circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, another signal can be supplied from the gate driver 504a.

The source driver 504b includes a shift register or the like. The source driver 504b receives a signal (image signal) from which a data signal is generated, as well as a signal for driving the shift register, through the terminal portion 507. The source driver 504b has a function of generating a data signal to be written to the pixel circuit 501 from the image signal. In addition, the source driver 504b has a function of controlling output of a data signal in response to an input pulse signal such as a start pulse signal or a clock signal. Furthermore, the source driver 504b has a function of controlling the potentials of wirings supplied with data signals (hereinafter referred to as data lines DL_I to DL_Y). Alternatively, the source driver 504b has a function of supplying an initialization signal. Without being limited thereto, another signal can be supplied from the source driver 504b.

The source driver 504b includes a plurality of analog switches, for example. The source driver 504b can output, as data signals, time-divided image signals obtained by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal in each of the plurality of pixel circuits 501 are controlled by the gate driver 504a. For example, to the pixel circuit 501 in the m-th row and the n-th column (m is a natural number of X or less, and n is a natural number of Y or less), a pulse signal is input from the gate driver 504a through the scan line GL_m, and a data signal is input from the source driver 504b through the data line DL_n in accordance with the potential of the scan line GL_m.

Figure 52A:
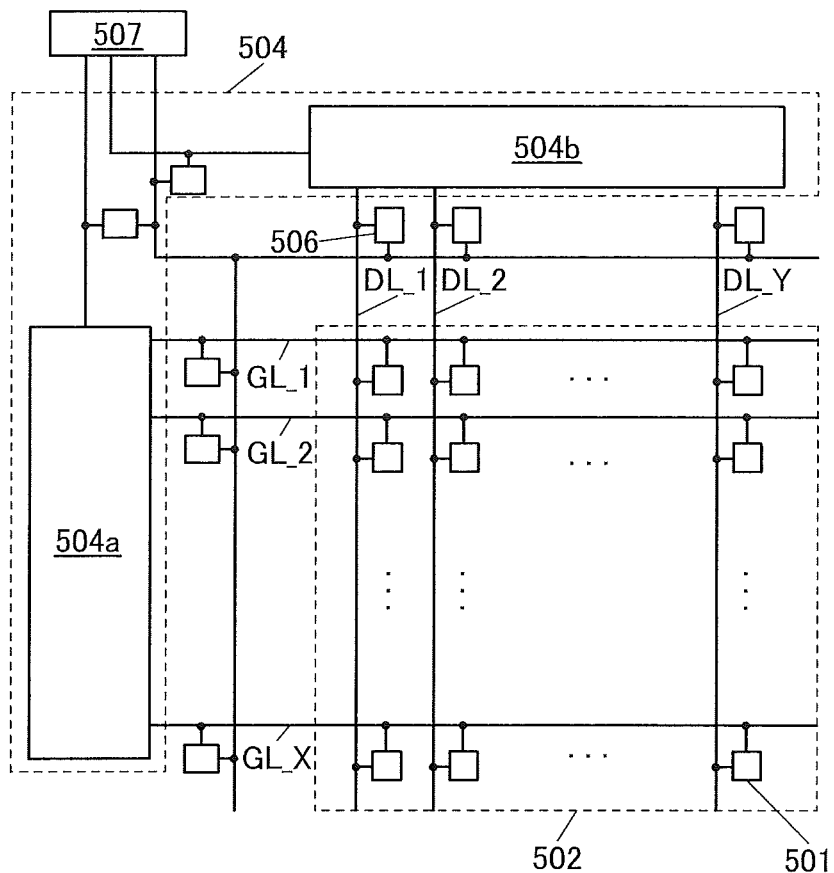
FIGS. 52A to 52C are a block diagram and circuit diagrams illustrating a display device.

The protection circuit 506 in FIG. 52A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers to a portion having terminals for inputting power, control signals, and image signals from external circuits to the display device.

The protection circuit 506 electrically connects a wiring connected to the protection circuit to another wiring when a potential out of a certain range is supplied to the wiring connected to the protection circuit.

As illustrated in FIG. 52A, the protection circuits 506 provided for the pixel portion 502 and the driver circuit portion 504 can improve the resistance of the display device to overcurrent generated by electrostatic discharge (ESD) or the like. Note that the configuration of the protection circuits 506 is not limited thereto; for example, the protection circuit 506 can be connected to the gate driver 504a or the source driver 504b. Alternatively, the protection circuit 506 can be connected to the terminal portion 507.

One embodiment of the present invention is not limited to the example in FIG. 52A, in which the driver circuit portion 504 includes the gate driver 504a and the source driver 504b. For example, only the gate driver 504a may be formed, and a separately prepared substrate over which a source driver circuit is formed (e.g., a driver circuit board formed using a single-crystal semiconductor film or a polycrystalline semiconductor film) may be mounted.

Figure 52B:
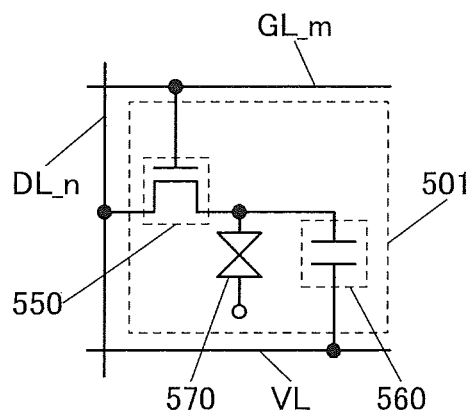

Each of the plurality of pixel circuits 501 in FIG. 52A can have the configuration illustrated in FIG. 52B, for example.

The pixel circuit 501 in FIG. 52B includes a liquid crystal element 570, a transistor 550, and a capacitor 560. As the transistor 550, the transistor described in the above embodiment can be used.

The potential of one of a pair of electrodes of the liquid crystal element 570 is set as appropriate in accordance with the specifications of the pixel circuit 501. The alignment state of the liquid crystal element 570 depends on data written thereto. A common potential may be supplied to the one of the pair of electrodes of the liquid crystal element 570 included in each of the plurality of pixel circuits 501. The potential supplied to the one of the pair of electrodes of the liquid crystal element 570 in the pixel circuit 501 may differ between rows.

Examples of a method for driving the display device including the liquid crystal element 570 include a TN mode, an STN mode, a VA mode, an axially symmetric aligned micro-cell (ASM) mode, an optically compensated birefringence (OCB) mode, a ferroelectric liquid crystal (FLC) mode, an anti-ferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other of the source electrode and the drain electrode of the transistor 550 is electrically connected to the other of the pair of electrodes of the liquid crystal element 570. A gate electrode of the transistor 550 is electrically connected to the scan line GL_m. The transistor 550 is configured to be turned on or off to control whether a data signal is written.

One of a pair of electrodes of the capacitor 560 is electrically connected to a wiring through which a potential is supplied (hereinafter referred to as a potential supply line VL), and the other of the pair of electrodes of the capacitor 560 is electrically connected to the other of the pair of electrodes of the liquid crystal element 570. The potential of the potential supply line VL is set as appropriate in accordance with the specifications of the pixel circuit 501. The capacitor 560 functions as a storage capacitor for storing written data.

For example, in the display device including the pixel circuits 501 in FIG. 52B, the gate driver 504a in FIG. 52A sequentially selects the pixel circuits 501 row by row to turn on the transistors 550, and data signals are written.

When the transistor 550 is turned off, the pixel circuit 501 to which the data has been written is brought into a holding state. This operation is sequentially performed row by row; thus, an image can be displayed.

Figure 52C:
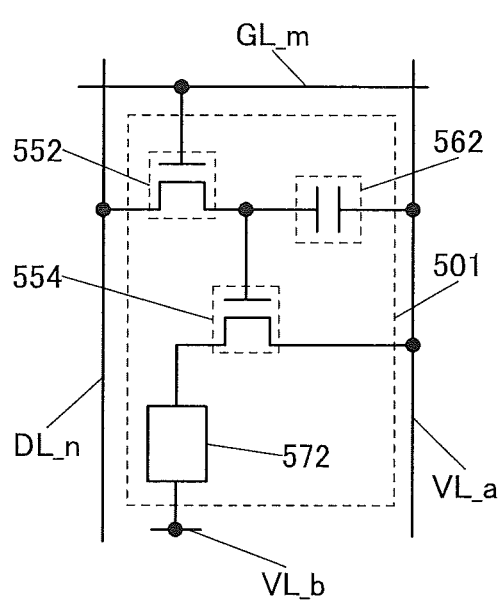

Alternatively, each of the plurality of pixel circuits 501 in FIG. 52A can have the configuration illustrated in FIG. 52C, for example.

The pixel circuit 501 in FIG. 52C includes transistors 552 and 554, a capacitor 562, and a light-emitting element 572. The transistor described in the above embodiment can be used as the transistor 552 and/or the transistor 554.

One of a source electrode and a drain electrode of the transistor 552 is electrically connected to a wiring through which a data signal is supplied (hereinafter referred to as a data line DL_n). A gate electrode of the transistor 552 is electrically connected to a wiring through which a gate signal is supplied (hereinafter referred to as a scan line GL_m).

The transistor 552 is configured to be turned on or off to control whether a data signal is written.

One of a pair of electrodes of the capacitor 562 is electrically connected to a wiring through which a potential is supplied (hereinafter referred to as a potential supply line VL_a), and the other of the pair of electrodes of the capacitor 562 is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other of the anode and the cathode of the light-emitting element 572 is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

A high power supply potential VDD is supplied to one of the potential supply line VL_a and the potential supply line VL_b, and a low power supply potential VSS is supplied to the other of the potential supply line VL_a and the potential supply line VL_b.

In the display device including the pixel circuits 501 in FIG. 52C, the gate driver 504a in FIG. 52A sequentially selects the pixel circuits 501 row by row to turn on the transistors 552, and data signals are written.

When the transistor 552 is turned off, the pixel circuit 501 to which the data has been written is brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

The structures described in this embodiment can be combined as appropriate with any of the structures described in the other embodiments.

(Embodiment 8)

In this embodiment, circuit configuration examples to which the transistors described in the above embodiments can be applied will be described with reference to FIGS. 53A to 53C, FIGS. 54A to 54C, FIGS. 55A and 55B, and FIGS. 56A and 56B.

Note that in the following description in this embodiment, the transistor including an oxide semiconductor described in the above embodiment is referred to as an OS transistor.

<8. Configuration Example of Inverter Circuit>

Figure 53A:
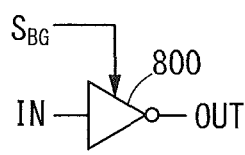
FIGS. 53A to 53C are circuit diagrams and a timing chart illustrating one embodiment of the present invention.

FIG. 53A is a circuit diagram of an inverter which can be used for a shift register, a buffer, or the like included in the driver circuit. An inverter 800 outputs a signal whose logic is inverted from the logic of a signal supplied to an input terminal IN to an output terminal OUT. The inverter 800 includes a plurality of OS transistors. A signal $S_{BG}$ can switch electrical characteristics of the OS transistors.

Figure 53B:
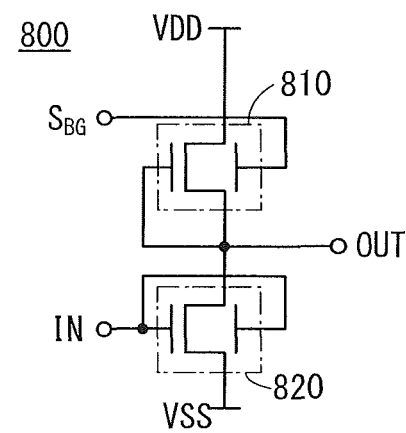

FIG. 53B is a circuit diagram showing an example of the inverter 800. The inverter 800 includes OS transistors 810 and 820. The inverter 800 can be formed using n-channel transistors and can have a circuit configuration in which all the transistors have the same conductivity. Thus, the inverter 800 can be manufactured at lower cost than a CMOS inverter.

Each of the OS transistors 810 and 820 includes a first gate functioning as a front gate, a second gate functioning as a back gate, a first terminal functioning as one of a source and a drain, and a second terminal functioning as the other of the source and the drain.

The first gate of the OS transistor 810 is connected to its second terminal. The second gate of the OS transistor 810 is connected to a wiring that supplies the signal $S_{BG}$. The first terminal of the OS transistor 810 is connected to a wiring that supplies a voltage VDD. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring that supplies a voltage VSS.

Figure 53C:
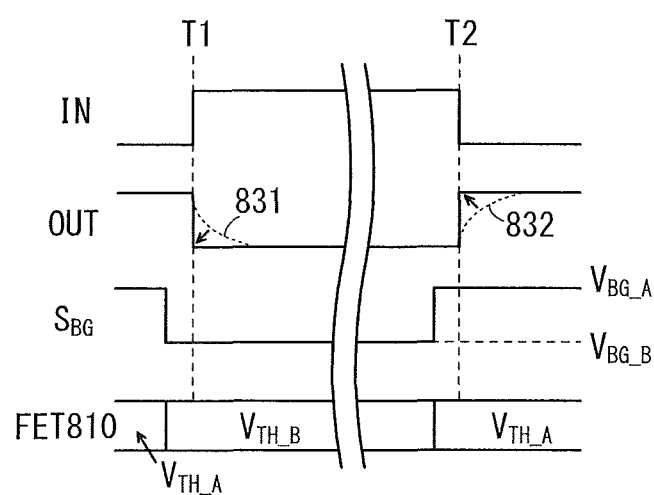

FIG. 53C is a timing chart illustrating the operation of the inverter 800. The timing chart in FIG. 53C illustrates changes of a signal waveform of the input terminal IN, a signal waveform of the output terminal OUT, a signal waveform of the signal $S_{BG}$, and the threshold voltage of the OS transistor 810 (FET 810).

The signal $S_{BG}$ can be supplied to the second gate of the OS transistor 810 to control the threshold voltage ($V_{TH}$) of the OS transistor 810.

The signal $S_{BG}$ includes a voltage $V_{BG\_A}$ for shifting the $V_{TH}$ in the negative direction and a voltage $V_{BG\_B}$ for shifting the $V_{TH}$ in the positive direction. The threshold voltage of the OS transistor 810 can be shifted in the negative direction to be a threshold voltage $V_{TH\_A}$ when the voltage $V_{BG\_A}$ is applied to the second gate. The threshold voltage of the OS transistor 810 can be shifted in the positive direction to be a threshold voltage $V_{TH\_B}$ when the voltage $V_{BG\_B}$ is applied to the second gate.

Figure 54A:
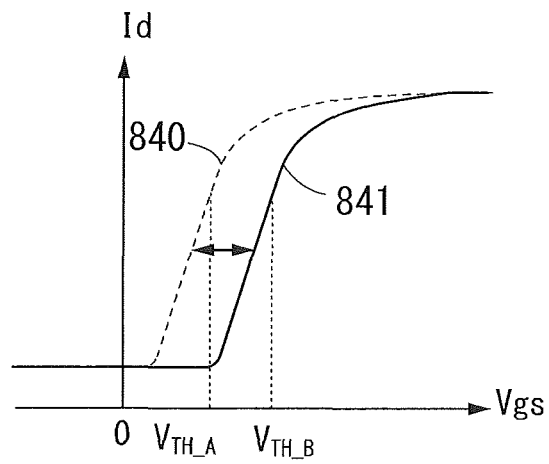
FIGS. 54A to 54C are a graph and circuit diagrams illustrating one embodiment of the present invention.

In other words, when a high voltage is applied to the second gate, the threshold voltage of the OS transistor 810 can be shifted to match a curve indicated by a broken line 840 as shown in FIG. 54A. When a low voltage is applied to the second gate, the threshold voltage of the OS transistor 810 can be shifted to match a curve indicated by a solid line 841.

Figure 54B:
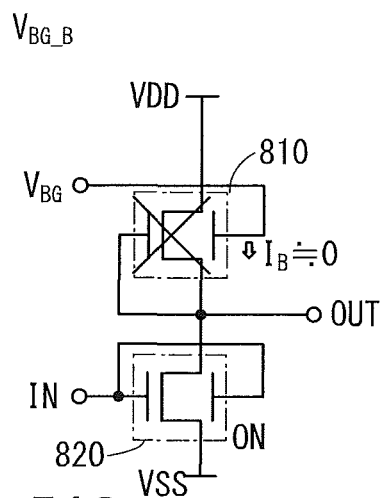

The shift of the threshold voltage in the positive direction toward the threshold voltage $V_{TH\_B}$ can make current less likely to flow in the OS transistor 810. As illustrated in FIG. 54B, a current $I_B$ that flows in the OS transistor 810 can be extremely low. Thus, when a signal supplied to the input terminal IN is at a high level and the OS transistor 820 is on (ON), the voltage of the output terminal OUT can be decreased sharply. Therefore, a change of a signal waveform 831 of the output terminal in the timing chart in FIG. 53C can be made steep. Shoot-through current between the wiring that supplies the voltage VDD and the wiring that supplies the voltage VSS can be low, leading to low-power operation.

Figure 54C:
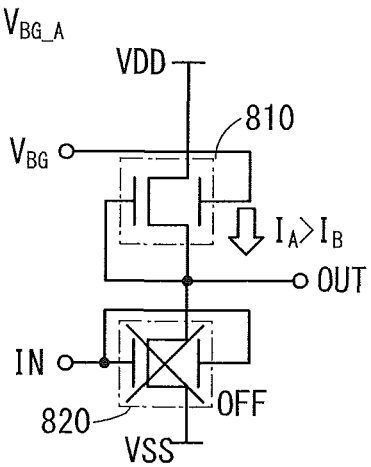

The shift of the threshold voltage in the negative direction toward the threshold voltage $V_{TH\_A}$ can make current flow easily in the OS transistor 810. As illustrated in FIG. 54C, a current $I_A$ flowing at this time can be higher than at least the current $I_B$. Thus, when a signal supplied to the input terminal IN is at a low level and the OS transistor 820 is off (OFF), the voltage of the output terminal OUT can be increased sharply. Therefore, a change of a signal waveform 832 of the output terminal in the timing chart in FIG. 53C can be made steep.

Note that the $V_{TH}$ of the OS transistor 810 is preferably controlled by the signal $S_{BG}$ before the state of the OS transistor 820 is switched, i.e., before time T1 or time T2. For example, as in FIG. 53C, it is preferable that the threshold voltage of the OS transistor 810 be switched from the threshold voltage $V_{TH\_A}$ to the threshold voltage $V_{TH\_B}$ before time T1 at which the level of the signal supplied to the input terminal IN is switched to a high level. Moreover, as in FIG. 53C, it is preferable that the threshold voltage of the OS transistor 810 be switched from the threshold voltage $V_{TH\_B}$ to the threshold voltage $V_{TH\_A}$ before time T2 at which the level of the signal supplied to the input terminal IN is switched to a low level.

Figure 55A:
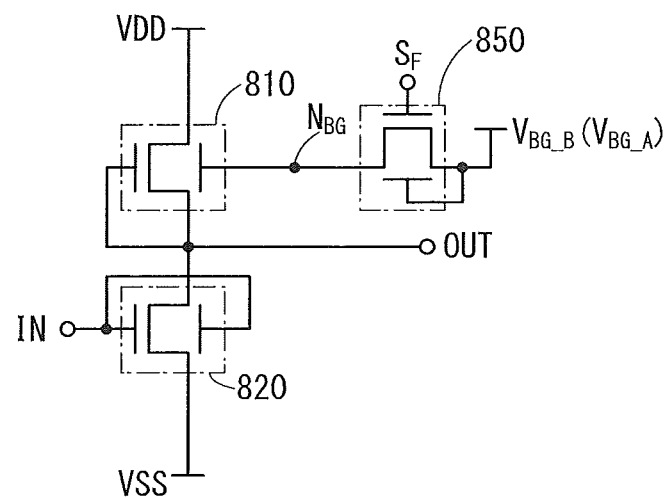
FIGS. 55A and 55B are a circuit diagram and a timing chart illustrating one embodiment of the present invention.

Although the timing chart in FIG. 53C illustrates the structure in which the level of the signal $S_{BG}$ is switched in accordance with the signal supplied to the input terminal IN, a different structure may be employed in which voltage for controlling the threshold voltage is held by the second gate of the OS transistor 810 in a floating state, for example. FIG. 55A illustrates an example of such a circuit configuration.

The circuit configuration in FIG. 55A is the same as that in FIG. 53B, except that an OS transistor 850 is added. A first terminal of the OS transistor 850 is connected to the second gate of the OS transistor 810. A second terminal of the OS transistor 850 is connected to a wiring that supplies the voltage $V_{BG\_B}$ (or the voltage $V_{BG\_A}$). A first gate of the OS transistor 850 is connected to a wiring that supplies a signal $S_F$. A second gate of the OS transistor 850 is connected to the wiring that supplies the voltage $V_{BG\_B}$ (or the voltage $V_{BG\_A}$).

Figure 55B:
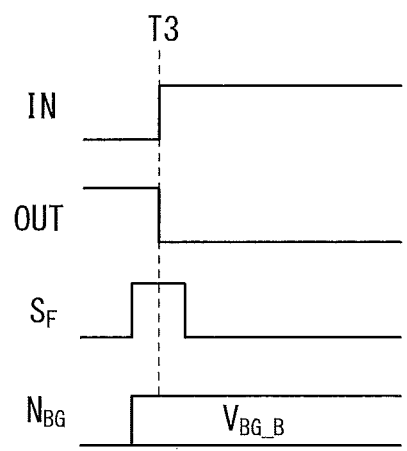

The operation with the circuit configuration in FIG. 55A will be described with reference to a timing chart in FIG. 55B.

As in FIG. 53C, the voltage for controlling the threshold voltage of the OS transistor 810 is supplied to the second gate of the OS transistor 810 before time T3 at which the level of the signal supplied to the input terminal IN is switched to a high level. The signal $S_F$ is set to a high level and the OS transistor 850 is turned on, so that the voltage $V_{BG\_B}$ for controlling the threshold voltage is supplied to a node $N_{BG}$.

The OS transistor 850 is turned off after the voltage of the node $N_{BG}$ becomes $V_{BG\_B}$. Since the off-state current of the OS transistor 850 is extremely low, the voltage $V_{BG\_B}$ held by the node $N_{BG}$ can be retained while the OS transistor 850 remains off. Therefore, the number of times the voltage $V_{BG\_B}$ is supplied to the second gate of the OS transistor 850 can be reduced and accordingly, the power consumption for rewriting the voltage $V_{BG\_B}$ can be reduced.

Figure 56A:
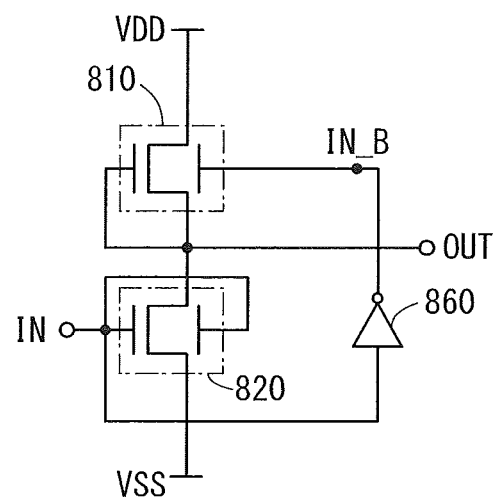
FIGS. 56A and 56B are a circuit diagram and a timing chart illustrating one embodiment of the present invention.

Although FIG. 53B and FIG. 55A each illustrate the case where the voltage is supplied to the second gate of the OS transistor 810 by control from the outside, a different structure may be employed in which voltage for controlling the threshold voltage is generated on the basis of the signal supplied to the input terminal IN and supplied to the second gate of the OS transistor 810, for example. FIG. 56A illustrates an example of such a circuit configuration.

The circuit configuration in FIG. 56A is the same as that in FIG. 53B, except that a CMOS inverter 860 is provided between the input terminal IN and the second gate of the OS transistor 810. An input terminal of the CMOS inverter 860 is connected to the input terminal IN. An output terminal of the CMOS inverter 860 is connected to the second gate of the OS transistor 810.

The operation with the circuit configuration in FIG. 56A is described with reference to a timing chart in FIG. 56B. The timing chart in FIG. 56B illustrates changes of a signal waveform of the input terminal IN, a signal waveform of the output terminal OUT, an output waveform IN_B of the CMOS inverter 860, and a threshold voltage of the OS transistor 810 (FET 810).

As in FIG. 53C, the output waveform IN_B which corresponds to a signal whose logic is inverted from the logic of the signal supplied to the input terminal IN can control the threshold voltage of the OS transistor 810. Thus, the threshold voltage of the OS transistor 810 can be controlled as described with reference to FIGS. 54A to 54C. For example, the signal supplied to the input terminal IN is at a high level and the OS transistor 820 is turned on at time T4 in FIG. 56B. At this time, the output waveform IN_B is at a low level. Accordingly, current can be made less likely to flow in the OS transistor 810; thus, the voltage of the output terminal OUT can be sharply decreased.

Figure 56B:
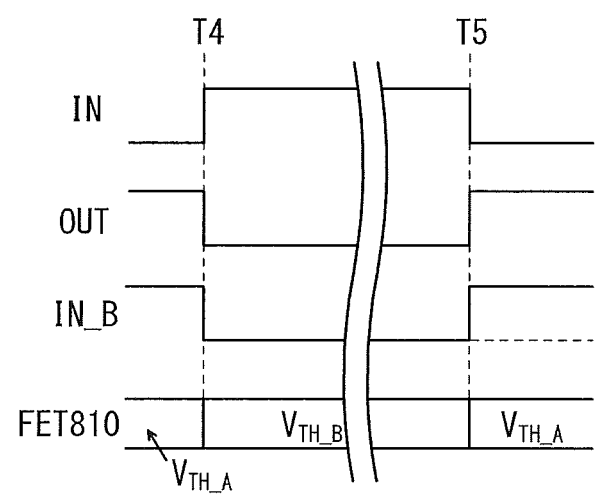

Moreover, the signal supplied to the input terminal IN is at a low level and the OS transistor 820 is turned off at time T5 in FIG. 56B. At this time, the output waveform IN_B is at a high level. Accordingly, current can easily flow in the OS transistor 810; thus, a rise in the voltage of the output terminal OUT can be made steep.

As described above, in the configuration of the inverter including the OS transistor in this embodiment, the voltage of the back gate is switched in accordance with the logic of the signal supplied to the input terminal IN. In such a configuration, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

The structures described in this embodiment can be used in appropriate combination with any of the structures described in the other embodiments.

(Embodiment 9)

In this embodiment, an input/output device of one embodiment of the present invention will be described with reference to FIGS. 57A and 57B.

<9. Structure Example of Input/Output Device>

The input/output device of one embodiment of the present invention is an in-cell touch panel that has a function of displaying an image and serves as a touch sensor.

There is no particular limitation on a display element included in the input/output device of one embodiment of the present invention. As the display element, a variety of display elements including a liquid crystal element, an optical element that utilizes micro electro mechanical systems (MEMS), a light-emitting element such as an organic electroluminescent (EL) element or a light-emitting diode (LED), and an electrophoretic element can be used.

In this embodiment, a transmissive liquid crystal display device using a liquid crystal element in a horizontal electric field mode will be described as an example.

There is no particular limitation on a sensor element included in the input/output device of one embodiment of the present invention. Note that a variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, an input/output device including a capacitive sensor element will be described as an example.

Examples of the capacitive sensor element are a surface capacitive sensor element and a projected capacitive sensor element. Examples of the projected capacitive sensor element include a self-capacitive sensor element and a mutual capacitive sensor element. The use of a mutual capacitive sensor element is preferable because multiple points can be sensed simultaneously.

As typical examples of the in-cell touch panel, a hybrid in-cell type and a full-in-cell type can be given. The hybrid in-cell type refers to a structure in which an electrode and the like constituting a part of a sensor element are provided for only a counter substrate or both a substrate that supports a display element and the counter substrate. The full-in-cell type refers to a structure in which an electrode and the like constituting a part of a sensor element are provided for only a substrate that supports a display element. The input/output device of one embodiment of the present invention is a full-in-cell touch panel. The full-in-cell touch panel is preferable because a structure of a counter substrate can be simplified.

The input/output device of one embodiment of the present invention is preferable because an electrode constituting a part of the display element also serves as an electrode constituting a part of the sensor element and thus the manufacturing process can be simplified and the manufacturing cost can be reduced.

One embodiment of the present invention can reduce the thickness or weight of the input/output device or the number of components of the input/output device as compared with a structure in which a display panel and a sensor element separately formed are attached to each other or a structure in which a sensor element is formed on the counter substrate side.

In the input/output device of one embodiment of the present invention, both an FPC for supplying a signal for driving a pixel and an FPC for supplying a signal for driving a sensor element are on one substrate side. With this structure, the touch panel can be easily incorporated into an electronic device, and the number of components can be reduced. Note that the signal for driving a pixel and the signal for driving a sensor element may be supplied by one FPC.

The structure of the input/output device of one embodiment of the present invention will be described below.

[Cross-sectional Structure Example 1 of Input/Output Device]

FIG. 57A is a cross-sectional view of two adjacent sub-pixels in an input/output device. The two sub-pixels illustrated in FIG. 57A are included in different pixels.

As illustrated in FIG. 57A, the input/output device includes, over a substrate 211, a transistor 201, a transistor 203, a liquid crystal element 207a, and the like. Furthermore, insulating films such as an insulating film 212, an insulating film 213, an insulating film 215, and an insulating film 219 are provided over the substrate 211.

For example, a subpixel exhibiting a red color, a subpixel exhibiting a green color, and a subpixel exhibiting a blue color form one pixel, and thus full-color display can be achieved in a display portion. Note that the color exhibited by subpixels is not limited to red, green, and blue. For example, a subpixel exhibiting white, yellow, magenta, cyan, or the like may be used for a pixel.

Note that any of the transistors described as examples in the above embodiments is applicable to the transistors 201 and 203 included in the sub-pixels.

The liquid crystal element 207a is a liquid crystal element having a fringe field switching (FFS) mode. The liquid crystal element 207a includes a conductive film 251, a conductive film 252, and a liquid crystal 249. Orientation of the liquid crystal 249 can be controlled with an electric field generated between the conductive films 251 and 252. The conductive film 251 can serve as a pixel electrode. The conductive film 252 can serve as a common electrode.

When a conductive material that transmits visible light is used for the conductive films 251 and 252, the input/output device can serve as a transmissive liquid crystal display device. When a conductive material that reflects visible light is used for the conductive film 251 and a conductive material that transmits visible light is used for the conductive film 252, the input/output device can serve as a reflective liquid crystal display device.

For example, a material containing one of indium (In), zinc (Zn), and tin (Sn) is preferably used for the conductive material that transmits visible light. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide to which silicon oxide is added, zinc oxide, and zinc oxide to which gallium is added are given, for example. Note that a film including graphene can be used as well. The film including graphene can be formed, for example, by reducing a film containing graphene oxide.

An oxide conductor film is preferably used as the conductive film 251. Furthermore, an oxide conductor film is preferably used as the conductive film 252. The oxide conductor film preferably contains one or more kinds of metal elements included in the oxide semiconductor film 223. For example, the conductor film 251 preferably contains indium, further preferably an In-M-Zn oxide (M is Al, Ga, Y, or Sn). Similarly, the conductive film 252 preferably contains indium, further preferably an In-M-Zn oxide.

Note that at least one of the conductive films 251 and 252 may be formed using an oxide semiconductor. As described above, when two or more layers constituting a part of the input/output device are formed using oxide semiconductors containing the same metal element, the same manufacturing apparatus (e.g., deposition apparatus or processing apparatus) can be used in two or more steps and manufacturing cost can thus be reduced.

For example, when a silicon nitride film containing hydrogen is used as an insulating film 253 and an oxide semiconductor is used for the conductive film 251, the conductivity of the oxide semiconductor can be increased owing to hydrogen supplied from the insulating film 253.

Examples of a conductive material that reflects visible light include aluminum, silver, and an alloy including any of these metal elements.

The conductive film 251 functioning as a pixel electrode is electrically connected to a source or a drain of the transistor 203.

The conductive film 252 has a comb-like top surface shape or a top surface shape provided with a slit (a top surface shape is also referred to as a planar surface shape). The insulating film 253 is provided between the conductive films 251 and 252. The conductive film 251 partly overlaps with the conductive film 252 with the insulating film 253 interposed therebetween. In a region where a coloring film 241 overlaps with the conductive film 251, there is a portion where the conductive film 252 is not provided over the conductive film 251.

A conductive film 255 is provided over the insulating film 253. The conductive film 255 is electrically connected to the conductive film 252 and can serve as an auxiliary wiring of the conductive film 252. With the auxiliary wiring electrically connected to the common electrode, voltage drop due to the resistance of the common electrode can be suppressed. In that case, a stacked-layer structure of a conductive film including a metal oxide and a conductive film including a metal is preferably used because these conductive films can be formed by a patterning technique using a halftone mask and thus the process can be simplified.

The conductive film 255 can have a lower resistivity than the conductive film 252. For example, the conductive film 255 can be formed to have a single-layer structure or a stacked-layer structure using any of metal materials such as molybdenum, titanium, chromium, tantalum, tungsten, aluminum, copper, silver, neodymium, and scandium, and an alloy material containing any of these elements.

To prevent the conductive film 255 from being perceived by the user of the input/output device, the conductive film 255 is preferably provided in a position overlapping with a light-shielding film 243 and the like.

The coloring film 241 partly overlaps with the liquid crystal element 207a. The light-shielding film 243 partly overlaps with at least one of the transistors 201 and 203.

The insulating film 245 preferably has a function of an overcoat preventing impurities contained in the coloring film 241, the light-shielding film 243, and the like from diffusing into the liquid crystal 249. The insulating film 245 is not necessarily provided.

Note that an alignment film may be provided over and/or under the liquid crystal 249. The alignment film can control the alignment of the liquid crystal 249. In the structure in FIG. 57A, for example, an alignment film that covers the conductive film 252 may be provided, or an alignment film may be provided between the insulating film 245 and the liquid crystal 249. The insulating film 245 may function as both an alignment film and an overcoat.

The input/output device includes a spacer 247. The spacer 247 has a function of preventing the distance between the substrate 211 and a substrate 261 from being shorter than or equal to a certain distance.

FIG. 57A illustrates an example in which the spacer 247 is provided over the insulating film 253 and the conductive film 252; however, one embodiment of the present invention is not limited thereto. The spacer 247 may be provided on the substrate 211 side or on the substrate 261 side. For example, the spacer 247 may be formed on the insulating film 245. Moreover, although FIG. 57A illustrates an example in which the spacer 247 is in contact with the insulating films 253 and 245, the spacer 247 is not necessarily in contact with a component provided on the substrate 211 side or on the substrate 261 side.

A particulate spacer may be used as the spacer 247. Although a material such as silica can be used for the particulate spacer, an elastic material such as a resin or rubber is preferably used. In that case, the particulate spacer may be vertically crushed.

The substrates 211 and 261 are attached to each other with an adhesive layer (not illustrated). A region surrounded by the substrate 211, the substrate 261, and the adhesive layer is filled with the liquid crystal 249.

Note that when the input/output device serves as a transmissive liquid crystal display device, two polarizing plates are provided so that a display portion is sandwiched between the two polarizing plates. Light from a backlight provided outside the polarizing plate enters through the polarizing plate. At this time, the alignment of the liquid crystal 249 is controlled with a voltage applied between the conductive films 251 and 252, whereby optical modulation of light can be controlled. In other words, the intensity of light emitted through the polarizing plate can be controlled. Light excluding light in a particular wavelength range is absorbed by the coloring film 241, so that red, blue, or green light is emitted.

In addition to the polarizing plate, a circularly polarizing plate can be used, for example. As the circularly polarizing plate, for example, a stack including a linear polarizing plate and a quarter-wave retardation plate can be used. With the circularly polarizing plate, the viewing angle dependence of display of the input/output device can be reduced.

Note that the liquid crystal element 207a is an element using an FFS mode here; however, one embodiment of the present invention is not limited thereto, and a liquid crystal element using any of a variety of modes can be used. For example, a liquid crystal element using a vertical alignment (VA) mode, a twisted nematic (TN) mode, an in-plane switching (IPS) mode, an axially symmetric aligned microcell (ASM) mode, an optically compensated birefringence (OCB) mode, a ferroelectric liquid crystal (FLC) mode, an antiferroelectric liquid crystal (AFLC) mode, or the like can be used.

Furthermore, a normally black liquid crystal display device, for example, a transmissive liquid crystal display device using a vertical alignment (VA) mode, may be used as the input/output device. As a vertical alignment mode, a multi-domain vertical alignment (MVA) mode, a patterned vertical alignment (PVA) mode, or an ASV mode can be employed, for example.

Note that the liquid crystal element is an element that controls transmission or non-transmission of light by utilizing an optical modulation action of a liquid crystal. Note that an optical modulation action of a liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, a positive liquid crystal or a negative liquid crystal may be used, and an appropriate liquid crystal material can be used depending on the mode and design to be used.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 weight % or more of a chiral material is mixed is used for the liquid crystal 249 in order to increase the temperature range. The liquid crystal composition that includes liquid crystal exhibiting a blue phase and a chiral material has a short response time and has optical isotropy. In addition, the liquid crystal composition that includes liquid crystal exhibiting a blue phase and a chiral material does not need alignment treatment and has small viewing angle dependence. In addition, since an alignment film does not need to be provided and rubbing treatment is unnecessary, electrostatic discharge damage caused by the rubbing treatment can be prevented and defects or damage of the liquid crystal display device in the manufacturing process can be reduced.

A substrate with which a sensing target, such as a finger or a stylus, is to be in contact may be provided above the substrate 261. In that case, a polarizing plate or a circularly polarizing plate is preferably provided between the substrate 261 and the above substrate. In that case, a protective layer (such as a ceramic coat) is preferably provided over the above substrate. The protective layer can be formed using an inorganic insulating material such as silicon oxide, aluminum oxide, yttrium oxide, or yttria-stabilized zirconia (YSZ). Alternatively, tempered glass may be used for the substrate. The tempered glass that can be used here is one that has been subjected to physical or chemical treatment by an ion exchange method, a thermal tempering method, or the like and has a surface to which compressive stress has been applied.

In the input/output device in FIG. 57A, capacitance formed between the conductive film 252 in the left subpixel and the conductive film 252 in the right subpixel is utilized to sense proximity, touch, or the like of a sensing target That is, in the input/output device of one embodiment of the present invention, the conductive film 252 serves as a common electrode of the liquid crystal element and an electrode of the sensor element.

As described above, an electrode constituting a part of the liquid crystal element also serves as an electrode constituting a part of the sensor element in the input/output device of one embodiment of the present invention; thus, the manufacturing process can be simplified and the manufacturing cost can be reduced. In addition, the thickness and weight of the input/output device can be reduced.

The conductive film 252 is electrically connected to the conductive film 255 functioning as an auxiliary wiring. With the conductive film 255, the resistance of the electrode of the sensor element can be lowered. With the lowered resistance of the electrode of the sensor element, the time constant of the electrode of the sensor element can be small. The smaller the time constant of the electrode of the sensor element is, the higher the detection sensitivity and the detection accuracy are.

When the capacitance between the electrode of the sensor element and a signal line is too large, the time constant of the electrode of the sensor element becomes too large in some cases. Thus, an insulating film having a planarizing function is preferably provided between the electrode of the sensor element and the transistors to reduce the capacitance between the electrode of the sensor element and the signal line. For example, in FIG. 57A, as the insulating film having a planarizing function, the insulating film 219 is provided. With the insulating film 219, the capacitance between the conductive film 252 and the signal line can be small. Accordingly, the time constant of the electrode of the sensor element can be small. As described above, the smaller the time constant of the electrode of the sensor element is, the higher the detection sensitivity and the detection accuracy are.

For example, the time constant of the electrode of the sensor element is greater than 0 seconds and less than or equal to $1 \times 10^{-4}$ seconds, preferably greater than 0 seconds and less than or equal to $5 \times 10^{-5}$ seconds, further preferably greater than 0 seconds and less than or equal to $5 \times 10^{-6}$ seconds, further preferably greater than 0 seconds and less than or equal to $5 \times 10^{-7}$ seconds, and further preferably greater than 0 seconds and less than or equal to $2 \times 10^{-7}$ seconds. In particular, when the time constant is less than or equal to $1 \times 10^{-6}$ seconds, high detection sensitivity can be achieved while the influence of noise is reduced.

[Cross-sectional Structure Example 2 of Input/Output Device]

FIG. 57B is a cross-sectional view of two adjacent pixels that are different from those in FIG. 57A. Two subpixels illustrated in FIG. 57B are included in respective pixels.

Structure example 2 illustrated in FIG. 57B differs from Structure example 1 illustrated in FIG. 57A in the stacking order of the conductive film 251, the conductive film 252, the insulating film 253, and the conductive film 255. Note that in Structure example 2, the above description can be referred to for portions similar to those in Structure example 1.

Specifically, in Structure example 2, the conductive film 255 is over the insulating film 219, the conductive film 252 is over the conductive film 255, the insulating film 253 is over the conductive film 252, and the conductive film 251 is over the insulating film 253.

As illustrated in a liquid crystal element 207b of FIG. 57B, the conductive film 251 which is provided on the upper side and whose top surface shape is a comb-like shape or has a slit may serve as a pixel electrode, and the conductive film 252 provided on the lower side may serve as a common electrode. The conductive film 251 is electrically connected to the source or the drain of the transistor 203 also in that case.

In FIG. 57B, capacitance formed between the conductive film 252 in the left subpixel and the conductive film 252 in the right subpixel is utilized to sense proximity, touch, or the like of a sensing target. That is, in the input/output device of one embodiment of the present invention, the conductive film 252 serves as the common electrode of the liquid crystal element and the electrode of the sensor element.

Note that in Structure example 1 (FIG. 57A), the conductive film 252 serving as the electrode of the sensor element and the common electrode is closer to the display surface side (the side near a sensing target) than the conductive film 251 serving as the pixel electrode is. Thus, in some cases, the detection sensitivity of Structure example 1 is higher than that of Structure example 2 in which the conductive film 251 is closer to the display surface side than the conductive film 252 is.

The structures described in this embodiment can be combined as appropriate with any of the structures described in the other embodiments.

(Embodiment 10)

In this embodiment, a display module and electronic devices, each of which includes the semiconductor device of one embodiment of the present invention, will be described with reference to FIG. 58, FIGS. 59A to 59G, and FIGS. 60A and 60B.

<10-1. Display Module>

Figure 58:
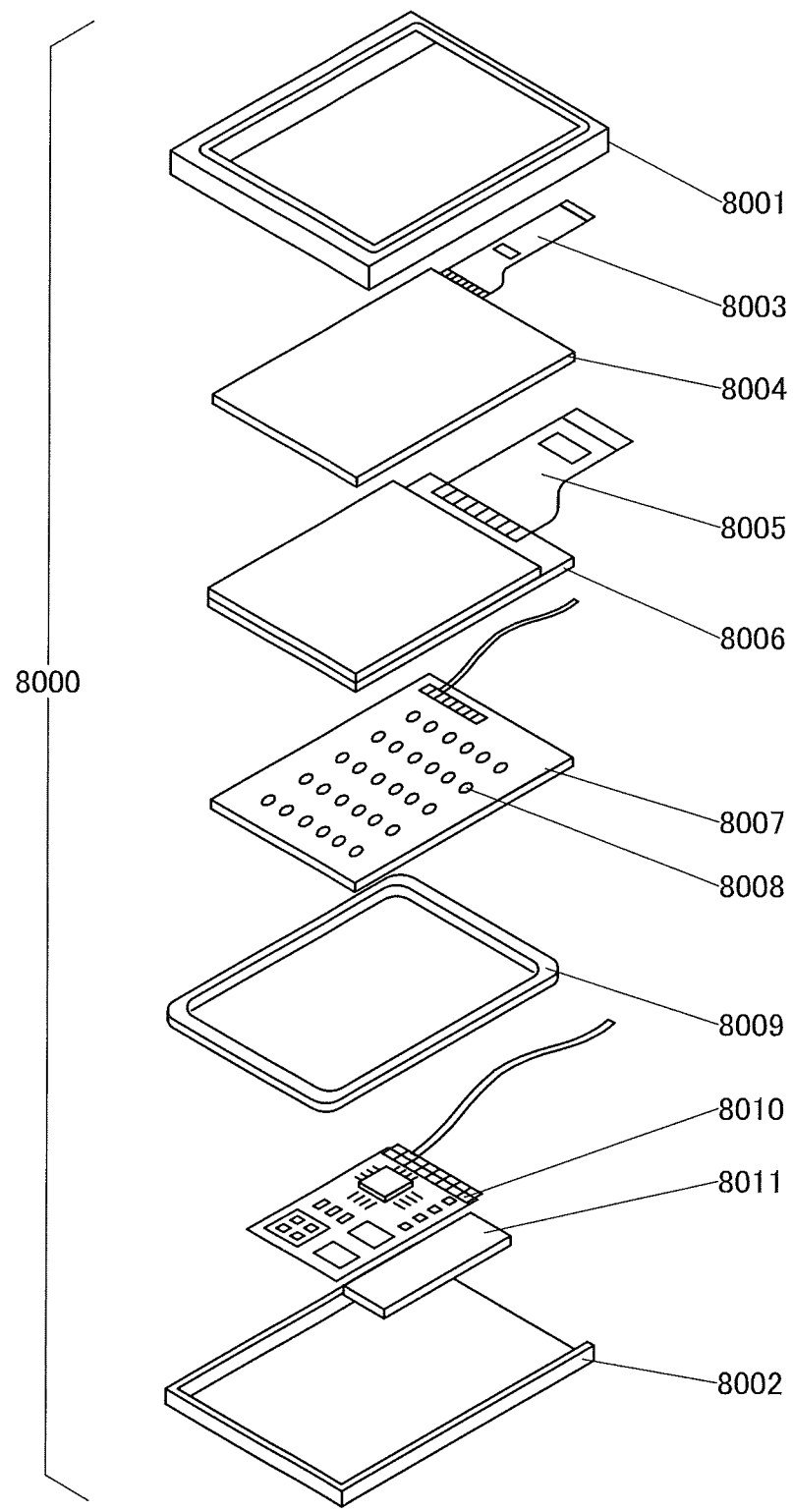
FIG. 58 illustrates a display module.

In a display module 8000 illustrated in FIG. 58, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and overlap with the display panel 8006. Alternatively, a counter substrate (sealing substrate) of the display panel 8006 can have a touch panel function. Alternatively, a photosensor may be provided in each pixel of the display panel 8006 to form an optical touch panel.

The backlight 8007 includes a light source 8008. One embodiment of the present invention is not limited to the structure in FIG. 58, in which the light source 8008 is provided over the backlight 8007. For example, a structure in which the light source 8008 is provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and functions as an electromagnetic shield for blocking electromagnetic waves generated by the operation of the printed board 8010. The frame 8009 may also function as a radiator plate.

The printed board 8010 includes a power supply circuit and a signal processing circuit for outputting a video signal and a clock signal. As a power source for supplying power to the power supply circuit, an external commercial power source or the separate battery 8011 may be used. The battery 8011 can be omitted in the case where a commercial power source is used.

The display module 8000 may be additionally provided with a member such as a polarizing plate, a retardation plate, or a prism sheet.

<10-2. Electronic Device>

FIGS. 59A to 59G illustrate electronic devices. These electronic devices can include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIGS. 59A to 59G can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Note that functions of the electronic devices in FIGS. 59A to 59G are not limited thereto, and the electronic devices can have a variety of functions. Although not illustrated in FIGS. 59A to 59G, the electronic devices may each have a plurality of display portions. Furthermore, the electronic devices may each be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 59A to 59G will be described in detail below.

Figure 59A:
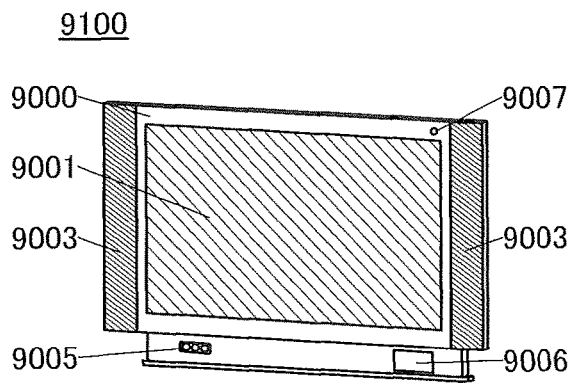
FIGS. 59A to 59G illustrate electronic devices.

FIG. 59A is a perspective view illustrating a television device 9100. The television device 9100 can include the display portion 9001 having a large screen size of, for example, 50 inches or more, or 100 inches or more.

Figure 59D:
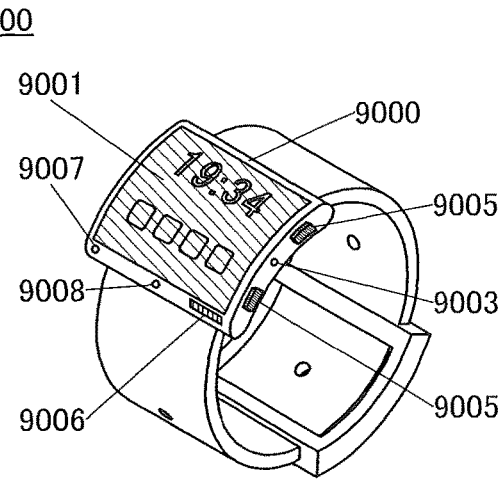
Figure 59B:
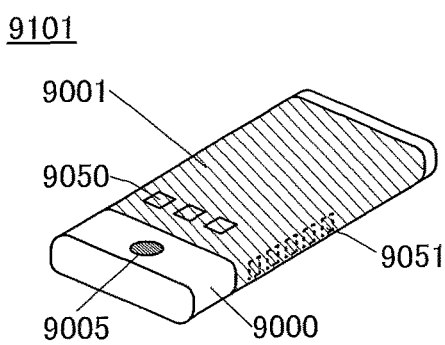

FIG. 59B is a perspective view of a portable information terminal 9101. The portable information terminal 9101 functions as, for example, one or more of a telephone set, a notebook, an information browsing system, and the like. Specifically, the portable information terminal 9101 can be used as a smartphone. Note that the portable information terminal 9101 may include a speaker, a connection terminal, a sensor, or the like. The portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Examples of the information 9051 include display indicating reception of an e-mail, a social networking service (SNS) message, or a telephone call, the title and sender of an e-mail or an SNS message, date, time, remaining battery, and reception strength of an antenna. Alternatively, the operation buttons 9050 or the like may be displayed in place of the information 9051.

Figure 59C:
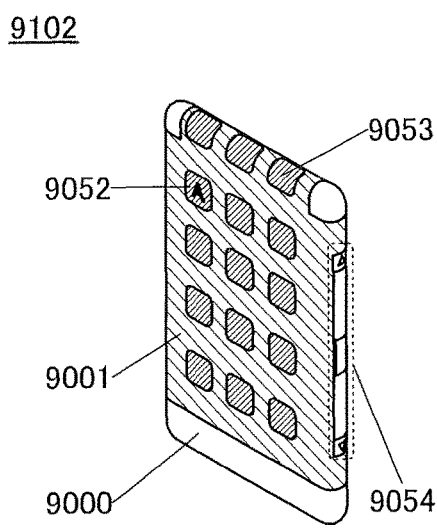

FIG. 59C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) on the portable information terminal 9102 put in a breast pocket of his/her clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 59D is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is curved, and display can be performed on the curved display surface. The portable information terminal 9200 can employ near field communication conformable to a communication standard. For example, hands-free calling can be achieved by mutual communication between the portable information terminal 9200 and a headset capable of wireless communication. Moreover, the portable information terminal 9200 includes the connection terminal 9006 and can perform direct data communication with another information terminal via a connector. Charging through the connection terminal 9006 is also possible. Note that the charging operation may be performed by wireless power feeding without using the connection terminal 9006.

Figure 59E:
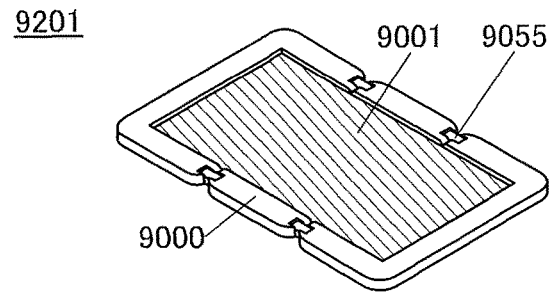
Figure 59F:
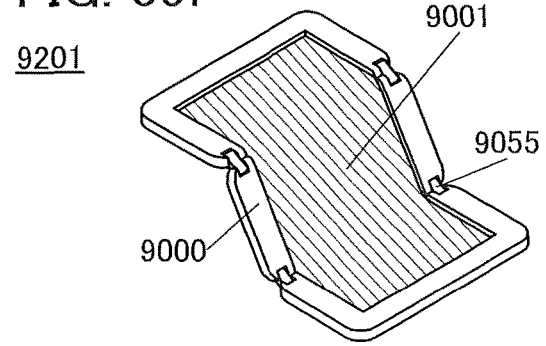
Figure 59G:
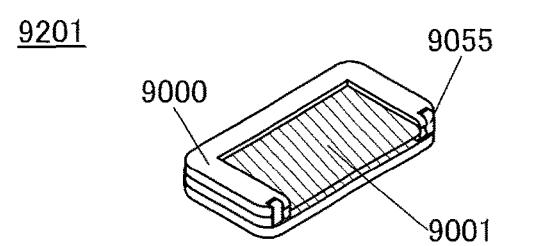

FIGS. 59E, 59F, and 59G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region is highly browsable. The display portion 9001 of the portable information terminal 9201 is supported by three housings 9000 joined by hinges 9055. By being folded at the hinges 9055 between the two adjacent housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

Figure 60A:
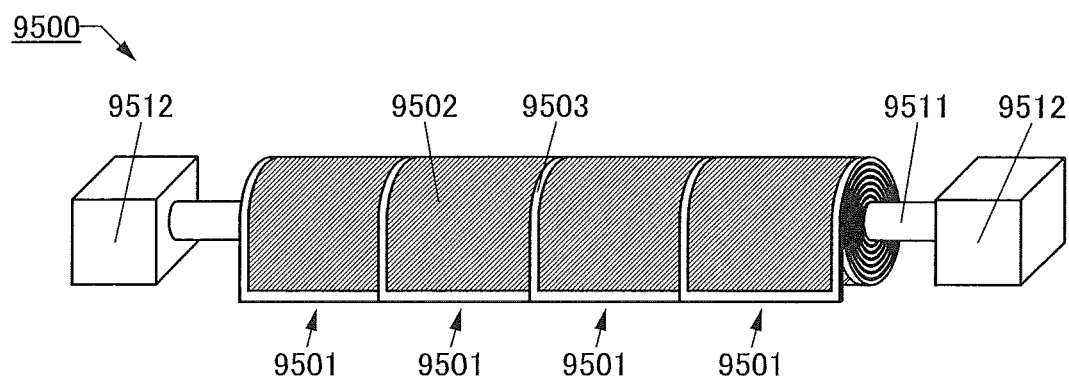
FIGS. 60A and 60B are perspective views illustrating a display device.
Figure 60B:
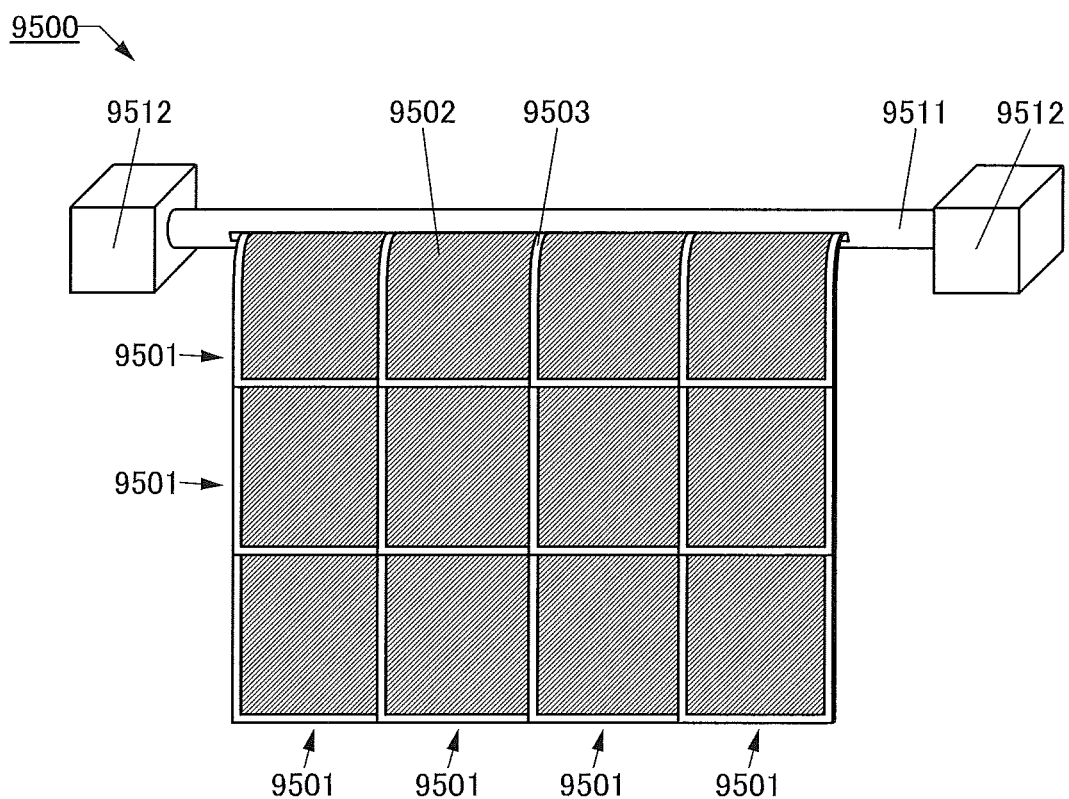

FIGS. 60A and 60B are perspective views of a display device including a plurality of display panels. Note that the plurality of display panels are wound in the perspective view in FIG. 60A and are unwound in the perspective view in FIG. 60B.

A display device 9500 illustrated in FIGS. 60A and 60B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can overlap with each other. A display device having a large screen can be obtained with the plurality of display panels 9501. The display device is highly versatile because the display panels 9501 can be wound depending on its use.

Although the display regions 9502 of the adjacent display panels 9501 are separated from each other in FIGS. 60A and 60B, without limitation to this structure, the display regions 9502 of the adjacent display panels 9501 may overlap with each other without any space so that a continuous display region 9502 is obtained, for example.

Electronic devices described in this embodiment are characterized by having a display portion for displaying some sort of information. Note that the semiconductor device of one embodiment of the present invention can also be used for an electronic device that does not have a display portion.

The structures described in this embodiment can be combined as appropriate with any of the structures described in the other embodiments.

This application is based on Japanese Patent Application serial no. 2015-146351 filed with Japan Patent Office on Jul. 24, 2015, the entire contents of which are hereby incorporated by reference.

What is claimed is:

1. A semiconductor device comprising:
   a conductive film;
   a first insulating film over the conductive film;
   a semiconductor film over the first insulating film;
   a second insulating film over the semiconductor film;
   a metal oxide film over the second insulating film;
   a gate electrode over the metal oxide film; and
   a third insulating film over the semiconductor film and the gate electrode,
   wherein the semiconductor film comprises a metal oxide,
   wherein the metal oxide film is a semiconductor or a conductor containing one or more of In, Zn, Al, Ga, Y, and Sn,
   wherein the semiconductor film comprises a channel region overlapping with the gate electrode, a source region in contact with the third insulating film, and a drain region in contact with the third insulating film,
   wherein the third insulating film is in contact with a top surface of the second insulating film,
   wherein the third insulating film is a nitride film containing at least one of hydrogen and fluorine,
   wherein the source region and the drain region contain one or more of hydrogen, boron, carbon, nitrogen, fluorine, phosphorus, sulfur, chlorine, titanium, and a rare gas, and
   wherein the gate electrode is in contact with the conductive film through an opening in the first insulating film, the second insulating film and the metal oxide film.

2. The semiconductor device according to claim 1, further comprising:
   a fourth insulating film over the third insulating film;
   a source electrode connected to the source region through an opening in the third insulating film and the fourth insulating film; and
   a drain electrode connected to the drain region through an opening in the third insulating film and the fourth insulating film.

3. The semiconductor device according to claim 1, wherein the rare gas comprises one or more of helium, neon, argon, krypton, and xenon.

4. The semiconductor device according to claim 1,
   wherein the semiconductor film contains In, Zn, and M, and
   wherein M is Al, Ga, Y, or Sn.

5. The semiconductor device according to claim 1,
   wherein the semiconductor film comprises a crystal part, and
   wherein the crystal part has c-axis alignment.

6. The semiconductor device according to claim 1,
   wherein the second insulating film comprises silicon oxynitride and is configured to release more ammonia than nitrogen oxide in a range from 50° C. to 650° C. in thermal desorption spectroscopy.

7. The semiconductor device according to claim 1,
   wherein the gate electrode comprises a metal film.

8. The semiconductor device according to claim 1,
   wherein an upper end portion of the second insulating film is positioned outside a lower end portion of the metal oxide film,
   wherein an upper end portion of the metal oxide film is positioned outside a lower end portion of the gate electrode, and
   wherein the third insulating film is in contact with a top surface of the metal oxide film.

9. A semiconductor device comprising:
   a conductive film;
   a first insulating film over the conductive film;
   a semiconductor film over the first insulating film;
   a second insulating film over the semiconductor film;
   a metal oxide film over the second insulating film;
   a gate electrode over the metal oxide film; and
   a third insulating film over the semiconductor film and the gate electrode,
   wherein the semiconductor film comprises a metal oxide,
   wherein the metal oxide film is a semiconductor or a conductor containing one or more of In, Zn, Al, Ga, Y, and Sn,
   wherein the semiconductor film comprises a channel region overlapping with the gate electrode, a source region in contact with the third insulating film, and a drain region in contact with the third insulating film,
   wherein the third insulating film is in contact with a top surface of the second insulating film, and
   wherein the gate electrode is in contact with the conductive film through an opening in the first insulating film, the second insulating film and the metal oxide film.

10. The semiconductor device according to claim 9, further comprising:
    a fourth insulating film over the third insulating film;
    a source electrode connected to the source region through an opening in the third insulating film and the fourth insulating film; and
    a drain electrode connected to the drain region through an opening in the third insulating film and the fourth insulating film.

11. The semiconductor device according to claim 9,
    wherein the semiconductor film contains In, Zn, and M, and
    wherein M is Al, Ga, Y, or Sn.

12. The semiconductor device according to claim 9,
    wherein the semiconductor film comprises a crystal part, and
    wherein the crystal part has c-axis alignment.

13. The semiconductor device according to claim 9,
    wherein the gate electrode comprises a metal film.

14. The semiconductor device according to claim 9,
    wherein an upper end portion of the second insulating film is positioned outside a lower end portion of the metal oxide film,
    wherein an upper end portion of the metal oxide film is positioned outside a lower end portion of the gate electrode, and
    wherein the third insulating film is in contact with a top surface of the metal oxide film.

* * * * *